(12) United States Patent
Lee et al.

(10) Patent No.: US 12,373,041 B2
(45) Date of Patent: Jul. 29, 2025

(54) DISPLAY DEVICE AND PEN TOUCH SYSTEM

(71) Applicant: LG Display Co., Ltd., Seoul (KR)

(72) Inventors: Kyuhwan Lee, Paju-si (KR); Jiseok Yang, Paju-si (KR); DongRyul Jung, Paju-si (KR); Jae Ho Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/780,137

(22) Filed: Jul. 22, 2024

(65) Prior Publication Data

US 2025/0044881 A1     Feb. 6, 2025

(30) Foreign Application Priority Data

Jul. 31, 2023   (KR) .................. 10-2023-0099431

(51) Int. Cl.
*G06F 3/033*   (2013.01)
*G06F 3/03*    (2006.01)
*G06F 3/0354*  (2013.01)
*H10K 59/38*   (2023.01)
*H10K 59/80*   (2023.01)
*G09G 3/3233*  (2016.01)

(52) U.S. Cl.
CPC ........ *G06F 3/03542* (2013.01); *G06F 3/0317* (2013.01); *H10K 59/38* (2023.02); *H10K 59/873* (2023.02); *H10K 59/8791* (2023.02); *G09G 3/3233* (2013.01); *G09G 2300/0842* (2013.01); *G09G 2352/00* (2013.01)

(58) Field of Classification Search
CPC .... H10K 59/353; H10K 59/123; H10K 59/65; H10K 59/80518; H10K 2102/351; G09G 3/3233; G09G 2300/0819; G09G 2300/0842; G09G 2320/0233; G09G 2320/0257; G09G 2320/045; G09G 3/3677; G09G 2310/08; G09G 3/20; G09G 3/3648; G09G 2300/0408; G09G 2300/0426; G09G 3/006; G02F 1/136286; G02F 1/1368

See application file for complete search history.

(56) References Cited

U.S. PATENT DOCUMENTS

| 6,577,374 | B1 * | 6/2003 | Nakata | G02F 1/136227 |
| | | | | 349/44 |
| 2005/0140892 | A1 * | 6/2005 | Kim | G02F 1/13394 |
| | | | | 349/139 |
| 2014/0145066 | A1 * | 5/2014 | Geaghan | G06F 3/0317 |
| | | | | 250/206.1 |
| 2023/0229274 | A1 * | 7/2023 | Yoo | G02F 1/13338 |
| | | | | 345/173 |

\* cited by examiner

*Primary Examiner* — Pegeman Karimi
(74) *Attorney, Agent, or Firm* — Fenwick & West LLP

(57) ABSTRACT

A display device includes a first substrate including a plurality of transmissive areas allowing light having a first wavelength to be transmitted and a plurality of non-transmissive areas different from the plurality of transmissive areas, a plurality of light emitting elements disposed in the plurality of non-transmissive areas, an encapsulation layer on the plurality of light emitting elements, a code pattern layer in which at least one photoactive pattern including a photoactive material responsive to light having a second wavelength different from the first wavelength is disposed, and a cover window on the encapsulation layer, the at least one photoactive pattern being disposed in at least one of the plurality of transmissive areas.

20 Claims, 39 Drawing Sheets

DISPLAY DEVICE AND PEN TOUCH SYSTEM

CROSS-REFERENCE TO RELATED APPLICATION

This application claims the priority benefit of Republic of Korea Patent Application No. 10-2023-0099431, filed on Jul. 31, 2023 in the Korean Intellectual Property Office, which is hereby incorporated by reference in its entirety.

TECHNICAL FIELD

The present disclosure generally relates to electronic devices with displays, and more specifically, to a display device and a pen touch system.

BACKGROUND

As the information-oriented society has been developed, various needs for display devices for displaying an image have increased. Various types of display devices, such as liquid crystal display (LCD) devices, organic light emitting diode (OLED) display devices, and the like have been developed and widely used. Display devices may be stand-alone devices or integrate with other devices. Display devices have been applied to various electronic devices such as smart phones, digital cameras, laptop computers, navigation devices, smart televisions and the like.

In addition, in order to provide a more intuitive use environment, display devices have been increasingly provided with a user interface configured to allow a touch input by an object such as a user's body (e.g., a finger), a pen, and the like. Recently, to allow versatility of operation for various applications and more detailed input, development has been progressing on enhanced pen-touch capable display devices.

SUMMARY

One or more embodiments of the present disclosure may provide a display device and a pen touch system that are capable of more accurately sensing a pen touch based on an optical technique.

One or more embodiments of the present disclosure may provide a transparent display device and a pen touch system that are capable of sensing a pen touch based on an optical technique.

One or more embodiments of the present disclosure may provide a transparent display device and a pen touch system that are capable of providing optical pen touch sensing without affecting a pixel structure for image display.

One or more embodiments of the present disclosure may provide a transparent display device and a pen touch system that are capable of sensing a pen touch based on an optical technique without deteriorating transparency.

One or more embodiments of the present disclosure may provide a display device and a pen touch system that include a display panel in which a light control structure capable of allowing a pen to sense a touch is integrated.

One or more embodiments of the present disclosure may provide a display device and a pen touch system that include a display panel in which a light control structure configured not to affect light emitting performance for image display is integrated.

One or more embodiments of the present disclosure may provide a display device and a pen touch system that include a display panel in which as a light control structure configured to enable pen touch sensing, a reflection structure and an absorption structure (or a radiation structure) are integrated.

One or more embodiments of the present disclosure may provide a display device and a pen touch system that are capable of allowing a pen touch input from any one of the front and back surfaces of the display device.

One or more embodiments of the present disclosure may provide a display device and a pen touch system that are capable of allowing a pen touch input from both the front and back surfaces of the display device.

According to example embodiments of the present disclosure, a display device can be provided that includes a display panel configured to display an image. The display panel may include a first substrate including a plurality of transmissive areas allowing light having a first wavelength to be transmitted and a plurality of non-transmissive areas different from the plurality of transmissive areas, a plurality of pixels disposed in the plurality of non-transmissive areas, a code pattern layer in which at least one photoactive pattern including a photoactive material responsive to light having a second wavelength different from the first wavelength is disposed, and a cover window located on the plurality of pixels and the code pattern layer.

The at least one photoactive pattern may be disposed in at least one of the plurality of transmissive areas.

The photoactive material may include one or more of an absorption material capable of absorbing the light having the second wavelength, a reflection material capable of reflecting the light having the second wavelength, and a radiation material capable of converting the light having the second wavelength into light having one or more other wavelengths different from the second wavelength and radiating the light having the one or more other wavelengths.

According to example embodiments of the present disclosure, a pen touch system can be provided that includes a display device, and a pen. The display device may include a first substrate including a plurality of transmissive areas allowing light having a first wavelength to be transmitted and a plurality of non-transmissive areas different from the plurality of transmissive areas, a plurality of pixels disposed in the plurality of non-transmissive areas, a code pattern layer in which at least one photoactive pattern including a photoactive material responsive to light having a second wavelength different from the first wavelength is disposed, the at least one photoactive pattern being disposed in at least one of the plurality of transmissive areas, and a cover window located on the plurality of pixels and code pattern layer. The pen may be configured to output the light having the second wavelength to at least one of the plurality of transmissive areas, receive redirected light coming from the display device, and output sensing data based on the redirected light to the display device.

The display device further may include an encapsulation layer. The code pattern layer may be located between the first substrate and the encapsulation layer.

A plurality of light emitting elements can emit light toward any one of the first substrate and the cover window, and the display device can allow an input by the pen through both the front surface and back surface of the display device based on sensing data received from the pen.

A plurality of light emitting elements can emit light toward any one of the first substrate and the cover window, and the display device can allow an input by the pen through any one of the front surface and back surface of the display device based on sensing data received from the pen.

According to one or more embodiments of the present disclosure, a display device and a pen touch system may be provided that are capable of more accurately sensing a pen touch based on an optical technique.

According to one or more embodiments of the present disclosure, a transparent display device and a pen touch system may be provided that are capable of sensing a pen touch based on an optical technique.

According to one or more embodiments of the present disclosure, a transparent display device and a pen touch system may be provided that are capable of providing optical pen touch sensing without affecting a pixel structure for image display.

According to one or more embodiments of the present disclosure, a transparent display device and a pen touch system may be provided that are capable of sensing a pen touch based on an optical technique without deteriorating transparency.

According to one or more embodiments of the present disclosure, a display device and a pen touch system may be provided that include a display panel in which a light control structure capable of allowing a pen to sense a touch is integrated.

According to one or more embodiments of the present disclosure, a display device and a pen touch system may be provided that include a display panel in which a light control structure configured not to affect light emitting performance for image display is integrated.

According to one or more embodiments of the present disclosure, a display device and a pen touch system may be provided that include a display panel in which as a light control structure configured to enable pen touch sensing, a reflection structure and an absorption structure (or a radiation structure) are integrated.

According to one or more embodiments of the present disclosure, a display device and a pen touch system may be provided that are capable of allowing a pen touch input from any one of the front surface and back surface of the display device.

According to one or more embodiments of the present disclosure, a display device and a pen touch system may be provided that are capable of allowing a pen touch input from both the front surface and back surface of the display device.

According to one or more embodiments of the present disclosure, a display device and a pen touch system may be provided that include a display panel in which a light control structure configured to allow a pen to sense a touch is integrated, and thereby, provide advantages of reducing the thickness of the display device and helping to simplify the assembly process of the display device. Thus, one or embodiments aspects of the present disclosure can help to reduce the weight and optimize the process of the display device.

According to one or more embodiments of the present disclosure, a display device and a pen touch system may be provided that include a display panel including a pixel array layer and having a reflection structure for pen touch sensing using the pixel array layer, and thereby, provide advantages of further helping to reduce the weight of the display device.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
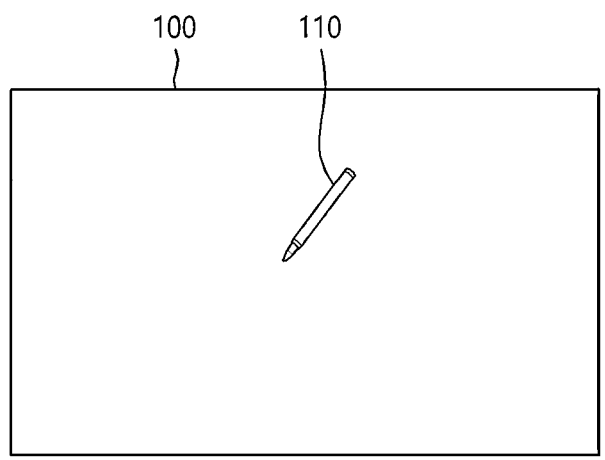
FIG. 1 illustrates an example pen touch system according to embodiments of the present disclosure.

Reference will now be made in detail to example embodiments of the present disclosure, examples of which may be illustrated in the accompanying drawings. In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings.

The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," "A", "B", "(a)", or "(b)", and the like may be used herein to describe various elements, these elements should not be interpreted to be limited by these terms as they are not used to define a particular order or precedence. These terms are used only to distinguish one element from another; thus, related elements should not be interpreted to be limited by these terms as they are not used to define a particular order or precedence.

Further, the expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. Further, the another element may be included in one or more of the two or more elements connected, combined, coupled, or contacted (to) one another.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom," "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example pen touch system 10 according to aspects of the present disclosure.

Referring to FIG. 1, in one or more example embodiments, the pen touch system 10 can recognize whether a touch is applied by a touch object and/or a location of the touch (or touch coordinates). Thereafter, the pen touch system 10 can obtain touch event information in accordance with the applied touch and/or the touch location, and thereafter, display an image (e.g., a still image or video image) corresponding to the obtained touch event information or the touch location on a screen, or perform an action corresponding to the obtained touch event information or touch location.

Referring to FIG. 1, in one or more example embodiments, the pen touch system 10 may include a display device 100 and a pen 110.

For example, a touch object detectable by the pen touch system 10 may basically include the pen 110 and may further include a finger, and the like. The touch event information may be information indicating that a touch has occurred, or may be information on a touch type such as a tap type (which may be also referred to as a click type), a double click type, a drag and drop type, a touch hold type, and the like.

Referring to FIG. 1, in one or more embodiments, the pen touch system 10 can recognize (or detect or sense) a touch by the pen 110 based on an optical technique. In one or more aspects, the pen touch system 10 may use light having one or more wavelengths included in a specific wavelength band to perform pen touch sensing based on such an optical technique (hereinafter, which may be referred to as an optical pen touch sensing).

One or more wavelengths of light emitted from light emitting elements for image display may be included in a first wavelength band (e.g., a visible light wavelength band). One or more wavelengths of light used for optical pen touch sensing may be included in a second wavelength band, which is a specific wavelength band. Herein, one or more wavelengths of light emitted from light emitting elements for image display are referred to as a first wavelength, which is included in the first wavelength band. Further, one or more wavelengths of light used for pen touch sensing are referred to as a second wavelength, which is included in the second wavelength band.

The specific wavelength band used for optical pen touch sensing may be different from the first wavelength band (e.g., the visible light wavelength band) that includes one or more wavelengths of light emitted from light emitting elements for image display. Accordingly, the second wavelength included in the second wavelength band, which is the specific wavelength band used for optical pen touch sensing, may be different from the first wavelength included in the first wavelength band (e.g., the visible light wavelength band).

For example, the second wavelength band may be an infrared wavelength band. Light having the second wavelength may be infrared light having one or more wavelengths (the second wavelength) included in the infrared wavelength band (e.g., a wavelength range of approximately 780 nm to 1000 μm). In another example, the second wavelength band may be an ultraviolet wavelength band. Light having the second wavelength may be ultraviolet light having one or more wavelengths (the second wavelength) included in the ultraviolet wavelength band (e.g., a wavelength range of approximately 10 nm to 397 μm). One or more example embodiments of the present disclosure are not limited thereto. For example, the light having the second wavelength may be electromagnetic wave having various wavelengths. Hereinafter, for convenience of explanation, discussions are provided based on examples where the first wavelength band is the visible light wavelength band, the second wavelength band is the infrared wavelength band, the first wavelength is one or more visible light wavelengths, and the second wavelength is one or more infrared wavelengths. Accordingly, it is assumed that light having the first wavelength is visible light (including red light, green light, blue light, and the like), and light having the second wavelength is infrared light.

For example, the infrared wavelength band (e.g., approximately 780 nm to 1000 μm) may be classified into a near-infrared wavelength band (e.g., 750 nm to 3 μm), a mid-infrared wavelength band (e.g., 3 m to 25 μm), and a far-infrared wavelength band (e.g., 25 m to 1000 μm). In this example, the second wavelength may be included in the near-infrared wavelength band, or may also be included in the mid-infrared wavelength band or the far-infrared wavelength band. For example, the second wavelength band used for optical pen touch sensing may be the infrared wavelength band (e.g., 780 nm to 1000 μm), or may include one or more of the near-infrared wavelength band (e.g., 750 nm to 3 μm), the mid-infrared wavelength band (e.g., 3 m to 25 μm), and the far-infrared wavelength band (e.g., 25 m to 1000 μm).

In one or more embodiments, the pen 110 of the pen touch system 10 can perform a light output function, a light reception function, a touch sensing function, a communication function, and the like.

The pen 110 can output light having the second wavelength as the light output function.

Depending on an inside structure of the display device 100, a part of light having the second wavelength output from the pen 110 may be absorbed at an inside of the display device 100, and another part of the light having the second wavelength output from the pen 110 may be reflected or converted into light having one or more other wavelengths at an inside of the display device 100, and redirected or radiated to move outside of the display device 100.

As the light reception function, the pen 110 can receive light (hereinafter, which may be referred to as redirected light) that, after having been reflected or converted to light having one or more other wavelengths different from the second wavelength at an inside of the display device 100, is redirected to move outside of the display device 100 in the form of light having the second wavelength or the light having the one or more other wavelengths. Further, as the touch sensing function, the pen 110 can sense whether a touch (e.g., a touch input) has been applied and/or a location of the touch (touch coordinates) based on information on a distribution, a shade difference, and/or a wavelength difference of the redirected light detected based on the received redirected light. Herein, after light having the second wavelength is output by the pen 110 to the display device 100, in a situation where the light having the second wavelength is reflected or converted into light having one or more other wavelengths at an inside of the display device 100, and the light having the second wavelength or the light having the one or more other wavelengths is redirected to move outside of the display device 100, the light having the second wavelength or the light having the one or more other wavelengths redirected to move outside of the display device 100 is referred to as redirected light. Herein, the redirected light may be, for example, reflected light, which means, among light having the second wavelength emitted from the pen 110, some light that is reflected at an inside of the display device 100 after being incident to the display device 100, and redirected to move outside of the display device 100. Further, the redirected light may be, for example, radiated light, which means, among light having the second wavelength emitted from the pen 110, some light that is converted into light having one or more other wavelengths at an inside of the display device 100 after being incident to the display device 100, and radiated to move, in the form of the light having the one or more other wavelengths, outside of the display device 100.

The pen 110 can, as the communication function, communicate with the display device 100 by a predetermined communication method, and transmit sensing data including whether a touch or touch input has been applied and/or a location of the touch to the display device 100. For example, the sensing data may include touch event information and/or touch coordinate data. For example, the touch event information may be information indicating that a touch has occurred, or may be information on a touch type such as a tap type (click type), a double click type, a drag and drop type, a touch hold type, and the like. The touch coordinate data may be information on coordinates of a touch location.

As described above, depending on an inside structure of the display device 100, a part of light having the second wavelength output from the pen 110 may be, at an inside of the display device 100, absorbed or converted into light having one or more other wavelengths and radiated to move outside of display device 100 in the form of the light having the one or more other wavelengths, and another part of the light having the second wavelength output from the pen 110 may be reflected at an inside of the display device 100 and redirected to move outside of display device 100 again.

Hereinafter, in one or more example embodiments, the display device 100 and the pen 110 included in the pen touch system 10 are described in more detail with reference to FIGS. 2, 3A, and 3B.

Figure 2:
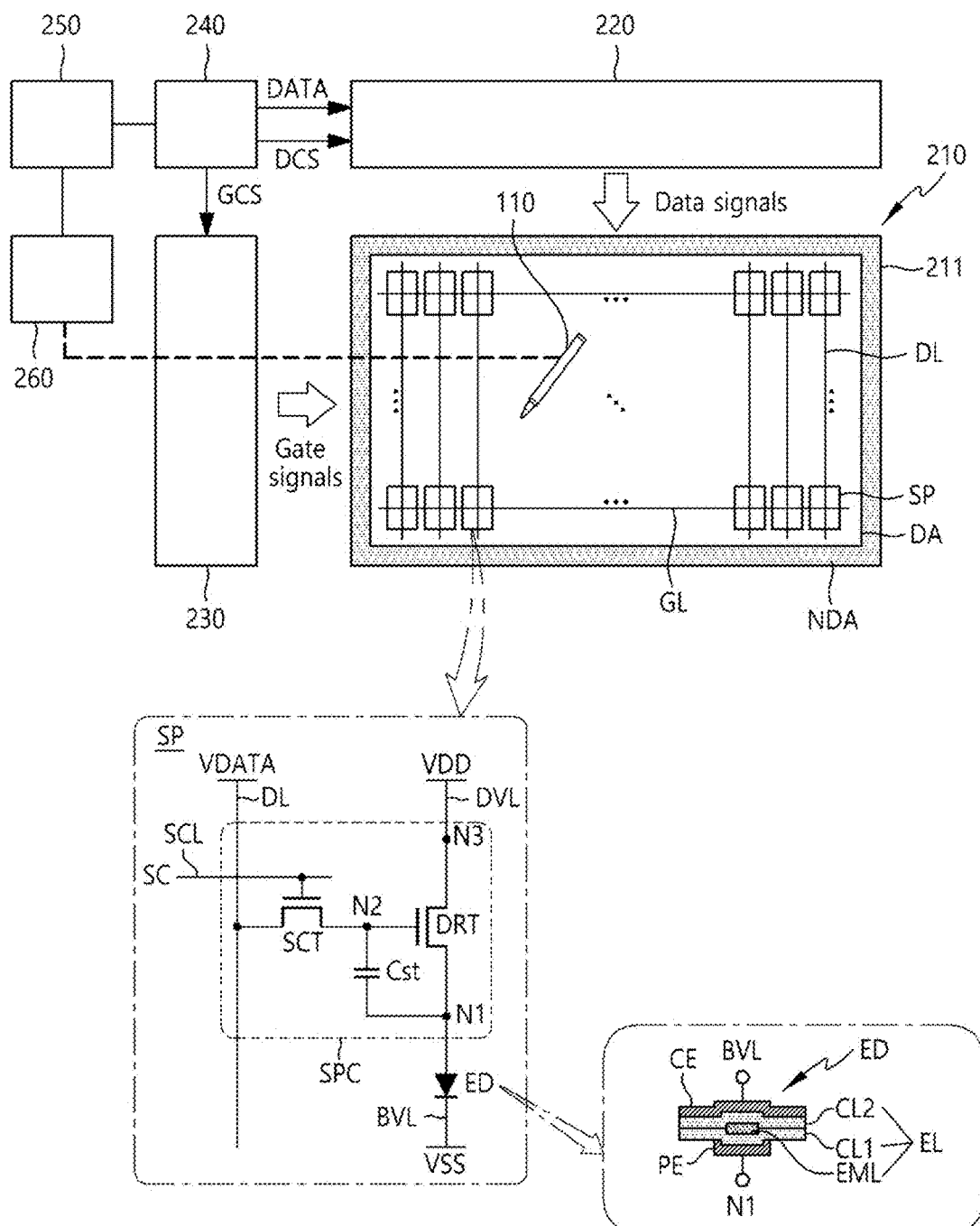
FIG. 2 illustrates an example display device according to embodiments of the present disclosure.

FIG. 2 illustrates an example display device 100 according to embodiments of the present disclosure. FIGS. 3A and 3B illustrate an example pen 110 according to aspects of the present disclosure.

Referring to FIG. 2, in one or more example embodiments, the display device 100 may include a display panel 210 and a display driving circuit as components for displaying an image. The display driving circuit may be a circuit for driving the display panel 210, and include a data driving circuit 220, a gate driving circuit 230, and a controller 240. In one or more aspects, the display driving circuit may further include a host system 250.

The display panel 210 may include a first substrate 211, a plurality of subpixels SP disposed on the first substrate 211, and various types of signal lines disposed on the first substrate 211 and configured to drive the plurality of subpixels SP.

The first substrate 211 may include a display area DA where a plurality of subpixels SP are disposed and a non-display area NDA located outside of the display area DA.

The non-display area NDA may include a pad area to which the data driving circuit 220 is connected. For example, the pad area may be located in a first direction in the display area DA. The first direction may be, for example, a column direction or a row direction.

The non-display area NDA may have a minimal size allowing only the pad area, and the like to be included. In one or more aspects, the non-display area NDA of the display panel 210 may have a very small area. For example, even when the display panel 210 has the non-display area NDA, a boundary area between the display area DA and the non-display area NDA may be bent, and thereby the non-display area NDA may be located under the display area DA. In this example, when a user views the display device 100 in front thereof, all or most of the non-display area NDA may not be visible to the user.

In one or more embodiments, the display device 100 may be a liquid crystal display device, or the like, or a self-emission display device in which light is emitted from the display panel 210 itself. In an example where the display device 100 is a self-emission display device, each of the plurality of subpixels SP may include a light emitting element ED.

For example, the display device 100 according to aspects of the present disclosure may be an organic light emitting display device in which the light emitting element ED is implemented using an organic light emitting diode (OLED). In another example, the display device 100 according to aspects of the present disclosure may be an inorganic light emitting display device in which the light emitting element ED is implemented using an inorganic material-based light emitting diode. In further another example, the display device 100 according to aspects of the present disclosure may be a quantum dot display device implemented with quantum dots, which are self-emission semiconductor crystals, as light emitting elements ED.

The structure of each of the plurality of subpixels SP may depend on types of display device 100. For example, when the display device 100 is a self-emission display device including self-emission subpixels SP, each subpixel SP may include a self-emission light emitting element ED and a subpixel circuit SPC configured to drive the light emitting element ED.

The various types of signal lines may include, for example, a plurality of data lines DL for carrying data signals (which may be referred to as data voltages or image signals), a plurality of gate lines GL for carrying gate signals (which may be referred to as scan signals), and the like. The various types of signal lines may further include at least one signal line for delivering a display driving voltage (e.g., a common voltage) different from the data signals and the gate signals.

In one or more aspects, the plurality of data lines DL and the plurality of gate lines GL may intersect one another. Each of the plurality of data lines DL may be configured to extend in a first direction, and each of the plurality of gate lines GL may be configured to extend in a second direction. For example, the first direction may be the column or vertical direction, and the second direction may be the row or horizontal direction. In another example, the first direction may be the row or horizontal direction, and the second direction may be the column or vertical direction. Hereinafter, discussions are provided based on examples where the first direction is the column direction and the second direction is the row direction.

The data driving circuit 220 may be a circuit for driving a plurality of data lines DL and can output data signals to the plurality of data lines DL.

The data driving circuit 220 can receive image data DATA in digital form from the controller 240, convert the received image data DATA into data signals in analog form, and output the resulting data signals to the plurality of data lines DL.

In one or more aspects, the data driving circuit 220 may be connected to the display panel 210 by a tape-automated-bonding (TAB) technique, or connected to a conductive pad such as a bonding pad of the display panel 210 by a chip-on-glass (COG) technique or a chip-on-panel (COP) technique, or connected to the display panel 210 by a chip-on-film (COF) technique.

The data driving circuit 220 may be disposed outside of the display area DA of the display panel 210, or be disposed in the display area DA of the display panel 210.

The gate driving circuit 230 may be a circuit for driving a plurality of gate lines GL and can output gate signals to the plurality of gate lines GL.

The gate driving circuit 230 can receive various types of gate driving control signals GCS, and further, receive a first gate voltage corresponding to a turn-on level voltage and a second gate voltage corresponding to a turn-off level voltage. Thereby, the gate driving circuit 130 can generate gate signals and supply the generated gate signals to the plurality of gate lines GL.

In one or more embodiments, the gate driving circuit 230 included in the display device 100 may be disposed in the non-display area NDA. In one or more aspects, the gate driving circuit 230 may be configured to overlap with the display area DA of the display panel 210. For example, the gate driving circuit 230 may be disposed throughout the entire display area DA, or may be disposed only in a portion (e.g., one or more of both side edges) of the display area DA. In an example where the gate driving circuit 230 is configured to overlap with the display area DA, the gate driving circuit 230 may be configured not to overlap with subpixels SP, or be configured to overlap with one or more, or all, of the subpixels SP.

In one or more embodiments, the gate driving circuit 230 included in the display device 100 may be embedded into the display panel 210 by a gate-in-panel (GIP) technique. In an example where the gate driving circuit 230 is implemented by the gate-in-panel (GIP) technique, the gate driving circuit 230 may be disposed on the first substrate 211 of the display panel 210 during the manufacturing process of the display panel 210 or display device 100.

The controller 240 may be a device configured to receive image data and various display driving control signals from the host system 250, supply image data DATA corresponding to the received image signal to the data driving circuit 220, and control the data driving circuit 220 and the gate driving circuit 230.

The controller 240 can generate at least one data drive control signal DCS for controlling data driving and at least one gate drive control signal GCS for controlling gate driving by using display control signals (e.g., a vertical synchronous signal, a horizontal synchronous signal, a data enable signal, a clock signal, and the like) received from the host system 250.

The controller 240 can control the operation and driving timing of the data driving circuit 220 by supplying the at least one data driving control signal DCS to the data driving circuit 220.

The controller 240 can control the operation and driving timing of the gate driving circuit 230 by supplying the at least one gate driving control signal GCS to the gate driving circuit 230.

The controller 240 can receive image data input from the host system 250 and supply image data DATA readable by the data driving circuit 220 based on the input image data to the data driving circuit 220.

The controller 240 may be implemented in a separate component from the data driving circuit 220, or integrated with the data driving circuit 220, so that the controller 140 and the data driving circuit 120 can be implemented in a single integrated circuit.

The controller 240 may be a timing controller used in the display technology or a control device capable of additionally performing other control functionalities in addition to the function of the timing controller. In one or more aspects, the controller 240 may be one or more other control circuits different from the timing controller, or a circuit or component in the control device. The controller 240 may be implemented using various circuits or electronic components such as an integrated circuit (IC), a field programmable gate array (FPGA), an application specific integrated circuit (ASIC), a processor, and/or the like.

The controller 240 may be mounted on a printed circuit board, a flexible printed circuit, or the like, and may be electrically connected to the data driving circuit 220 and the gate driving circuit 230 through the printed circuit board, the flexible printed circuit, and/or the like.

The controller 240 can transmit signals to, and receive signals from, the data driving circuit 220 via one or more predetermined interfaces. For example, such interfaces may include a low voltage differential signaling (LVDS) interface, an embedded clock point-point interface (EPI), a serial peripheral interface (SPI), and the like.

In one or more embodiments, to provide a touch sensing function, as well as an image display function, the display device 100 may include a touch sensor and a touch sensing circuit.

The touch sensing circuit can detect whether a touch (e.g., a finger touch, or a pen touch) has been applied by a touch object such as a finger, pen 110, or the like or detect a location of the touch by sensing the touch sensor. This touch sensing may be a touch sensing scheme different from optical pen touch sensing.

For example, the touch sensing circuit may include a touch driving circuit configured to drive and sense the touch sensor and generate and output touch sensing data, and a touch controller configured to detect the application of a touch or a touch location using the touch sensing data.

The touch sensor may include a plurality of sensor electrodes. The touch sensor may also be referred to as a touch panel or touch screen panel. The touch sensor may be an external type touch sensor configured to be located outside of the display panel 210 or an internal type touch sensor configured to be located inside of the display panel 210.

The display device 100 may further include a power supply circuit for supplying various types of power to the display driving circuit.

In some embodiments, the display device 100 may be a mobile terminal such as a smart phone, a tablet, or the like, or a monitor, a television (TV), or the like. Such devices may be configured in various types, sizes, and shapes. The display device 100 according to aspects of the present disclosure are not limited thereto, and may include various types, sizes, and shapes configured to display information or images.

Referring to FIG. 2, in an example where the display device 100 according to embodiments of the present disclosure is a self-emission display device, each of the plurality of subpixels SP may include a light emitting element ED and a subpixel circuit SPC for driving the light emitting element ED.

The subpixel circuit SPC may include a plurality of pixel driving transistors and at least one capacitor for driving the light emitting element ED.

The subpixel circuit SPC may be connected to a data line DL, a gate line GL, a first driving voltage line DVL, and a second driving voltage line BVL.

The plurality of pixel driving transistors may include a driving transistor DRT configured to actually drive the light emitting element ED by supplying a driving current to the light emitting element ED, and a scan transistor SCT configured to allow a data signal VDATA to be passed to a second node N2, which is the gate node of the driving transistor DRT.

The at least one capacitor may include a storage capacitor Cst configured to maintain a constant voltage during a display frame or a certain period of the display frame.

To drive one or more subpixels SP, at least one data signal VDATA, which is an image signal, and at least one scan signal SC, which is a gate signal, may be applied to one or more subpixels SP. Further, to drive one or more subpixels SP, common driving voltages including a first driving voltage VDD and a second driving voltage VSS may be applied to the subpixels SP.

The light emitting element ED may include a pixel electrode PE, an element intermediate layer EL, and a common electrode CE. The pixel electrode PE may be an electrode disposed in each subpixel SP, and the common electrode CE may be an electrode commonly disposed in all or some of a plurality of subpixels SP. The element intermediate layer EL may be a layer disposed between the pixel electrode PE and the common electrode CE, and may include an emission layer EML.

In an example where the light emitting element ED is an organic light emitting element such as an organic light emitting diode (OLED), the element intermediate layer EL may include the emission layer EML, a first common layer CL1 between the pixel electrode PE and the emission layer EML, and a second common layer CL2 between the emission layer EML and the common electrode CE. The emission layer EML may be disposed in each subpixel SP, and the first common layer CL1 and the second common layer CL2 may be commonly disposed in all or some of a plurality of subpixels SP. The emission layer EML may be disposed in each light emitting area. The first common layer CL1 and the second common layer CL2 may be disposed in corresponding light emitting areas of all or some of the plurality of subpixels SP, and further extend to a non-light emitting area. Each light emitting element ED may be configured by a portion where a corresponding pixel electrode PE, a corresponding emission layer EML, respective corresponding portions of the first common layer CL1 and the second common layer CL2, and a corresponding portion of the common electrode CE overlap with each other. A corresponding light emitting area may be formed by each light emitting element ED. That is, a corresponding light emitting area of each light emitting element ED may include an area where a corresponding pixel electrode PE, a corresponding element intermediate layer EL, and the common electrode CE overlap with each other.

For example, the pixel electrode PE may be an anode, and the common electrode CE may be a cathode. In another example, the pixel electrode PE may be a cathode, and the common electrode CE may be an anode.

For example, the common electrode CE may be electrically connected to the second driving voltage line BVL. The second driving voltage VSS, which is a type of common driving voltage, may be applied to the common electrode CE through the second driving voltage line BVL. The pixel electrode PE may be electrically connected to one node of a transistor (e.g., a first node N1 of the driving transistor DRT) included in a corresponding subpixel circuit SPC of each subpixel SP.

The driving transistor DRT may be a transistor configured to supply a driving current to the light emitting element ED. The driving transistor DRT may be connected between the first driving voltage line DVL and the light emitting element ED.

The driving transistor DRT may include a first node N1 electrically connected with the light emitting element ED, a second node N2 to which a data signal VDATA is applied, and a third node N3 to which a driving voltage VDD through the first driving voltage line DVL is applied.

In the driving transistor DRT, the second node N2 may be a gate node, the first node N1 may be a source node or a drain node, and the third node N3 may be the drain node or the source node. Hereinafter, for merely convenience of explanation, discussions may be provided based on examples where the first, second, and third nodes (N1, N2, and N3) of the driving transistor DRT are source, gate, and drain nodes, respectively. However, example embodiments of the present disclosure are not limited thereto.

The scan transistor ST may be a switching transistor for allowing a data signal VDATA, which is an image signal, to be passed to the second node N2, which is the gate node of the driving transistor DT.

The scan transistor SCT can be turned on or turned off by a scan signal SC, which is a type of gate signal, carried by a scan line SCL, which is a type of gate line GL, and control an electrical connection between the second node N2 of the driving transistor DRT and a data line DL. The drain electrode or source electrode of the scan transistor SCT may be electrically connected to the data line DL. The source electrode or drain electrode of the scan transistor SCT may be electrically connected to the second node N2 of the driving transistor DRT. The gate electrode of the scan transistor SCT may be electrically connected to the scan line SCL.

The storage capacitor Cst may be electrically connected between the first node N1 and the second node N2 of the driving transistor DRT. The storage capacitor Cst may include a first capacitor electrode electrically connected to the first node N1 of the driving transistor DRT or corresponding to the first node N1 of the driving transistor DRT, and a second capacitor electrode electrically connected to the second node N2 of the driving transistor DRT or corresponding to the second node N2 of the driving transistor DRT.

Each of the driving transistor DRT and the scan transistor SCT may be an n-type transistor or a p-type transistor.

For example, at least a portion of the subpixel circuit SPC may overlap with at least a portion of the light emitting element ED in the vertical direction. In another example, the subpixel circuit SPC may not overlap the light emitting element ED in the vertical direction.

As shown in FIG. 2, the subpixel circuit SPC may include two transistors (2T: T1 and T2) and one capacitor (1C: Cst) (which may be referred to as a "2T1C structure"), and in some implementations, may further include one or more transistors, or further include one or more capacitors.

The types and number of gate signals supplied to a subpixel SP, and/or the types and number of gate lines connected to the subpixel SP may vary depending on a structure of a corresponding subpixel circuit SPC. Further, the types and number of common driving voltages supplied to a subpixel SP may vary depending on a structure of a corresponding subpixel circuit SPC.

Since circuit elements (e.g., a light emitting element ED such as an organic light emitting diode (OLED) including an organic material) in each subpixel SP are vulnerable to external moisture or oxygen, an encapsulation layer may be disposed at the display panel 210 to prevent the external moisture or oxygen from penetrating into the circuit elements (e.g., the light emitting element ED). The encapsulation layer may be disposed in various shapes or configurations to prevent light emitting elements ED from contacting moisture or oxygen.

Referring to FIG. 2, in one or more embodiments, the display device 100 may include a communication module 260 for communicating with the pen 110.

The communication module 260 of the display device 100 can receive sensing data (e.g., touch event information and/or touch coordinate data) from the pen 110. For example, the communication module 260 may include a hardware module and a software module for communication.

Referring to FIG. 2, the host system 250 or the controller 240 can determine a touch location based on the sensing data received by the communication module 260 and perform an operation corresponding to the determined touch location. For example, the host system 250 or the controller 240 can perform operation of selecting an object (e.g., an icon, and the like) displayed at the touch location, and supply, to the controller 240 or the data driving circuit 220, input image data for displaying an image to be presented according to the selection of the object on the display panel 210. In another example, the host system 250 or the controller 240 can perform operation of selecting an object (e.g., an icon, and the like) displayed at the touch location and execute an application corresponding to the selected object.

Figure 3A:
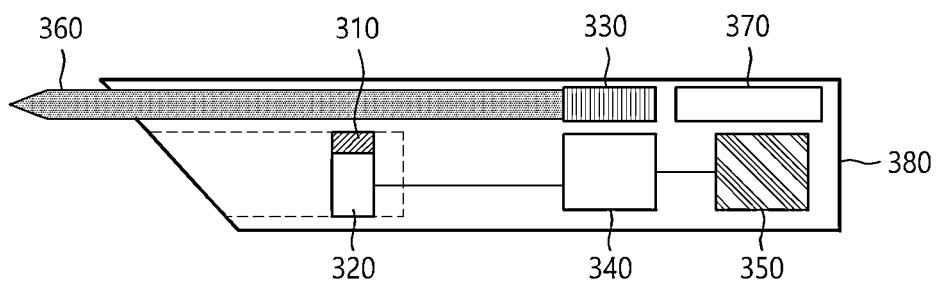
FIGS. 3A and 3B illustrate an example pen according to embodiments of the present disclosure.
Figure 3B:
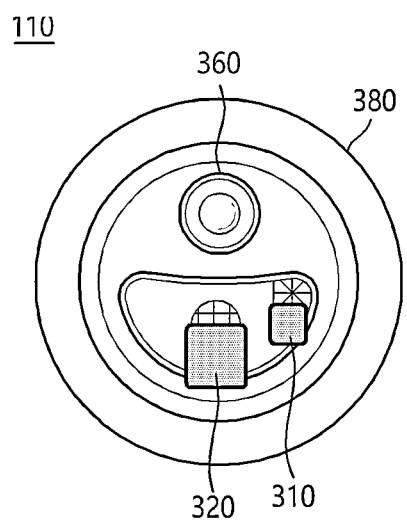

Referring to FIGS. 3A and 3B, in one or more example embodiments, the pen 110 included in the pen touch system 10 may include a light emitting device 310, a light receiving sensor 320, a control processor 340, a communication device 350, a pen tip 360, and a case 380.

The pen tip 360 may be an element for contacting the display device 100.

The light emitting device 310 can emit light having the second wavelength. For example, the light having the second wavelength may be infrared light. In this example, the light emitting device 310 may include an infrared light emitting diode package.

The light receiving sensor 320 can receive and sense redirected light coming from the display panel 211. The redirected light coming from the display panel 211 may be light that has been reflected at an inside of the display panel 211 among the light having the second wavelength emitted from the light emitting device 310. For example, the light receiving sensor 320 may be implemented with a complementary metal-oxide semiconductor (CMOS). The light receiving sensor 320 may also be referred to as an image sensor or a camera. In an example where the light having the second wavelength emitted from the light emitting device 310 is infrared light, the light receiving sensor 320 (which may also be referred to as an infrared image sensor or an infrared camera) can receive and sense redirected light coming from the display panel 211 and generate an infrared image.

The control processor 340 can control and manage the overall operation and state of the pen 110, and can control the operations of the light emitting device 310, the light receiving sensor 320, and the communication device 350.

The control processor 340 can generate sensing data by determining whether a touch has been applied and/or a location of the touch based on a distribution, a shade difference, or a wavelength difference of the redirected light received and sensed by the light receiving sensor 320.

The communication device 350 can communicate with the communication module 260 of the display device 110. The communication device 350 can transmit the sensing data (e.g., touch event information and/or touch coordinate data) generated by the control processor 340 to the communication module 260 of the display device 100. For example, the communication device 350 may include a hardware module and a software module for short-range wireless communication. For example, short-range wireless communication may include Bluetooth, wireless LAN, and the like.

The communication device 350 of the pen 110 and the communication module 260 of the display device 100 can communicate according to a predefined communication protocol.

In one or more embodiments, the pen 110 may further include a pressure sensor 330 for detecting a pressure with which the pen tip 360 presses the display device 100. The pressure sensor 330 may be connected to a portion of the pen tip 360 and can detect a pressure with which the pen tip 360 presses the display device 100.

The case 380 may accommodate the light emitting device 310, the light receiving sensor 320, the pressure sensor 330, the control processor 340, the communication device 350, and the pen tip 360.

In one or more embodiments, the pen 110 may include a power source such as a battery 370 for supplying power to the light emitting device 310, the light receiving sensor 320, the pressure sensor 330, the control processor 340, the communication device 350, and the like. The battery 370 may be a wired or wireless rechargeable battery.

The case 380 may accommodate the light emitting device 310, the light receiving sensor 320, the pressure sensor 330, the control processor 340, the communication device 350, and the pen tip 360.

Figure 4:
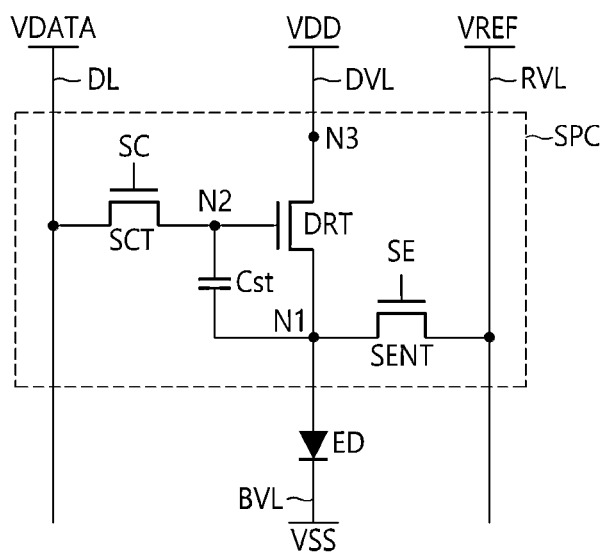
FIG. 4 illustrates an example equivalent circuit of a subpixel included in the display device according to embodiments of the present disclosure.

FIG. 4 illustrates an example equivalent circuit of a subpixel SP included in the display device 100 according to aspects of the present disclosure.

Referring to FIG. 4, each of a plurality of subpixels SP may include a light emitting element ED and a subpixel circuit SPC configured to drive the light emitting element ED. The subpixel circuit SPC of the subpixel SP illustrated in FIG. 4 may further include a sensing transistor SENT compared with the subpixel circuit SPC of the subpixel SP illustrated in FIG. 2. Hereinafter, discussions on the subpixel SP of FIG. 4 are provided by focusing on features different from the subpixel SP of FIG. 2. Thus, discussions on the same features as the subpixel SP of FIG. 2 are omitted for convenience of discussions.

Referring to FIG. 4, the subpixel circuit SPC may be connected to a data line DL, a gate line GL, a first driving voltage line DVL, a second driving voltage line BVL, and a reference voltage line RVL.

A plurality of pixel driving transistors may include a sensing transistor SENT in addition to a driving transistor DRT and a scan transistor SCT.

The sensing transistor SENT may be a transistor for controlling a voltage state of a first node N1 of the driving transistor DRT, and be connected between the first node N1 of the driving transistor DRT and the reference voltage line RVL.

The sensing transistor SENT can be turned on or turned off by a sensing signal SE, which is another type of gate signal, applied through a sensing line SENL, which is another type of gate line GL, and control an electrical connection between the first node N1 of the driving transistor DRT and the reference voltage line RVL through which a reference voltage VREF is delivered.

The drain electrode or source electrode of the sensing transistor SENT may be electrically connected to the reference voltage line RVL. The source electrode or drain electrode of the sensing transistor SENT may be connected to the first node N1 of the driving transistor DRT, and the gate electrode of the sensing transistor SENT may be electrically connected to the sensing line SENL.

Referring to FIG. 4, the scan signal SC may be referred to as a first scan signal, and the sensing signal SE may be referred to as a second scan signal. In this implementation, the scan transistor SCT may be referred to as a first scan transistor, and the sensing transistor SENT may be referred to as a second scan transistor.

Each of the driving transistor DRT, the scan transistor SCT, and the sensing transistor SENT may be an n-type transistor, or a p-type transistor.

In one or more embodiments, each of the plurality of subpixels SP may have a structure different from the structures (i.e., the equivalent circuits) of FIGS. 2 and 4. It should be noted that convenience of explanation, hereinafter, discussions are provided based on examples where each of a plurality of subpixels SP has the structure (i.e., the equivalent circuit) of FIG. 4.

Figure 5:
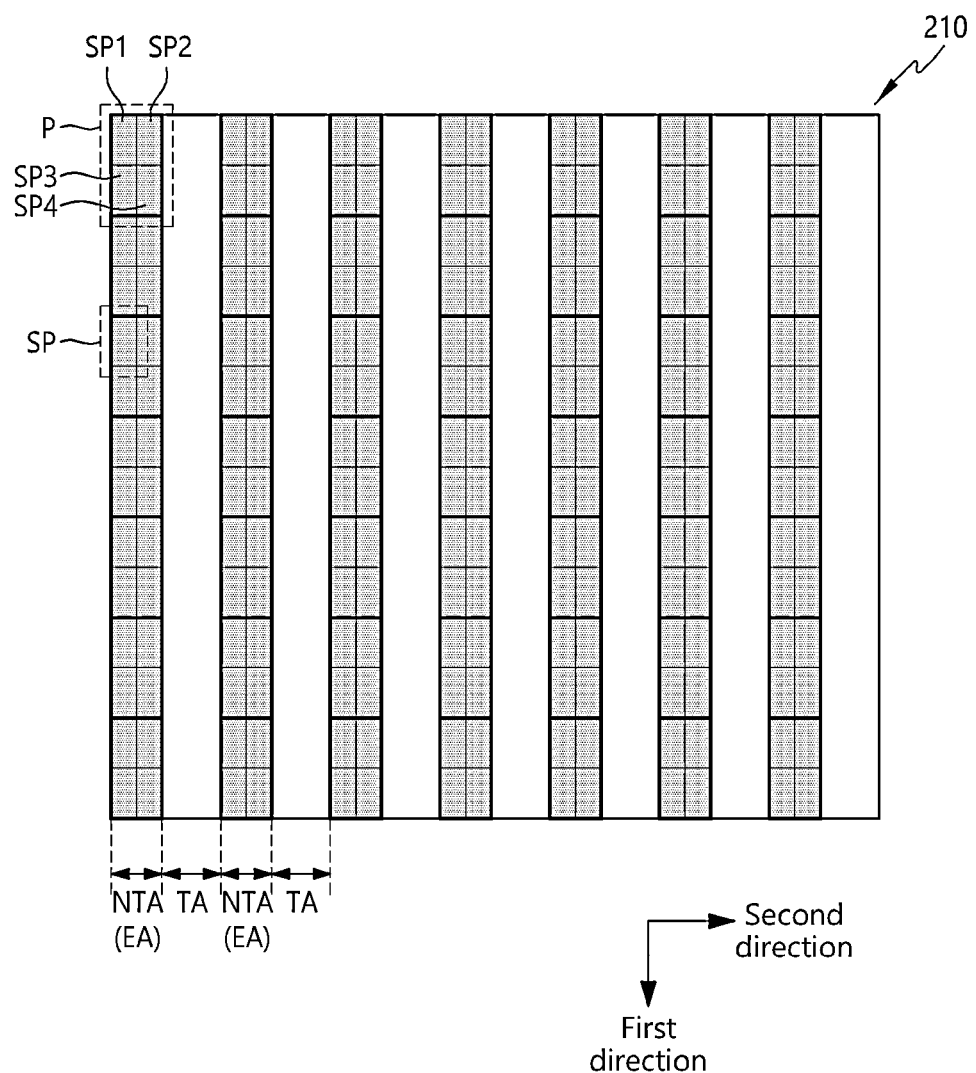
FIG. 5 is an example plan view of a display panel according to embodiments of the present disclosure.

FIG. 5 is an example plan view of the display panel 210 according to embodiments of the present disclosure.

Referring to FIG. 5, in one or more aspects, the display device 100 may be a transparent display device. In this implementation, the display panel 210 may be a transparent display panel configured to allow light (e.g., light having the first wavelength) to pass through the front (top) and back (bottom) surfaces of the display panel 210.

Referring to FIG. 5, in one or more example embodiments, the display panel 210 may include a plurality of transmissive areas TA configured to allow light (e.g., light having the first wavelength) to pass through the front (top) and back (bottom) surfaces of the display panel 210.

The plurality of transmissive areas TA may be areas allowing light having one or more wavelengths (e.g., the first wavelength discussed above) included in the visible light wavelength band to be transmitted. By applying this configuration, the back surface or parts situated in the back of the display device 100 can be visible from the front of the display device 100. The plurality of transmissive areas TA may allow not only light having one or more wavelengths in the visible light wavelength band, but also light having one or more wavelengths (e.g., the second wavelength discussed above) included in the second wavelength band (e.g., the infrared wavelength band) to be transmitted. The plurality of transmissive areas TA may also be referred to as transparent areas.

As shown in FIG. 5, for example, the display panel 210 may include a plurality of non-transmissive areas NTA and a plurality of transmissive areas TA. The plurality of non-transmissive areas NTA and the plurality of transmissive areas TA may be included in the display area DA of the display panel 210.

For example, the plurality of non-transmissive areas NTA may be areas not allowing light to be transmitted at all or areas allowing light to be transmitted with a transmittance lower than the transmissive areas TA.

For example, as shown in FIG. 5, each of the plurality of non-transmissive areas NTA is an area where a plurality of subpixels SP are disposed, and may be disposed in the first direction. The plurality of non-transmissive areas NTA may be spaced apart from each other in the second direction. A transmissive area TA may be present between two adjacent non-transmissive areas NTA among the plurality of non-transmissive areas NTA.

Referring to FIG. 5, each of the plurality of non-transmissive areas NTA may include a plurality of light emitting areas EA. The plurality of light emitting areas EA may be areas in which that light from a plurality of light emitting elements ED included in the plurality of subpixels SP is emitted.

For example, referring to FIG. 5, a plurality of pixels P may be disposed in each of the plurality of non-transmissive areas NTA. Each of the plurality of pixels P may include a first subpixel SP1, a second subpixel SP2, a third subpixel SP3, and a fourth subpixel SP4.

For example, the first subpixel SP1 can emit light of a first color, the second subpixel SP2 can emit light of a second color, the third subpixel SP3 can emit light of a third color, and the fourth subpixel SP1 can emit light of a fourth color. For example, each of the first color light, second color light, third color light, and fourth color light may be one of red light, green light, blue light, and white light.

Referring to FIG. 5, a ratio between a total area of the plurality of non-transmissive areas NTA and a total area of the plurality of transmissive areas TA may be determined in various values depending on desired transparency of the display panel 210.

As described above, in the pen touch system 10 according to one or more example embodiments of the present disclosure, in order for a pen (e.g., the pen 110 of FIG. 3A) to detect a touch, when light having the second wavelength emitted from the pen 110 is incident on the display panel 210 of the display device 100, a part of the light having the second wavelength may be absorbed at an inside of the display panel 210, and another part of the light having the second wavelength may be reflected or converted into light having one or more other wavelengths at an inside of the display panel 210, and then, be redirected to move outside of the display device 100 in the form of the light having the second wavelength or in the form of the light having the one or more other wavelengths. Herein, the redirected light may be, for example, reflected light, which means, among light having the second wavelength emitted from the pen 110, some light that is reflected at an inside of the display device 100 after being incident to the display device 100, and redirected to move outside of the display device 100. Further, the redirected light may be, for example, radiated light, which means, among light having the second wavelength emitted from the pen 110, some light that is converted into light having one or more other wavelengths at an inside of the display device 100 after being incident to the display device 100, and radiated to move, in the form of the light having the one or more other wavelengths, outside of the display device 100.

Accordingly, at a certain point of the display panel 210, a part of light having the second wavelength may be reflected, or light having one or more other wavelengths resulting from converting of light having the second wavelength may be radiated, the resulting redirected light (the reflected light or the radiated light) being caused to move outside of the display device 100, and at another point of the display panel 210, another part of the light having the second wavelength may be absorbed, this leading redirected light not to be produced. In one or more aspects, the pen 110 can detect a touch location by the pen 110 by sensing a distribution, a shade difference, and/or a wavelength difference of redirected light coming from the display panel 210 or display device 100.

In one or more embodiments, the display panel 210 of the display device 100 may include a light control structure configured to cause a part of light having the second wavelength incident to an inside of the display panel 210 after being output from a pen (e.g., the pen 110 of FIG. 3A) to be reflected or converted into light having one or more other wavelengths and radiated in the form of the light having the one or more other wavelengths, thereby, leading the resulting redirected light (i.e., reflected light or the radiated light) to come from the display device 100.

In one or more embodiments, the light control structure included in the display panel 210 of the display device 100 may include two or more of a reflection structure configured to reflect light having the second wavelength, an absorption structure configured to absorb the light having the second wavelength, and a radiation structure configured to convert light having the second wavelength into light having one or more other wavelengths and radiate the light having one or more other wavelengths.

The reflection structure can reflect light having the second wavelength included in the second wavelength band without changing the wavelength. Redirected light (reflected light) reflected by the reflection structure may be received by the pen 110.

The absorption structure can absorb light having the second wavelength (e.g., the infrared light) included in the second wavelength band. The absorption structure absorbing the light having the second wavelength (e.g., the infrared light) may cause a shade difference in the distribution of redirected light (reflected light and/or radiated light) received by the pen 110.

The absorption structure may not absorb light having the first wavelength (e.g., the visible light) included in the first wavelength band (e.g., the visible light wavelength band) or may absorb a small amount of the light having the first wavelength. For example, the absorption structure may absorb light having the second wavelength included in the second wavelength band (e.g., the infrared wavelength band) not overlapping with the first wavelength band (e.g., the visible light wavelength band).

The radiation structure can convert light having the second wavelength into light having one or more other wavelengths and radiate the light having the one or more other wavelengths. The radiation structure may cause a wavelength difference of redirected light (e.g., the infrared light) received by the pen 110 to occur.

For example, one or more other wavelengths converted from the second wavelength by the radiation structure may be included in the second wavelength band (e.g., the infrared wavelength band, or more specifically, the near-infrared wavelength band) including the second wavelength. In another example, one or more other wavelengths converted from the second wavelength by the radiation structure may be included in a wavelength band different from the second wavelength band (e.g., the infrared wavelength band) including the second wavelength.

Hereinafter, a light control structure of the display panel 210 of the display device 100 according to one or more example embodiments of the present disclosure is described. It should be noted that some cross-sectional views related to description below show respective portions of a transmissive area TA and a non-transmissive area NTA adjacent to each other.

Figure 6:
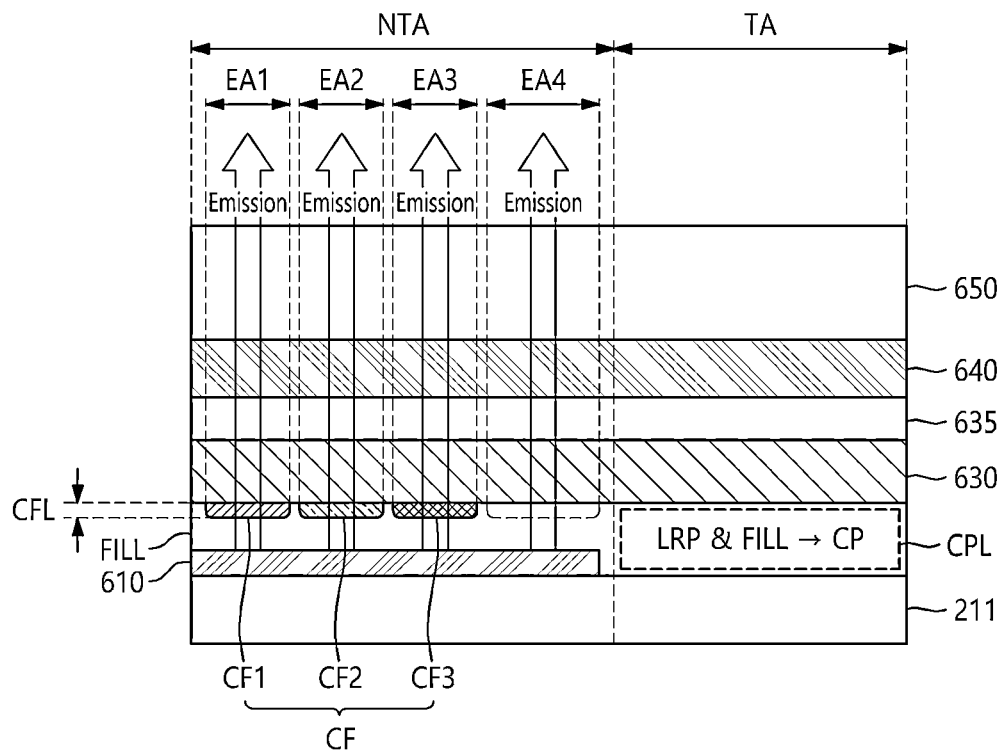
FIG. 6 is an example cross-sectional view of the display panel according to embodiments of the present disclosure.

FIG. 6 is a cross-sectional view of the display panel 210 according to embodiments of the present disclosure.

Referring to FIG. 6, in one or more example embodiments, the display panel 210 may include a first substrate 211, a pixel array layer 610 on the first substrate 211, an encapsulation layer 630 over the pixel array layer 610, and a cover window 650 over the encapsulation layer 630.

The first substrate 211 may include a plurality of transmissive areas TA capable of transmitting light having the first wavelength included in the first wavelength band, which is a visible light wavelength band, and a plurality of non-transmissive areas NTA different from the plurality of transmissive areas TA. The plurality of transmissive areas TA and the plurality of non-transmissive areas NTA may be included in the display area DA.

The pixel array layer 610 may be a layer in which a plurality of pixels P are arranged, and a plurality of light emitting elements ED and a plurality of transistors included in the plurality of subpixels SP may be disposed in the pixel array layer 610.

The pixel array layer 610 may be disposed in the plurality of non-transmissive areas NTAs. Accordingly, the plurality of light emitting elements ED may also be disposed in the plurality of non-transmissive areas NTA.

Referring to FIG. 6, in one or more embodiments, the display panel 210 may further include a code pattern layer CPL as a light control structure for providing an optical pen touch.

Referring to FIG. 6, the code pattern layer CPL may be a layer including a plurality of code patterns CP formed in each of the plurality of transmissive areas TA for pen touch sensing. In one or more aspects, the code pattern layer L2 may be a layer in which code patterns for pen touch sensing are formed or a layer for forming code patterns, and may also be referred to as a code pattern configuration layer.

Referring to FIG. 6, the code pattern layer CPL may be disposed in the plurality of transmissive areas TA and may include a photoactive material to form the code patterns CP. For example, the photoactive material may be responsive to light having the second wavelength different from the first wavelength. For example, the photoactive material may include two or more of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths.

Referring to FIG. 6, the code pattern layer CPL may include a plurality of photoactive patterns LRP and a filler layer FILL. A code pattern CP may be formed by a plurality of photoactive patterns LRP and the filler layer FILL.

In one or more embodiments, a plurality of photoactive patterns LRP may be disposed in a plurality of transmissive areas TA so that a plurality of code patterns CP for pen touch sensing can be formed in the plurality of transmissive areas TA, that is, a pen (e.g., the pen 110 of FIG. 3A) can recognize the plurality of code patterns CP in the plurality of transmissive areas TA.

The filler layer FILL may be disposed not only in the plurality of transmissive areas TA but also in the plurality of non-transmissive areas NTA. For example, the filler layer FILL may be disposed in all or one or more partial areas of the display area DA. The filler layer FILL may include a filler material and may have a planarizing function.

Each of the plurality of photoactive patterns LRP and the filler layer FILL may include a photoactive material. However, the photoactive material included in the plurality of photoactive patterns LRP and the photoactive material included in the filler layer FILL may perform different photoactivations.

Referring to FIG. 6, the code pattern layer CPL may be located between the first substrate 211 and the encapsulation layer 630.

Referring to FIG. 6, in one or more embodiments, the display panel 210 may further include a color filter layer CFL located on the pixel array layer 610. For example, the color filter layer CFL may be located under the encapsulation layer 630. In another example, the color filter layer CFL may be located on the encapsulation layer 630. The encapsulation layer 630 may be an encapsulation substrate.

The color filter layer CFL and the pixel array layer 610 may be disposed in the non-transmissive area NTA, but may not be disposed in the transmissive area TA.

The color filter layer CFL may be located between the pixel array layer 610 and the code pattern layer CPL and may include a plurality of color filters CF disposed in the non-transmissive area NTA.

Light emitted from light emitting elements ED included in the pixel array layer 610 may have a first wavelength different from the second wavelength of light output from the pen 110.

The light emitted by light emitting elements ED included in the pixel array layer 610 and then passing through the color filter CF may have the first wavelength different from the second wavelength of light output by the pen 110.

The plurality of color filters CF may include a first color filter CF1 allowing first color light to be transmitted, a second color filter CF2 allowing second color light to be transmitted, and a third color filter CF2 allowing third color light CF3 to be transmitted. For example, the first color light, the second color light, and the third color light may have different wavelengths, and respective wavelengths of the first color light, second color light, and third color light may be included in the first wavelength band (the visible light wavelength).

The pixel array layer 610 may include a first subpixel SP1 located under the first color filter CF1, a second subpixel SP2 located under the second color filter CF2, a third subpixel SP3 located under the third color filter CF3, and a fourth subpixel SP4 located under an area where a color filter is not disposed.

As in the example of FIG. 6, the first subpixel SP1 can emit red light, the second subpixel SP2 can emit green light, the third subpixel SP3 can emit blue light, and the fourth subpixel SP4 can emit white light. For example, red light may have a wavelength ranging from approximately 700 to 610 nm, green light may have a wavelength ranging from approximately 570 nm to 500 nm, and blue light may have a wavelength ranging from approximately 500 nm to 450 nm. White light may be a combination of all color light, and thus, have all wavelength properties. A first light emitting area EA1 where the first color filter CF1 is disposed may be an area where red light is emitted, a second light emitting area EA2 where the second color filter CF2 is disposed may be an area where green light is emitted, a third light emitting area EA3 where the third color filter CF3 is disposed may be an area where blue light is emitted, and a fourth light emitting area EA4 where the fourth color filter CF4 is disposed may be an area where white light is emitted.

For example, the plurality of color filters CF may be disposed in each of the plurality of non-transmissive areas NTA, and may be located on the encapsulation layer 630 or under the encapsulation layer 630. Each of the plurality of color filters CF may transmit light included in the first wavelength band (the visible light wavelength band) including the first wavelength and having one or more wavelengths corresponding to a corresponding color.

Each of the plurality of color filters CF may include a material capable of transmitting light having the second wavelength output from the pen 110 for pen touch sensing and included in the second wavelength band.

Referring to FIG. 6, in the plurality of transmissive areas NTA, the photoactive material disposed in the code pattern layer CPL may include two or more photoactive materials performing different types of photoactivations. For example, the photoactive material may include two or more of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths.

Thus, the plurality of transmissive areas NTA may not transmit light having the second wavelength or may transmit light having the second wavelength with a low transmittance due to the photoactive material disposed in the code pattern layer CPL. In contrast, the plurality of transmissive areas NTA may have a relatively high transmittance for light having the first wavelength. Accordingly, in the plurality of transmissive areas NTA, a transmittance for light having the second wavelength may be lower than a transmittance for light having the first wavelength.

In one or more embodiments, the pen touch system can provide double-sided pen touch sensing or single-sided pen touch sensing depending on methods and/or structures of arranging a plurality of photoactive patterns LRP in the code pattern layer CPL.

In an example where the pen touch system according to aspects of the present disclosure is configured to provide double-sided pen touch sensing, the display device 100 can allow an input by the pen 110 through both the front surface and back surface of the display device 100 based on sensing data received from the pen 110.

In an example where the pen touch system according to aspects of the present disclosure is configured to provide single-sided pen touch sensing, the display device 100 can allow an input by the pen 110 through any one of the front surface and back surface of the display device 100 based on sensing data received from the pen 110.

In one or more embodiments, the display panel 210 may have a top emission structure or a bottom emission structure, and in some implementations, may have both the top emission structure and the bottom emission structure.

In an example where the display panel 210 is configured to have the top emitting structure or the bottom emitting structure, a plurality of light emitting elements ED disposed in the pixel array layer 610 may emit light toward any one of the first substrate 211 and the cover window 650.

In an example where the display panel 210 is configured to provide double-sided pen touch sensing, the display device 100 can allow an input by the pen 110 through both the front surface and back surface of the display device 100 based on sensing data received from the pen 110.

In an example where the display panel 210 is configured to provide single-sided pen touch sensing, the display device 100 can allow an input by the pen 110 through any one of the front surface and back surface of the display device 100 based on sensing data received from the pen 110.

Referring to FIG. 6, in one or more embodiments, the display panel 210 may further include a film layer 635 on the encapsulation layer 630, and an adhesive layer 640 between the film layer 635 and the cover window 650.

Figure 7:
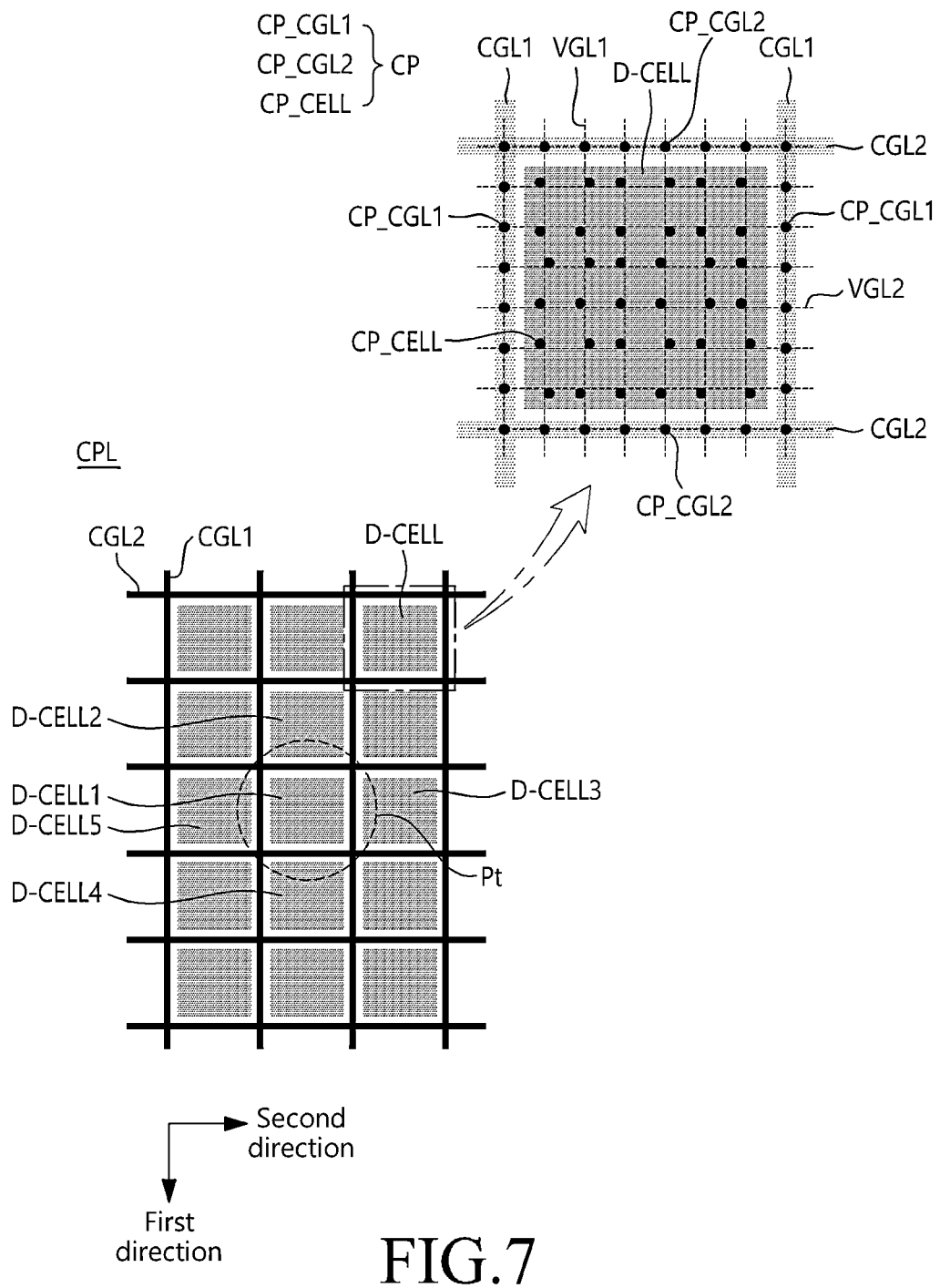
FIG. 7 illustrates an example configuration of code patterns in the display panel according to embodiments of the present disclosure.

FIG. 7 illustrates an example configuration of code patterns in the display panel 210 according to embodiments of the present disclosure.

Referring to FIG. 7, a code pattern layer CPL may include a plurality of data cell areas D-CELL arranged in rows and columns, each of the plurality of data cell areas D-CELL corresponding to a partial area of the display area DA including a transmissive area TA and a non-transmissive area NTA, a plurality of first cell guide lines CGL1, each of which is disposed between adjacent data cell areas D-CELL in the second direction, and a plurality of second cell guide lines CGL2, each of which is disposed between adjacent data cell areas D-CELL in the first direction.

Each of the plurality of first cell guide lines CGL1 may extend in the first direction, and each of the plurality of second cell guide lines CGL2 may extend in the second direction.

The code pattern layer CPL may include the plurality of data cell areas D-CELL arranged in rows and columns, the plurality of first cell guide lines CGL1, each of which is disposed between adjacent data cell areas D-CELL in the second direction, and the plurality of second cell guide lines CGL2, each of which is disposed between adjacent data cell areas D-CELL in the first direction.

Referring to FIG. 7, a plurality of code patterns CP may include a plurality of first guide code patterns CP_CGL1 for representing each of the plurality of first cell guide lines CGL1, a plurality of second guide code patterns CP_CGL2 for representing each of the plurality of second cell guide lines CGL2, and a plurality of data code patterns CP_CELL are disposed in each of the plurality of data cell areas D-CELL and arranged in rows and columns.

Referring to FIG. 7, a pattern in which the plurality of data code patterns CP_CELL are arranged may be different for each of the plurality of data cell areas D-CELL.

The plurality of data code patterns CP_CELL included in each of the plurality of data cell areas D-CELL may be arranged in a matrix pattern of m rows and n columns.

In each of the plurality of data cell areas D-CELL, the plurality of data code patterns CP_CELL may be arranged along virtual grid lines (VGL1, VGL2) in m rows and n columns.

Each of the plurality of data cell areas D-CELL may correspond to one coordinate data. A pattern of locations where the plurality of data code patterns CP_CELL included in each of the plurality of data cell areas D-CELL are respectively disposed may represent one coordinate data. According to this configuration, the plurality of data code patterns CP_CELL are arranged in m rows and n columns in each of the plurality of data cell areas D-CELL, but at least one or more of locations where the plurality of data code patterns CP_CELL are respectively disposed may be slightly different for each of the plurality of data cell areas D-CELL.

The plurality of data code patterns CP_CELL included in each of the plurality of data cell areas D-CELL may have a unique arrangement shape (which may be also referred to as a unique disposition location pattern) corresponding to a unique coordinate pair.

A unique disposition location pattern of the plurality of data code patterns CP_CELL included in each of the plurality of data cell areas D-CELL may be an encrypted pattern representing a unique coordinate pair.

Referring to the example of FIG. 7, each of the plurality of data cell areas D-CELL may have, as a corresponding unique pattern, 36 data code patterns CP_CELL arranged in 6 rows and 6 columns to represent a unique coordinate pair using codes.

A first data cell area D-CELL1 may include 36 data code patterns CP_CELL to represent first coordinates. A second data cell area D-CELL2 may include 36 data code patterns CP_CELL to represent second coordinates. A third data cell area D-CELL3 may include 36 data code patterns CP_CELL to represent third coordinates. A fourth data cell area D-CELL4 may include 36 data code patterns CP_CELL to represent fourth coordinates. A fifth data cell area D-CELL5 may include 36 data code patterns CP_CELL to represent fifth coordinates.

A disposition location pattern of the 36 data code patterns CP_CELL included in the first data cell area D-CELL1 may be an encrypted pattern indicating first coordinates. A disposition location pattern of the 36 data code patterns CP_CELL included in the second data cell area D-CELL2 may be an encrypted pattern indicating second coordinates. A disposition location pattern of the 36 data code patterns CP_CELL included in the third data cell area D-CELL3 may be an encrypted pattern indicating third coordinate. A disposition location pattern of the 36 data code patterns CP_CELL included in the fourth data cell area D-CELL4 may be an encrypted pattern indicating fourth coordinates. A disposition location pattern of the 36 data code patterns CP_CELL included in the fifth data cell area D-CELL5 may be an encrypted pattern indicating fifth coordinates.

For example, the first coordinates corresponding to the first data cell area D-CELL1, the second coordinates corresponding to the second data cell area D-CELL2, the third coordinates corresponding to the third data cell area D-CELL3, the fourth coordinate corresponding to the fourth data cell area D-CELL4, and the fifth coordinate corresponding to the fifth data cell area D-CELL5 may be different from each other. Accordingly, the disposition location pattern of the 36 data code patterns CP_CELL included in the first data cell area D-CELL1, the disposition location pattern of the 36 data code patterns CP_CELL included in the second data cell area D-CELL2, the disposition location pattern of the 36 data code patterns CP_CELL included in the third data cell area D-CELL3, the disposition location pattern of the 36 data code patterns CP_CELL included in the fourth data cell area D-CELL4, and the disposition location pattern of the 36 data code patterns CP_CELL included in the 5th data cell area D-CELL5 may be different from each other.

Each of the plurality of data cell areas D-CELL may correspond to a corresponding portion of the display area DA. Each data cell area D-CELL may overlap with a group of two or more subpixels among a plurality of subpixels included in the display area DA. For example, the first data cell area D-CELL1 may overlap with a first group including two or more first subpixels, and the second data cell area D-CELL2 may overlap with a second group of two or more second subpixels. The two or more first subpixels included in the first group and the two or more second subpixels included in the second group may be different from each other.

A pen (e.g., the pen 110 of FIG. 3A) can recognize a plurality of code patterns CP based on redirected light, recognize a plurality of first cell guide lines CGL1 and a plurality of second cell guide lines CGL2 based on the result of the recognizing, and recognize a plurality of data cell areas D-CELL partitioned by the plurality of first cell guide lines CGL1 and the plurality of second cell guide lines CGL2.

The pen 110 can recognize a disposition location pattern of a plurality of data code patterns CP_CELL included in at least one of the plurality of data cell areas D-CELL, and determine a location of the pen 110 (i.e., a touch location) based on the result of the recognizing.

Referring to FIG. 7, for example, when the pen 110 touches a location Pt at which the first data cell area D-CELL1 is centered, the pen 110 can recognize a corresponding disposition location pattern of a plurality of data code patterns CP_CELL included in each of the first to fifth data cell areas (D-CELL1 to D-CELL5) based on results obtained by sensing redirected light with shade differences or wavelength differences, and calculate a more precise touch location based on the first to fifth coordinates corresponding to the first to fifth data cell areas (D-CELL1 to D-CELL5) and differences in signal intensity of the redirected light.

Hereinafter, example structures of code patterns CP disposed in the display panel 210 according to example embodiments of the present disclosure are described in more detail.

Figure 8:
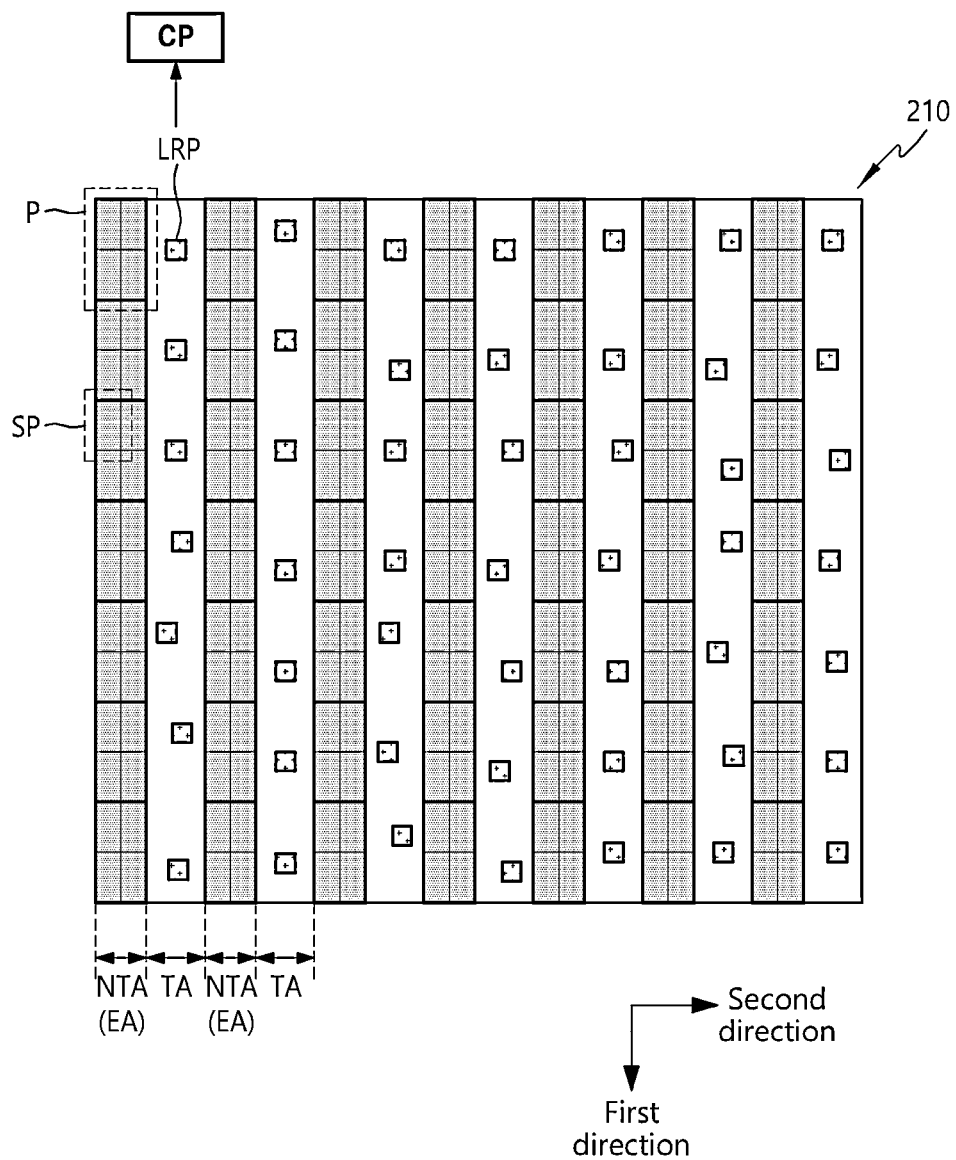
FIGS. 8, 9, and 10 are example plan views of the display panel in which a plurality of code patterns are disposed in transmissive areas according to embodiments of the present disclosure.
Figure 9:
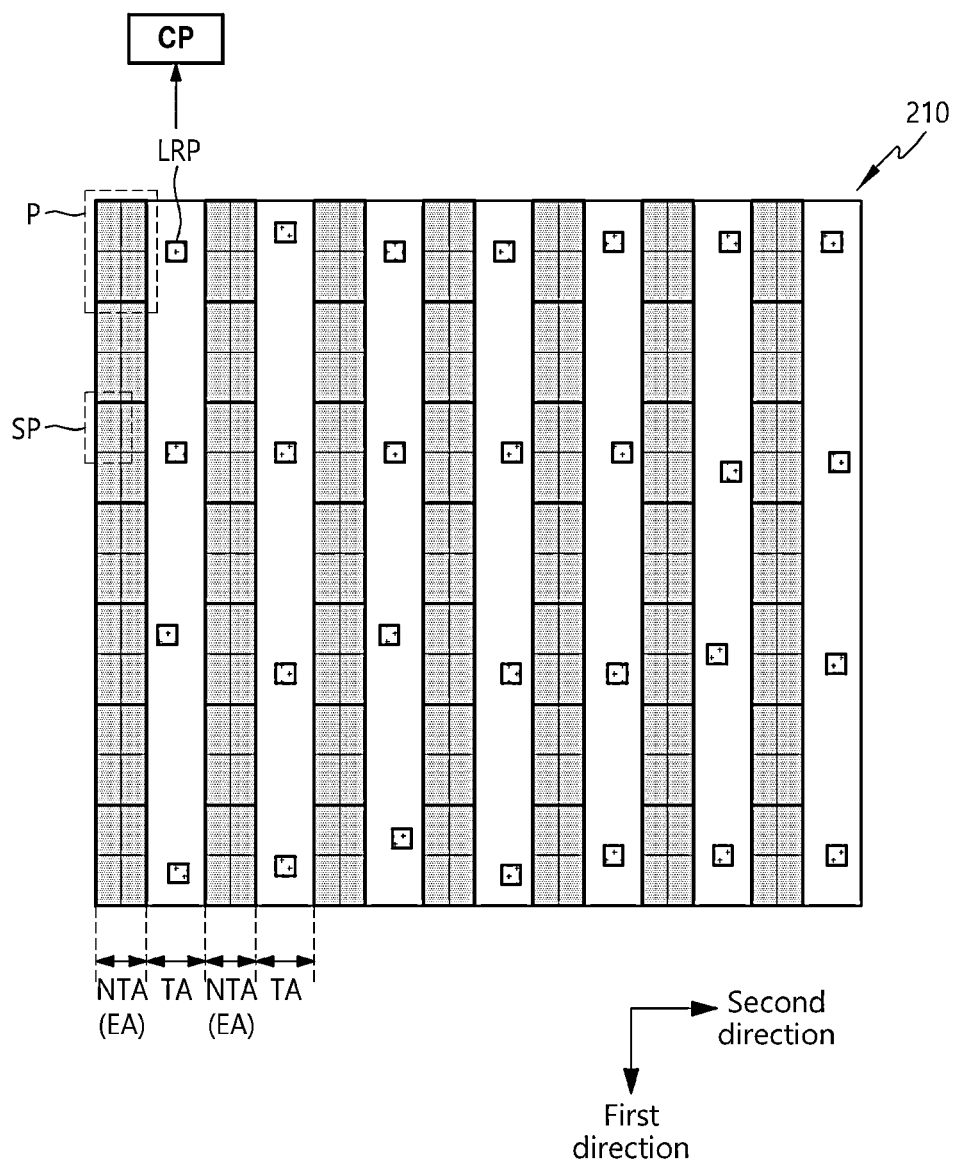
Figure 10:
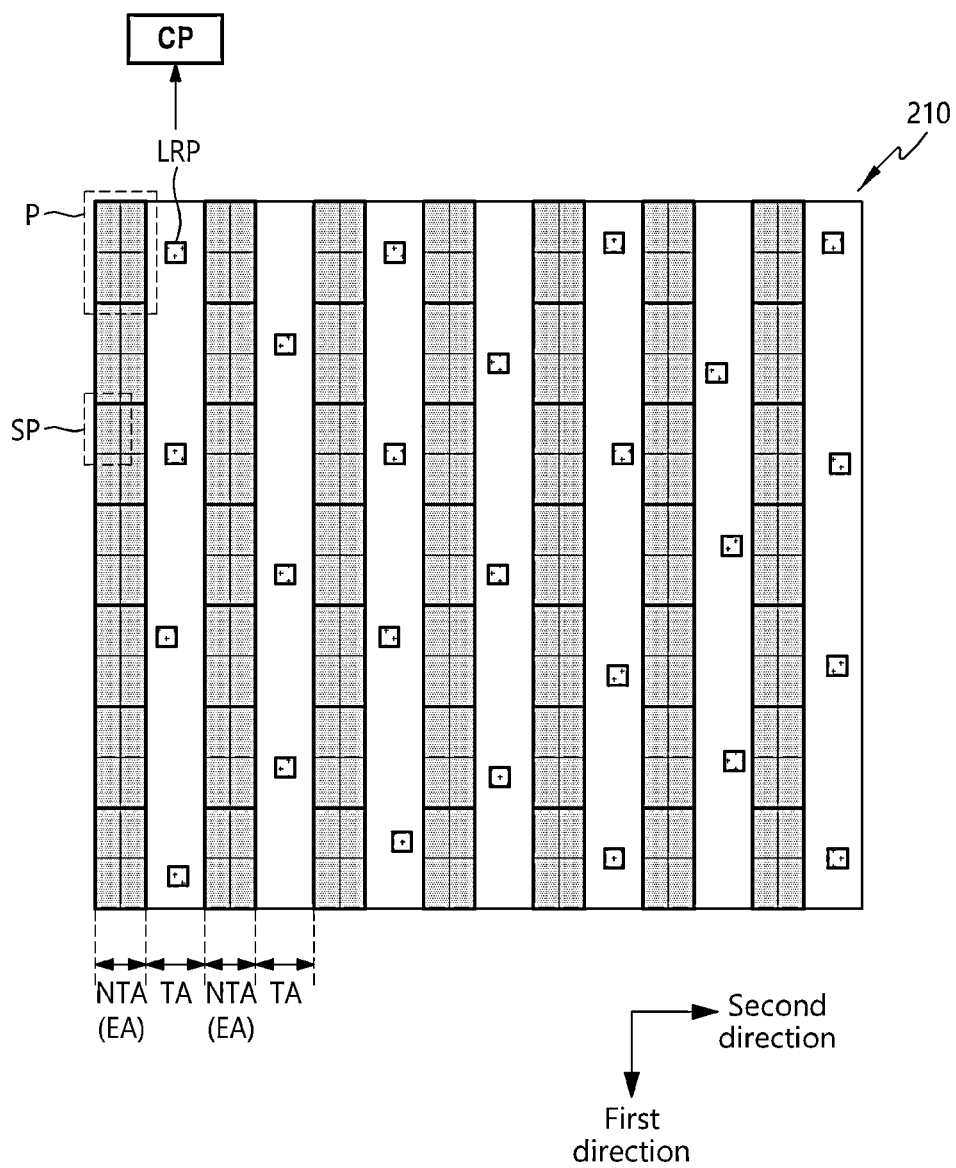

FIGS. 8, 9, and 10 are example plan views of the display panel 210 in which a plurality of code patterns CP are disposed in transmissive areas TA according to embodiments of the present disclosure.

Referring to FIGS. 8 to 10, the display panel 210 may include a plurality of non-transmissive areas NTA and a plurality of transmissive areas TA.

Referring to FIGS. 8 to 10, the plurality of non-transmissive areas NTA may be areas in which a plurality of pixels P are disposed. Each of the plurality of pixels P may include a plurality of subpixels SP. The plurality of non-transmissive areas NTA may include a plurality of light emitting areas corresponding to the plurality of subpixels SP.

Referring to FIGS. 8 to 10, a plurality of photoactive patterns LRP may be disposed in the plurality of transmissive areas TA among the plurality of non-transmissive areas NTA and the plurality of transmissive areas TA. A plurality of code patterns CP for pen touch sensing may be configured by the plurality of photoactive patterns LRP.

Referring to FIGS. 8 to 10, the plurality of code patterns CP for pen touch sensing may be disposed in the plurality of transmissive areas TA among the plurality of non-transmissive areas NTA and the plurality of transmissive areas TA.

As shown in FIG. 8, one photoactive pattern LRP may be configured to correspond to one pixel P.

As shown in FIG. 9, one photoactive pattern LRP may be configured to correspond to two pixels P. Accord to these configurations, the number of photoactive patterns LRP disposed per unit area in FIG. 9 may be less than the number of photoactive patterns LRP disposed per unit area in FIG. 8.

As shown in FIG. 10, one photoactive pattern LRP may be configured to correspond to two pixels P. According to these configurations, the number of photoactive patterns LRP disposed per unit area in FIG. 10 may be equal to the number of photoactive patterns LRP disposed per unit area in FIG. 9.

Referring to FIG. 9, a plurality of photoactive patterns LRP disposed in each odd-numbered transmissive area TA among a plurality of transmissive areas TA may be configured to correspond to a respective odd-numbered pixel row (or a respective even-numbered pixel row), and a plurality of photoactive patterns LRP disposed in each even-numbered transmissive area TA among the plurality of transmissive areas TA may be configured to correspond to the respective even-numbered pixel row (or the respective odd-numbered pixel row).

Referring to FIG. 10, a plurality of photoactive patterns LRP disposed in each odd-numbered transmissive area TA among a plurality of transmissive areas TA may be configured to correspond to a respective odd-numbered pixel row (or a respective even-numbered pixel row), and a plurality of photoactive patterns LRP disposed in each even-numbered transmissive area TA among the plurality of transmissive areas TA may be configured to correspond to the respective even-numbered pixel row (or the respective odd-numbered pixel row).

Referring to FIGS. 8 to 10, and FIG. 7, at least some of photoactive patterns LRP shown in FIGS. 8 to 10 may correspond to code patterns CP_CELL disposed in two or more data cell areas D-CELL, correspond to code patterns CP_CELL disposed in one data cell area D-CELL, or correspond to code patterns CP_CELL disposed in a portion of one data cell area D-CELL.

In addition, some of photoactive patterns LRP shown in FIGS. 8 to 10 may correspond to code patterns (CP_CGL1, CP_CGL2) corresponding to first and second cell guide lines (CGL1, CGL2) around a data cell area D-CELL.

Figure 11:
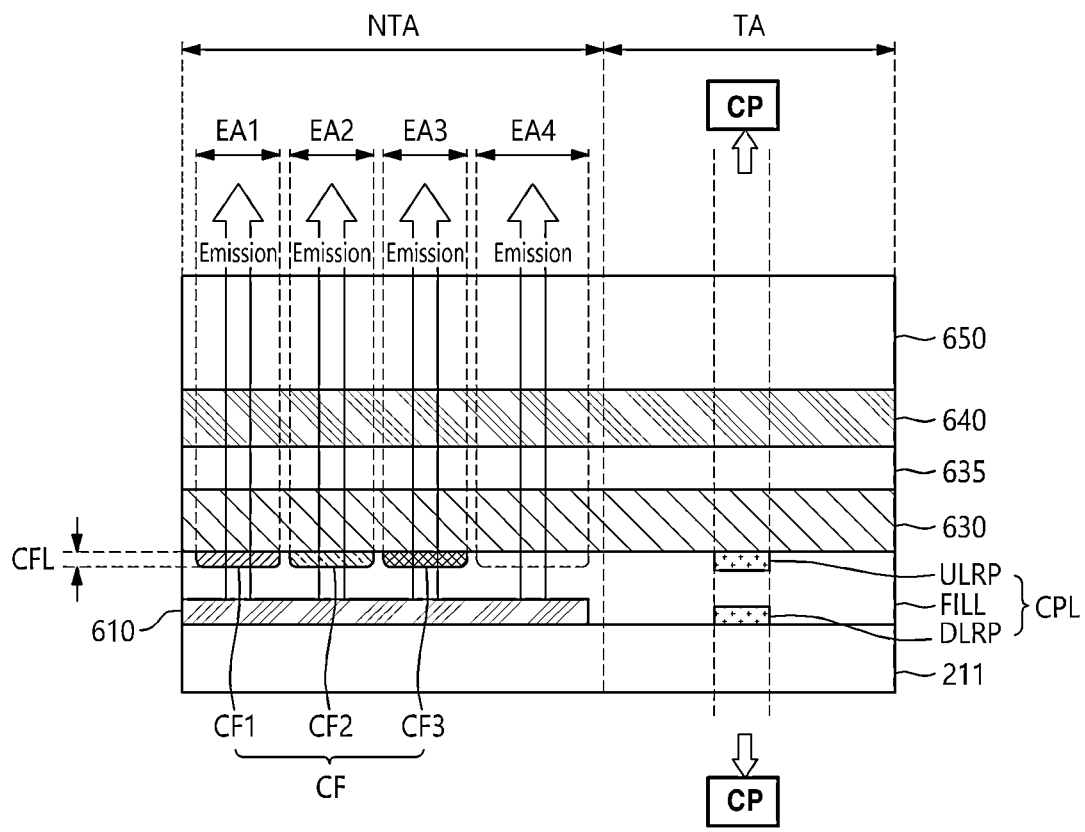
FIG. 11 is an example cross-sectional view of the display panel according to embodiments of the present disclosure.

FIG. 11 is an example cross-sectional view of the display panel 210 according to embodiments of the present disclosure.

Referring to FIG. 11, a code pattern layer CPL may include at least one photoactive pattern LRP and a filler layer FILL.

For example, the at least one photoactive pattern LRP may include a lower photoactive pattern DLRP located on a first substrate 211 and an upper photoactive pattern ULRP located over the lower photoactive pattern DLRP.

The filler layer FILL may be configured to cover the lower photoactive pattern DLRP and may be located between the lower photoactive pattern DLRP and the upper photoactive pattern ULRP.

Referring to FIG. 11, the upper photoactive pattern ULRP and the lower photoactive pattern DLRP may be disposed in a transmissive area TA, and the filler layer FILL may be disposed in both the transmissive area TA and a non-transmissive area NTA.

Referring to FIG. 11, the upper photoactive pattern ULRP and the lower photoactive pattern DLRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 11, the upper photoactive pattern ULRP and the lower photoactive pattern DLRP may overlap with each other vertically.

Referring to FIG. 11, the upper photoactive pattern ULRP and the lower photoactive pattern DLRP may cause a shade difference or a wavelength difference in redirected light distribution. Therefore, the upper photoactive pattern ULRP may be a code pattern CP for allowing pen touch sensing through the front surface of the display panel 210, and the lower photoactive pattern DLRP may be a code pattern CP for allowing pen touch sensing through the back surface of the display panel 210.

Referring to FIG. 11, in an example where the pen 110 is located on or over the front surface of the display panel 210, light having the second wavelength output from the pen 110 may be incident on a cover window 650.

Referring to FIG. 11, in an example where the pen 110 is located on or under the back surface of the display panel 210, light having the second wavelength may be incident on the first substrate 211.

As shown in FIG. 11, in the example where the code pattern layer CPL includes the lower photoactive pattern DLRP, the upper photoactive pattern ULRP, and the filler layer FILL between the lower photoactive pattern DLRP and the upper photoactive pattern ULRP, a pen 110 located on or over the front surface of the display device 100 can recognize one or more corresponding code patterns CP, and the pen 110 or another pen 110 located on or under the back surface of the display device 100 can also recognize one or more corresponding code patterns CP.

Accordingly, a pen touch (i.e., an input by the pen touch) by one or more pen 110 can be enabled through both the front and back surfaces of the display device 100.

Figure 12:
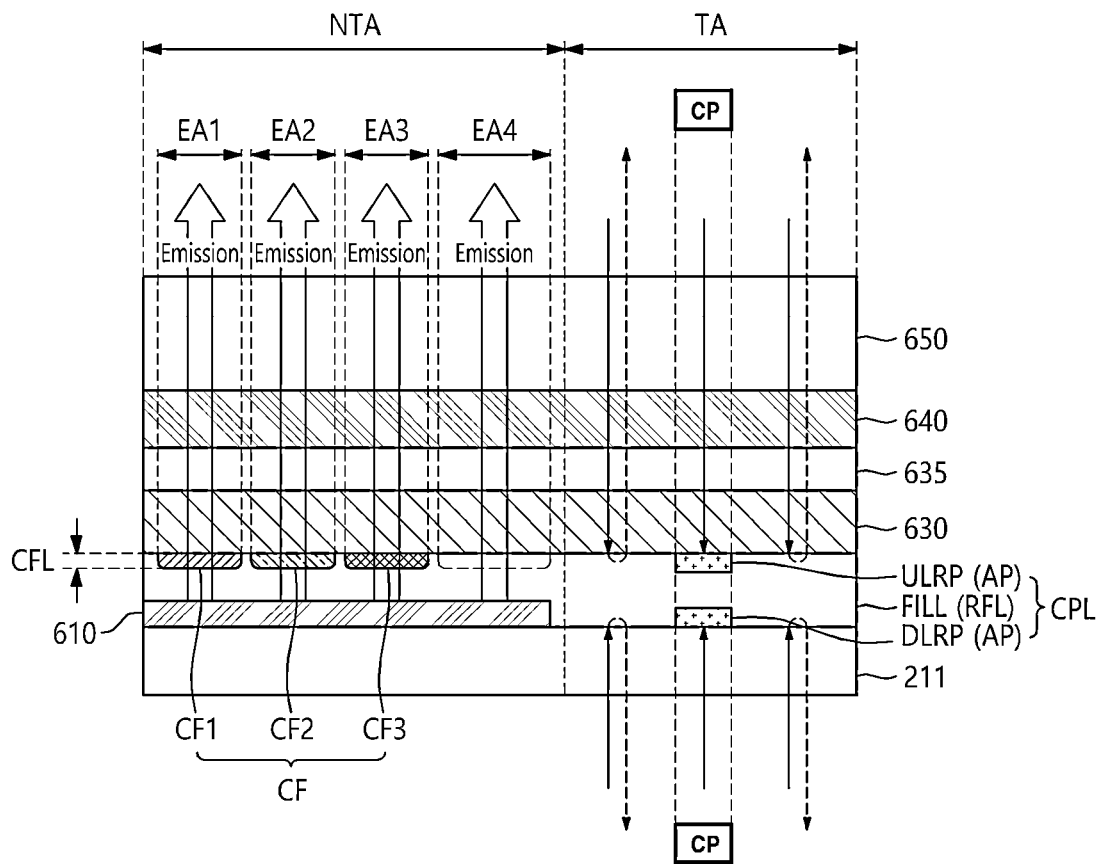
FIGS. 12 and 13 illustrate example schemes of forming code patterns in the display panel of FIG. 11 according to embodiments of the present disclosure.

FIG. 12 illustrates an example scheme of forming code patterns in the display panel 210 of FIG. 11 according to embodiments of the present disclosure. It should be noted that in FIG. 12, it is assumed that light having the second wavelength is infrared light.

In the example of FIG. 12, the upper photoactive pattern ULRP and the lower photoactive pattern DLRP may include the absorption material AP, and the filler layer FILL may include the reflection material RFL.

Referring to FIG. 12, when infrared light, which is light having the second wavelength, is output from a pen (e.g., the pen 110 of FIG. 3A) located on or over the front surface (e.g., a surface adjacent to the cover window 650) of the display panel 210, some of the infrared light reaching the upper photoactive pattern ULRP may be absorbed by the upper photoactive pattern ULRP, and some of the infrared light reaching an upper surface of the filler layer FILL may be reflected by the filler layer FILL.

Accordingly, there may occur a shade difference in the distribution of redirected light coming from the front of the display panel 210. For example, the redirected light may not be present or be present with a very small amount in an area over the upper photoactive pattern ULRP, but the redirected light may be present normally in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

Referring to FIG. 12, when infrared light, which is light having the second wavelength, is output from a pen (e.g., the pen 110 of FIG. 3A) located on or under the back surface (e.g., a surface adjacent to the substrate 211) of the display panel 210, some of the infrared light reaching the lower photoactive pattern DLRP may be absorbed by the lower photoactive pattern DLRP, and some of the infrared light reaching a lower surface of the filler layer FILL may be reflected by the filler layer FILL.

Accordingly, there may occur a shade difference in the distribution of redirected light coming from the back of the display panel 210. For example, the redirected light may not be present or be present with a very small amount in an area under the lower photoactive pattern DLRP, but the redirected light may be present normally in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

Figure 13:
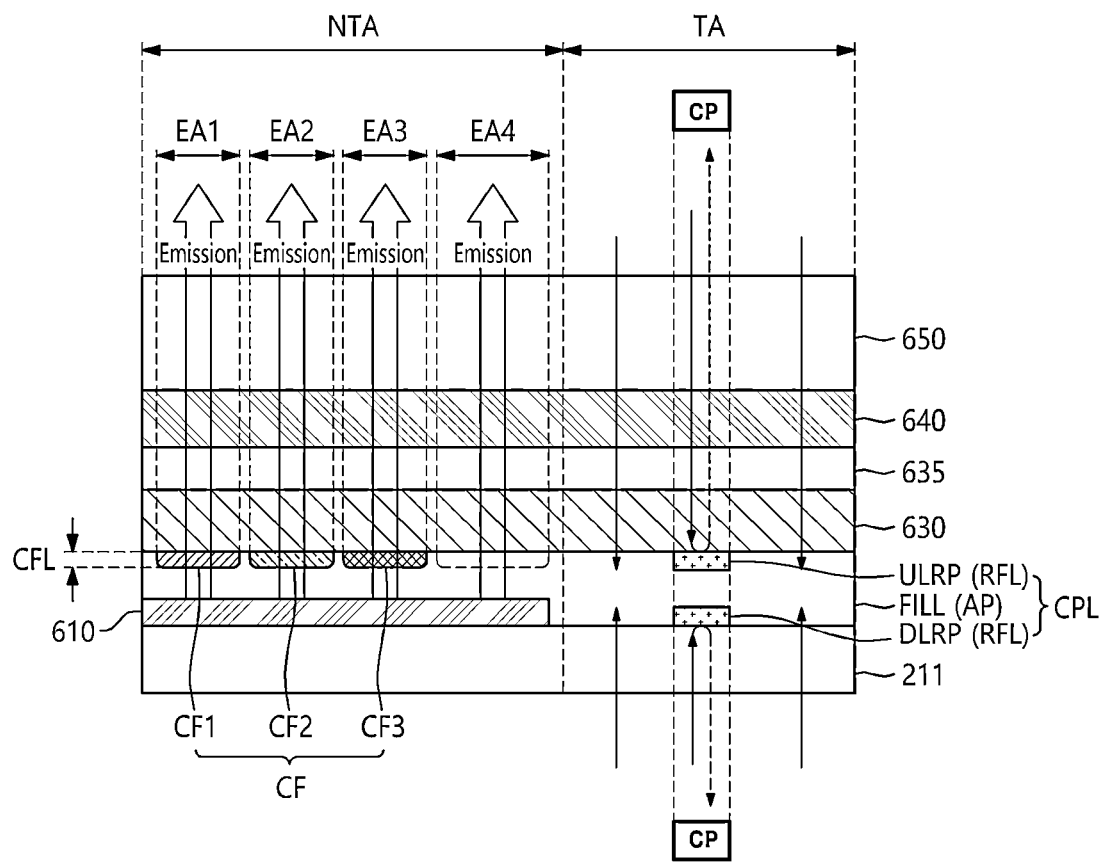

FIG. 13 illustrates an example scheme of forming code patterns in the display panel 210 of FIG. 11 according to embodiments of the present disclosure. It should be noted that in FIG. 13, it is assumed that light having the second wavelength is infrared light.

In the example of FIG. 13, the upper photoactive pattern ULRP and the lower photoactive pattern DLRP may include the reflection material RFL, and the filler layer FILL may include the absorption material AP.

Referring to FIG. 13, when infrared light, which is light having the second wavelength, is output from a pen 110 (e.g., the pen of FIG. 3A) located on or over the front surface (e.g., a surface adjacent to the cover window 650) of the display panel 210, some of the infrared light reaching the upper photoactive pattern ULRP may be reflected by the upper photoactive pattern ULRP, and some of the infrared light reaching an upper surface of the filler layer FILL may be absorbed by the filler layer FILL.

Accordingly, there may occur a shade difference in the distribution of redirected light coming from the front of the display panel 210. For example, the redirected light may be present normally in an area over the upper photoactive pattern ULRP, but the redirected light may not be present or be present with a very small amount in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

Referring to FIG. 13, when infrared light, which is light having the second wavelength, is output from a pen (e.g., the pen 110 of FIG. 3A) located on or under the back surface (e.g., a surface adjacent to the substrate 211) of the display panel 210, some of the infrared light reaching the lower photoactive pattern DLRP may be reflected by the lower photoactive pattern DLRP, and some of the infrared light reaching a lower surface of the filler layer FILL may be absorbed by the filler layer FILL.

Accordingly, there may occur a shade difference in the distribution of redirected light coming from the back of the display panel 210. For example, the redirected light may be present normally in an area under the lower photoactive pattern DLRP, but the redirected light may not be present or be present with a very small amount in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

Figure 14:
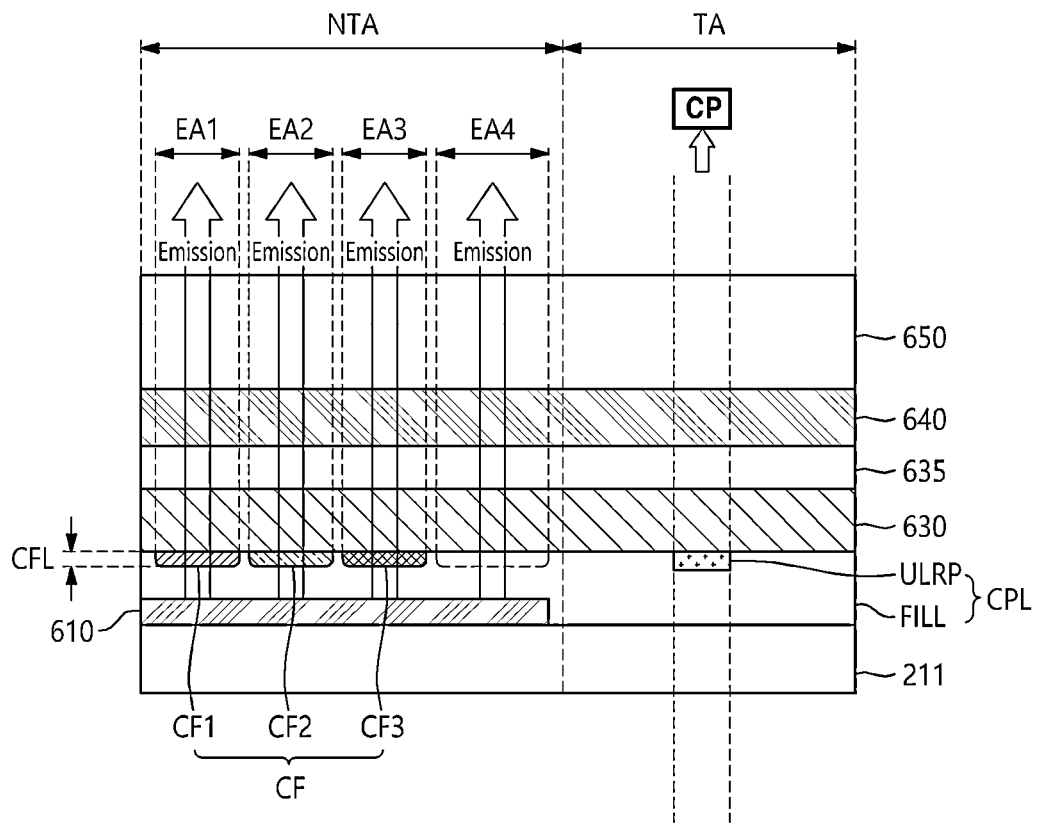
FIG. 14 is an example cross-sectional view of the display panel according to embodiments of the present disclosure.

FIG. 14 is an example cross-sectional view of the display panel 210 according to embodiments of the present disclosure.

Referring to FIG. 14, a code pattern layer CPL may include at least one photoactive pattern LRP and a filler layer FILL.

The photoactive pattern LRP may include an upper photoactive pattern ULRP located on the filler layer FILL.

The filler layer FILL may be located on a first substrate 211.

Referring to FIG. 14, the upper photoactive pattern ULRP may be disposed in a transmissive area TA, and the filler layer FILL may be disposed in both the transmissive area TA and a non-transmissive area NTA.

Referring to FIG. 14, the upper photoactive pattern ULRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 14, the upper photoactive pattern ULRP may cause a shade difference or wavelength difference in the distribution of redirected light. Accordingly, the upper photoactive pattern ULRP may be a code pattern CP for allowing pen touch sensing through the front surface of the display panel 210.

Referring to FIG. 14, in an example where a pen (e.g., the pen 110 of FIG. 3A) is located on or over the front surface of the display panel 210, light having the second wavelength output from the pen 110 may be incident on a cover window 650.

Referring to FIG. 14, in an example where the pen 110 is located on or under the back surface of the display panel 210, light having the second wavelength may be incident on the first substrate 211, but all or most of the light having the second wavelength incident on the first substrate 211 may be reflected, absorbed, or radiated by the filler layer FILL.

As shown in FIG. 14, in the example where the code pattern layer CPL includes the upper photoactive pattern ULRP and the filler layer FILL, the pen 110 located on or over the front surface of the display device 100 can recognize one or more corresponding code patterns CP, but the pen 110 located on or under the back surface of the display device 100 cannot recognize the one or more code patterns CP.

Accordingly, a pen touch (i.e., an input by the pen touch) by one or more pen 110 can be enabled through the front surface of the display device 100.

Figure 15:
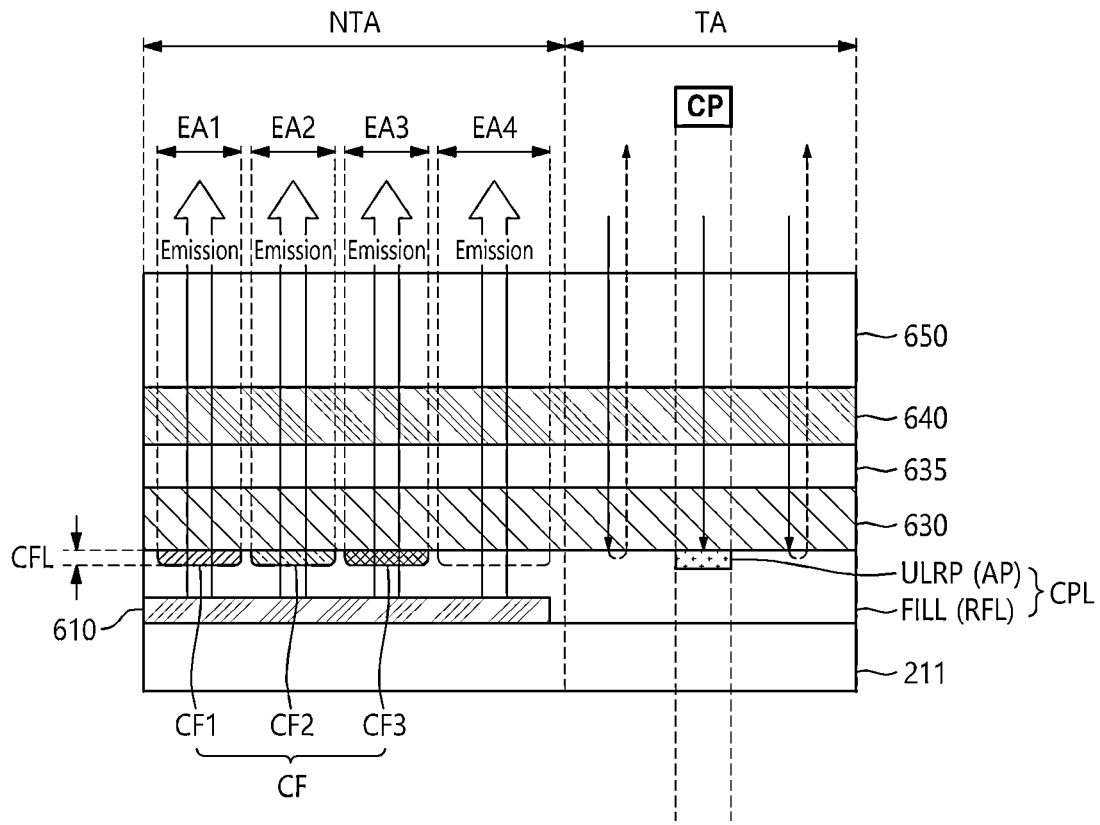
FIGS. 15 and 16 illustrate example schemes of forming code patterns in the display panel of FIG. 14 according to embodiments of the present disclosure.

FIG. 15 illustrates an example scheme of forming code patterns in the display panel 210 of FIG. 14 according to embodiments of the present disclosure. It should be noted that in FIG. 15, it is assumed that light having the second wavelength is infrared light.

In the example of FIG. 15, the upper photoactive pattern ULRP may include the absorption material AP, and the filler layer FILL may include the reflection material RFL.

Referring to FIG. 15, when infrared light, which is light having the second wavelength, is output from a pen 110 (e.g., the pen of FIG. 3A) located on or over the front surface (e.g., a surface adjacent to the cover window 650) of the display panel 210, some of the infrared light reaching the upper photoactive pattern ULRP may be absorbed by the upper photoactive pattern ULRP, and some of the infrared light reaching an upper surface of the filler layer FILL may be reflected by the filler layer FILL.

Accordingly, there may occur a shade difference in the distribution of redirected light coming from the front of the display panel 210. For example, the redirected light may not be present or be present with a very small amount in an area over the upper photoactive pattern ULRP, but the redirected light may be present normally in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

Referring to FIG. 15, when infrared light, which is light having the second wavelength, is output from the pen 110 located on or under the back surface (e.g., a surface adjacent to the substrate 211) of the display panel 210, all or most of the infrared light reaching a lower surface of the filler layer FILL may be reflected by the filler layer FILL.

Accordingly, there may not occur a shade difference in the distribution of redirected light coming from the back of the display panel 210.

Accordingly, since the pen 110 located on or under the back surface of the display device 100 cannot recognize one or more corresponding code patterns CP through a shade difference of the redirected light, a pen touch input cannot be enabled through the back surface of the display device 100.

Figure 16:
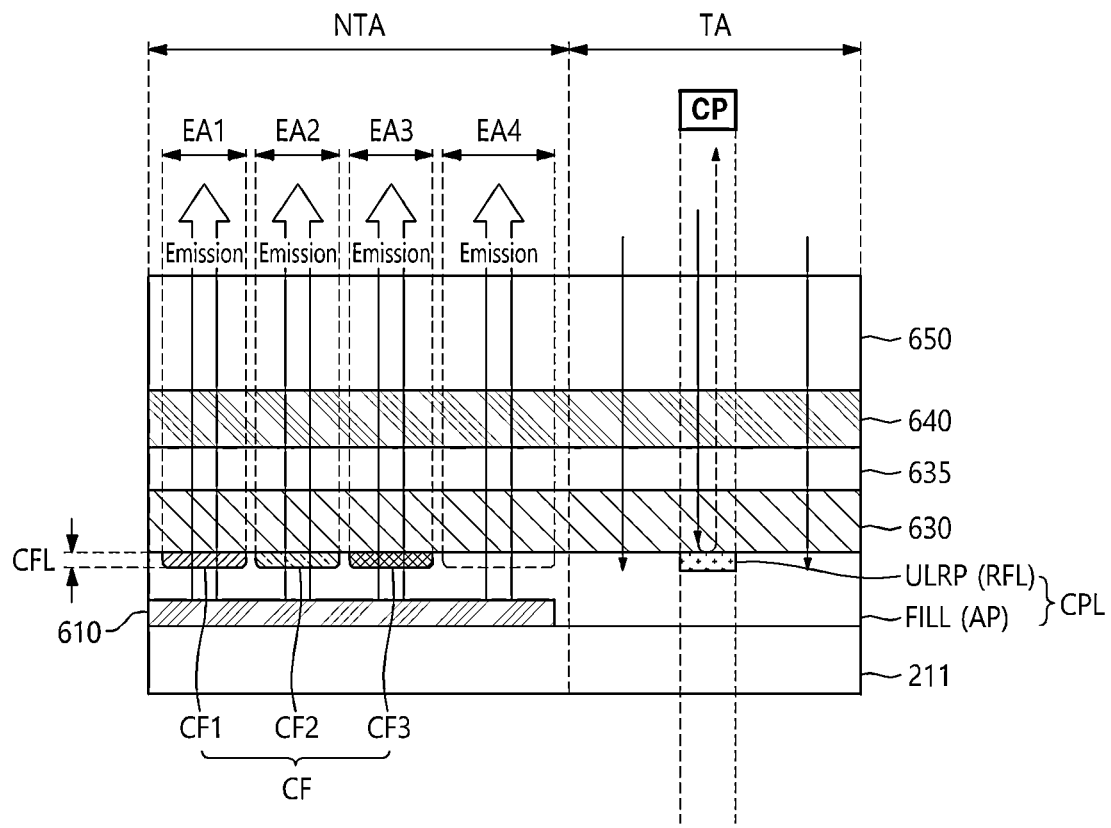

FIG. 16 illustrates an example scheme of forming code patterns in the display panel 210 of FIG. 14 according to embodiments of the present disclosure. It should be noted that in FIG. 16, it is assumed that light having the second wavelength is infrared light.

In the example of FIG. 16, the upper photoactive pattern ULRP may include the reflection material RFL, and the filler layer FILL may include the absorption material AP.

Referring to FIG. 16, when infrared light, which is light having the second wavelength, is output from a pen 110 (e.g., the pen of FIG. 3A) located on or over the front surface (e.g., a surface adjacent to the cover window 650) of the display panel 210, some of the infrared light reaching the upper photoactive pattern ULRP may be reflected by the upper photoactive pattern ULRP, and some of the infrared light reaching an upper surface of the filler layer FILL may be absorbed by the filler layer FILL.

Accordingly, there may occur a shade difference in the distribution of redirected light coming from the front of the display panel 210. For example, the redirected light may be present normally in an area over the upper photoactive pattern ULRP, but the redirected light may not be present or be present with a very small amount in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

Referring to FIG. 16, when infrared light, which is light having the second wavelength, is output from the pen 110 located on or under the back surface (e.g., a surface adjacent to the substrate 211) of the display panel 210, all or most of the infrared light reaching a lower surface of the filler layer FILL may be absorbed by the filler layer FILL.

Accordingly, there may not occur a shade difference in the distribution of redirected light coming from the back of the display panel 210.

Accordingly, since the pen 110 located on or under the back surface of the display device 100 cannot recognize one or more corresponding code patterns CP through a shade difference of the redirected light, a pen touch input cannot be enabled through the back surface of the display device 100.

Figure 17:
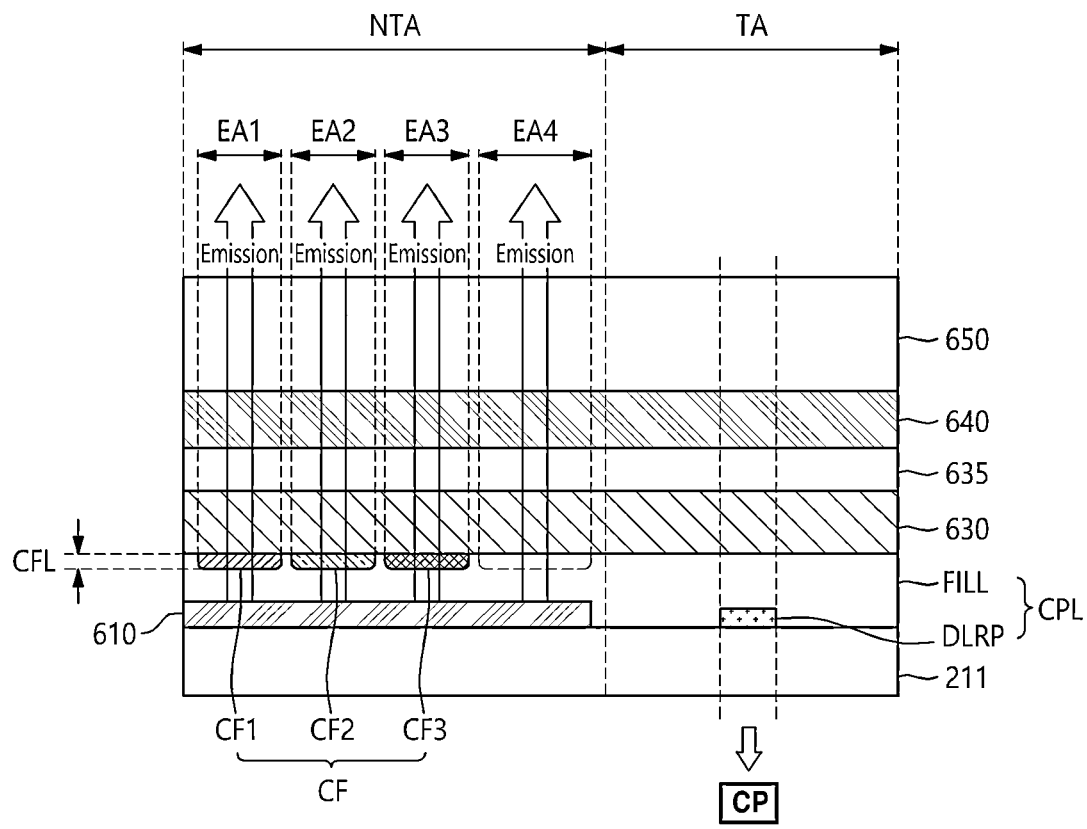
FIG. 17 is an example cross-sectional view of the display panel according to embodiments of the present disclosure.

FIG. 17 is an example cross-sectional view of the display panel 210 according to embodiments of the present disclosure.

Referring to FIG. 17, a code pattern layer CPL may include at least one photoactive pattern LRP and a filler layer FILL.

The photoactive pattern LRP may include a lower photoactive pattern DLRP located on a first substrate 211.

The filler layer FILL may be located on the lower photoactive pattern DLRP and may be configured to cover the lower photoactive pattern DLRP.

Referring to FIG. 17, the lower photoactive pattern DLRP may be disposed in a transmissive area TA, and the filler layer FILL may be disposed in both the transmissive area TA and a non-transmissive area NTA.

Referring to FIG. 17, the code pattern layer CPL includes the lower photoactive pattern DLRP located on a first substrate 211 and the filler layer FILL located on the lower photoactive pattern DLRP.

Referring to FIG. 17, the lower photoactive pattern DLRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 17, the lower photoactive pattern DLRP may cause a shade difference or wavelength difference in the distribution of redirected light. Accordingly, the lower photoactive pattern DLRP may be a code pattern CP for allowing pen touch sensing through the back surface of the display panel 210.

Referring to FIG. 17, in an example where a pen (e.g., the pen 110 of FIG. 3A) is located on or under the back surface of the display panel 210, light having the second wavelength may be incident on the first substrate 211.

Referring to FIG. 17, in an example where the pen 110 is located on or over the front surface of the display panel 210, light having the second wavelength output by the pen 110 may be incident on a cover window 650, but all or most of the light having the second wavelength may be reflected, absorbed, or radiated by the filler layer FILL.

As shown in FIG. 17, in the example where the code pattern layer CPL includes the lower photoactive pattern DLRP and the filler layer FILL, the pen 110 located on or over the front surface of the display device 100 cannot recognize one or more corresponding code patterns CP, but the pen 110 located on or under the back surface of the display device 100 can recognize the one or more code patterns CP.

Accordingly, a pen touch (i.e., an input by the pen touch) by the pen 110 can be enabled through the back surface of the display device 100.

Figure 18:
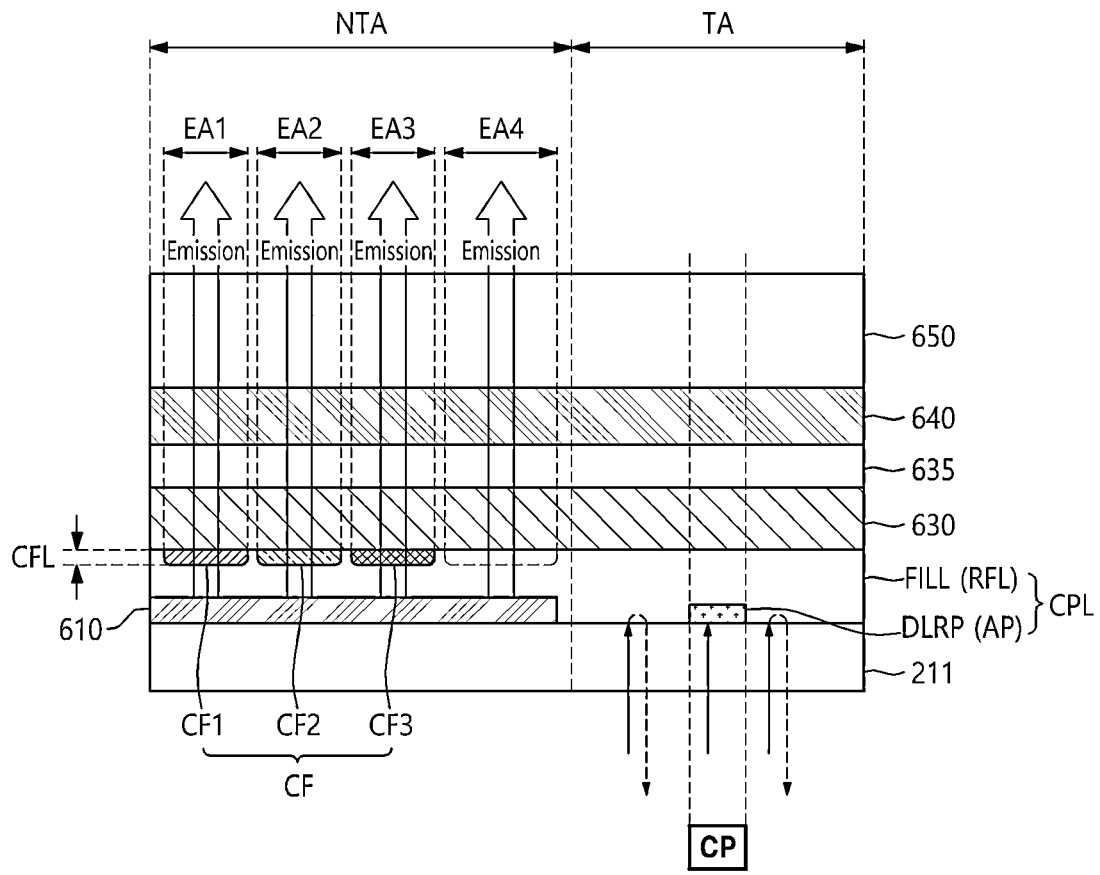
FIGS. 18 and 19 illustrate example schemes of forming code patterns in the display panel of FIG. 17 according to embodiments of the present disclosure.

FIG. 18 illustrates an example scheme of forming code patterns in the display panel 210 of FIG. 17 according to embodiments of the present disclosure. It should be noted that in FIG. 18, it is assumed that light having the second wavelength is infrared light.

In the example of FIG. 18, the lower photoactive pattern DLRP may include the absorption material AP, and the filler layer FILL may include the reflection material RFL.

Referring to FIG. 18, when infrared light, which is light having the second wavelength, is output from a pen 110 (e.g., the pen of FIG. 3A) located on or over the front surface (e.g., a surface adjacent to the cover window 650) of the display panel 210, all or most of the infrared light reaching an upper surface of the filler layer FILL may be reflected by the filler layer FILL.

Accordingly, there may not occur a shade difference in the distribution of redirected light coming from the front of the display panel 210.

Accordingly, since the pen 110 located on or over the front surface of the display device 100 cannot recognize one or more corresponding code patterns CP through a shade difference of the redirected light, a pen touch input cannot be enabled through the front surface of the display device 100.

Referring to FIG. 18, when infrared light, which is light having the second wavelength, is output from the pen 110 located on or under the back surface (e.g., a surface adjacent to the substrate 211) of the display panel 210, some of the infrared light reaching the lower photoactive pattern DLRP may be absorbed by the lower photoactive pattern DLRP, and some of the infrared light reaching a lower surface of the filler layer FILL may be reflected by the filler layer FILL.

Accordingly, there may occur a shade difference in the distribution of redirected light coming from the back of the display panel 210. For example, the redirected light may not be present or be present with a very small amount in an area under the lower photoactive pattern DLRP, but the redirected light may be present normally in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

Figure 19:
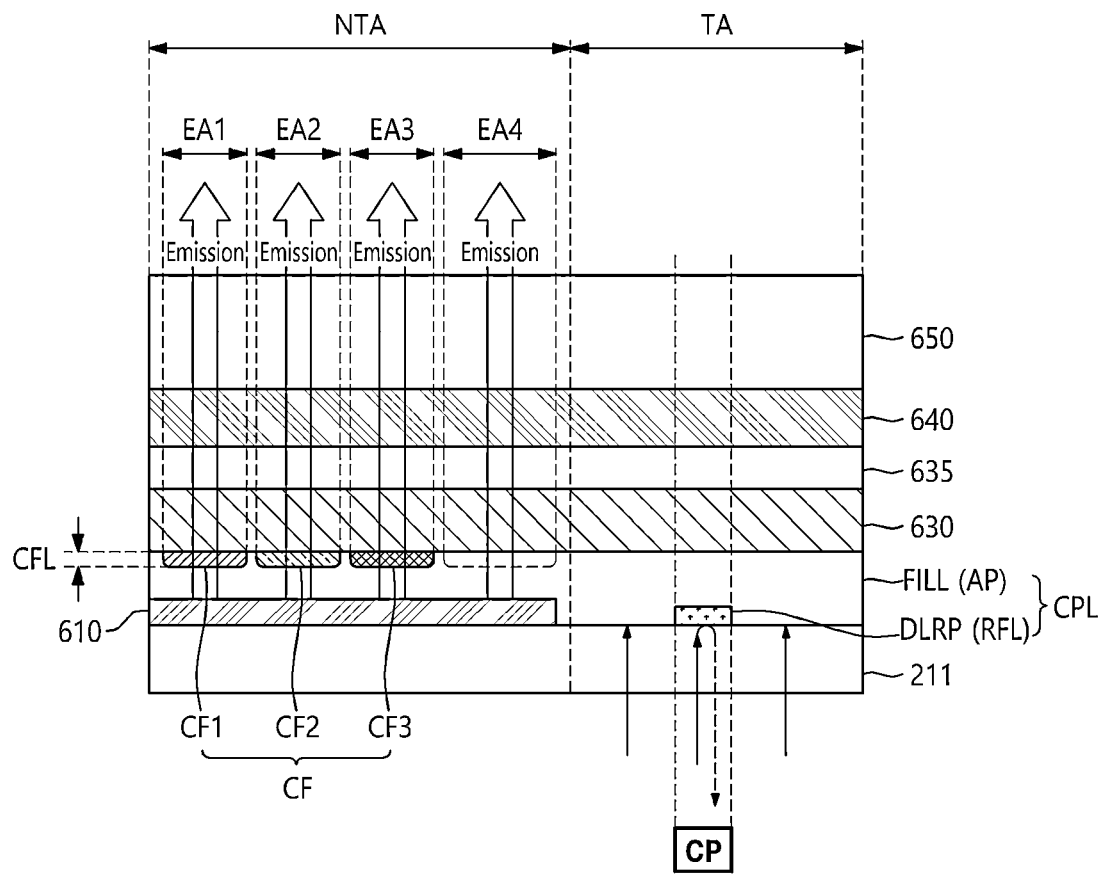

FIG. 19 illustrates an example scheme of forming code patterns in the display panel 210 of FIG. 17 according to embodiments of the present disclosure. It should be noted that in FIG. 19, it is assumed that light having the second wavelength is infrared light.

In the example of FIG. 19, the lower photoactive pattern DLRP may include the reflection material RFL, and the filler layer FILL may include the absorption material AP.

Referring to FIG. 19, when infrared light, which is light having the second wavelength, is output from a pen 110 (e.g., the pen of FIG. 3A) located on or over the front surface (e.g., a surface adjacent to the cover window 650) of the display panel 210, all or most of the infrared light reaching an upper surface of the filler layer FILL may be absorbed by the filler layer FLL.

Accordingly, there may not occur a shade difference in the distribution of redirected light coming from the front of the display panel 210.

Accordingly, since the pen 110 located on or over the front surface of the display device 100 cannot recognize one or more corresponding code patterns CP through a shade difference of the redirected light, a pen touch input cannot be enabled through the front surface of the display device 100.

Referring to FIG. 19, when infrared light, which is light having the second wavelength, is output from the pen 110 located on or under the back surface (e.g., a surface adjacent to the substrate 211) of the display panel 210, some of the infrared light reaching the lower photoactive pattern DLRP may be reflected by the lower photoactive pattern DLRP, and some of the infrared light reaching a lower surface of the filler layer FILL may be absorbed by the filler layer FILL.

Accordingly, there may occur a shade difference in the distribution of redirected light coming from the back of the display panel 210. For example, the redirected light may be present normally in an area under the lower photoactive pattern DLRP, but the redirected light may not be present or be present with a very small amount in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

Figure 20:
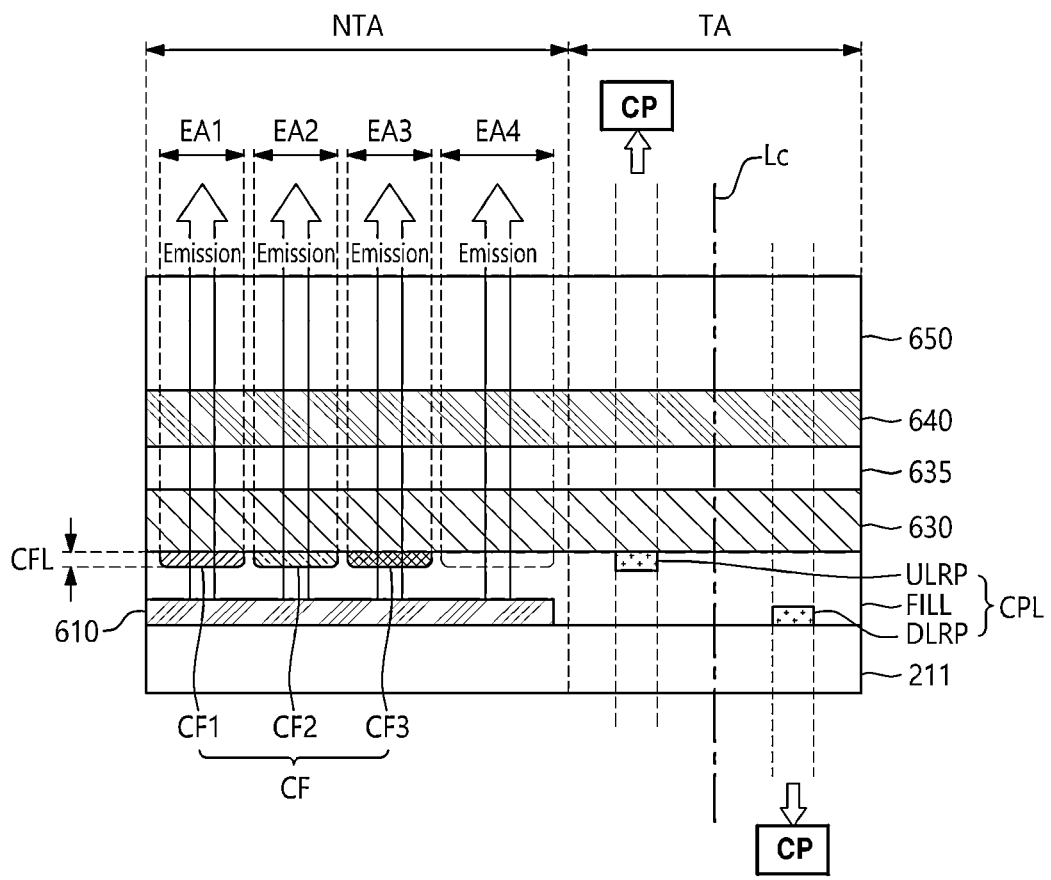
FIG. 20 is an example cross-sectional view of the display panel according to embodiments of the present disclosure.

FIG. 20 is an example cross-sectional view of the display panel 210 according to embodiments of the present disclosure.

A vertical structure in the cross-sectional view of FIG. 20 may be basically the same as the vertical structure in the cross-sectional view of FIG. 11, but there is a slight difference between configurations of respective code pattern layers CPL. Taking account of such a similarity, discussions on the example of FIG. 20 are provided below by focusing on features different from the example of FIG. 11.

Referring to FIG. 20, a code pattern layer CPL may include at least one photoactive pattern LRP and a filler layer FILL. For example, the at least one photoactive pattern LRP may include a lower photoactive pattern DLRP located on a first substrate 211 and an upper photoactive pattern ULRP located over the lower photoactive pattern DLRP. The filler layer FILL may be configured to cover the lower photoactive pattern DLRP and may be located between the lower photoactive pattern DLRP and the upper photoactive pattern ULRP.

Referring to FIG. 20, the upper photoactive pattern ULRP and the lower photoactive pattern DLRP may be disposed in a transmissive area TA, and the filler layer FILL may be disposed in both the transmissive area TA and a non-transmissive area NTA.

Referring to FIG. 20, the upper photoactive pattern ULRP and the lower photoactive pattern DLRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 20, the upper photoactive pattern ULRP and the lower photoactive pattern DLRP may cause a shade difference or a wavelength difference in redirected light distribution. Therefore, the upper photoactive pattern ULRP may be a code pattern CP for allowing pen touch sensing through the front surface of the display panel 210, and the lower photoactive pattern DLRP may be a code pattern CP for allowing pen touch sensing through the back surface of the display panel 210.

Referring to FIG. 20, the upper photoactive pattern ULRP and the lower photoactive pattern DLRP may not overlap with each other vertically. Accordingly, double-sided pen touch sensing by a pen (e.g., the pen 110 of FIG. 3A) can be performed more efficiently.

Referring to FIG. 20, in the example where the lower photoactive pattern DLRP and the upper photoactive pattern ULRP do not overlap with each other, respective locations of the lower photoactive pattern DLRP and the upper photoactive pattern ULRP may be symmetrical about a central line Lc of the transmissive area TA.

Referring to FIG. 20, in an example where the pen 110 is located on or over the front surface of the display panel 210, light having the second wavelength output from the pen 110 may be incident on a cover window 650.

Referring to FIG. 20, in an example where the pen 110 is located on or under the back surface of the display panel 210, light having the second wavelength may be incident on the first substrate 211.

As shown in FIG. 20, in the example where the code pattern layer CPL includes the lower photoactive pattern DLRP, the upper photoactive pattern ULRP, and the filler layer FILL between the lower photoactive pattern DLRP and the upper photoactive pattern ULRP, a pen 110 located on or over the front surface of the display device 100 can recognize one or more corresponding code patterns CP, and the pen 110 or another pen 110 located on or under the back surface of the display device 100 can also recognize one or more corresponding code patterns CP.

Accordingly, a pen touch (i.e., an input by the pen touch) by one or more pen 110 can be enabled through both the front and back surfaces of the display device 100.

For example, the upper photoactive pattern ULRP and the lower photoactive pattern DLRP may include the absorption material AP, and the filler layer FILL may include the reflection material RFL.

When infrared light, which is light having the second wavelength, is output from a pen (e.g., the pen 110 of FIG. 3A) located on or over the front surface (e.g., a surface adjacent to the cover window 650) of the display panel 210, some of the infrared light reaching the upper photoactive pattern ULRP may be absorbed by the upper photoactive pattern ULRP, and some of the infrared light reaching an upper surface of the filler layer FILL may be reflected by the filler layer FILL.

Accordingly, there may occur a shade difference in the distribution of redirected light coming from the front of the display panel 210. For example, the redirected light may not be present or be present with a very small amount in an area over the upper photoactive pattern ULRP, but the redirected light may be present normally in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

When infrared light, which is light having the second wavelength, is output from the pen 110 located on or under the back surface (e.g., a surface adjacent to the substrate 211) of the display panel 210, some of the infrared light reaching the lower photoactive pattern DLRP may be absorbed by the lower photoactive pattern DLRP, and some of the infrared light reaching a lower surface of the filler layer FILL may be reflected by the filler layer FILL.

Accordingly, there may occur a shade difference in the distribution of redirected light coming from the back of the display panel 210. For example, the redirected light may not be present or be present with a very small amount in an area under the lower photoactive pattern DLRP, but the redirected light may be present normally in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

In another example, the upper photoactive pattern ULRP and the lower photoactive pattern DLRP may include the reflection material RFL, and the filler layer FILL may include the absorption material AP.

When infrared light, which is light having the second wavelength, is output from a pen (e.g., the pen 110 of FIG. 3A) located on or over the front surface (e.g., a surface adjacent to the cover window 650) of the display panel 210, some of the infrared light reaching the upper photoactive pattern ULRP may be reflected by the upper photoactive pattern ULRP, and some of the infrared light reaching an upper surface of the filler layer FILL may be absorbed by the filler layer FILL.

Accordingly, there may occur a shade difference in the distribution of redirected light coming from the front of the display panel 210. For example, the redirected light may be present normally in an area over the upper photoactive pattern ULRP, but the redirected light may not be present or be present with a very small amount in the remaining area.

Accordingly, since the pen 110 located on or over the front surface of the display device 100 can recognize one or more corresponding code patterns CP through a shade difference of the redirected light, a pen touch input can be enabled through the front surface of the display device 100.

When infrared light, which is light having the second wavelength, is output from the pen 110 located on or under the back surface (e.g., a surface adjacent to the substrate 211) of the display panel 210, some of the infrared light reaching the lower photoactive pattern DLRP may be reflected by the lower photoactive pattern DLRP, and some of the infrared light reaching a lower surface of the filler layer FILL may be absorbed by the filler layer FILL.

Accordingly, there may occur a shade difference in the distribution of redirected light coming from the back of the display panel 210. For example, the redirected light may be present normally in an area under the lower photoactive pattern DLRP, but the redirected light may not be present or be present with a very small amount in the remaining area.

Accordingly, since the pen 110 located on or under the back surface of the display device 100 can recognize one or more corresponding code patterns CP through a shade difference of the redirected light, a pen touch input can be enabled through the back surface of the display device 100.

Figure 21:
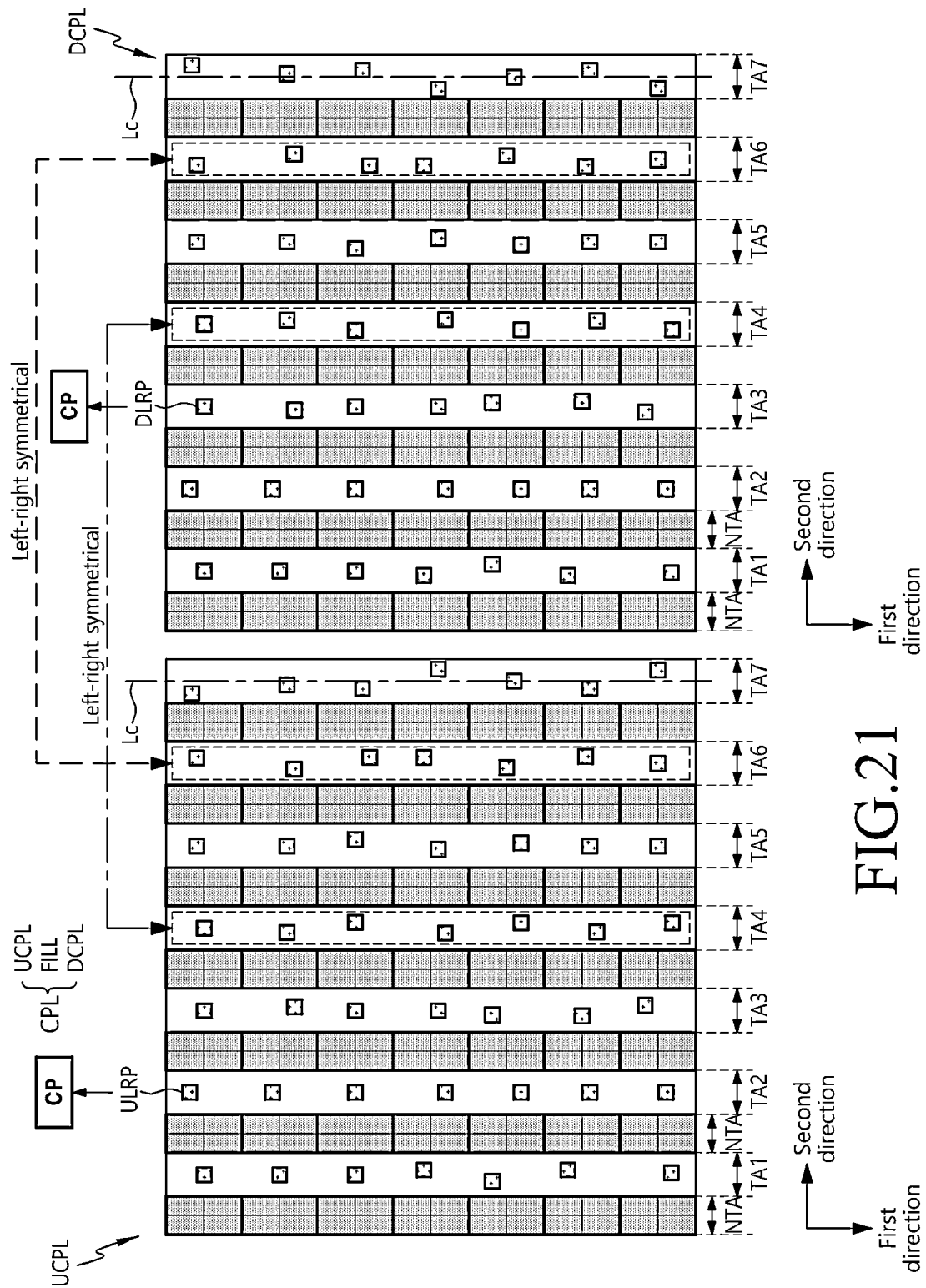
FIG. 21 is an example plan view of the display panel in which a plurality of code patterns are disposed in transmissive areas according to embodiments of the present disclosure.

FIG. 21 is an example plan view of the display panel 210 in which a plurality of code patterns CP are disposed in transmissive areas TA according to embodiments of the present disclosure.

Referring to FIG. 21, a code pattern layer CPL may include an upper code pattern layer UCPL, a filler layer FILL, and a lower code pattern layer DCPL.

Referring to FIG. 21, the upper code pattern layer UCPL may include a plurality of upper photoactive patterns ULRP. A pen (e.g., the pen 110 of FIG. 3A) located on or over the front surface of the display device 100 may recognize one or more corresponding code patterns CP through the plurality of upper photoactive patterns ULRP.

Referring to FIG. 21, the lower code pattern layer DCPL may include a plurality of lower photoactive patterns DLRP. The pen located on or over the back surface of the display device 100 may recognize one or more corresponding code patterns CP through the plurality of lower photoactive patterns DLRP.

Referring to FIG. 21, the display panel 210 may include a plurality of non-transmissive areas NTA and a plurality of transmissive areas TA. For example, the plurality of non-transmissive areas NTA and the plurality of transmissive areas TA may be configured to alternate with each other.

Referring to FIG. 21, the plurality of transmissive areas TA may include first to seventh transmissive areas (TA1 to TA7).

Referring to FIG. 21, a plurality of upper photoactive patterns ULRP and a plurality of lower photoactive patterns DLR) disposed in each of the first to seventh transmissive areas (TA1 to TA7) may not overlap with each other.

For example, in each of the first to seventh transmissive areas (TA1 to TA7), the locations of the plurality of upper photoactive patterns ULRP and the locations of the plurality of lower photoactive patterns DLRP may be left-right symmetrical about a central line Lc in a first direction (i.e., be symmetrical in a second direction) in each of the first to seventh transmissive areas (TA1 to TA7).

For example, in the fourth transmissive area TA4, the locations of a plurality of upper photoactive patterns ULRP and the locations of a plurality of lower photoactive patterns DLRP may be left-right symmetrical about a central line Lc in the first direction (i.e., be symmetrical in the second direction) in the fourth transmissive area TA4.

In another example, in the sixth transmissive area TA6, the locations of a plurality of upper photoactive patterns ULRP and the locations of a plurality of lower photoactive patterns DLRP may be left-right symmetrical about a central line Lc in the first direction (i.e., be symmetrical in the second direction) in the sixth transmissive area TA6.

Referring to FIG. 21 and FIG. 7, at least some of photoactive patterns (LRPs including ULRPs and DLRPs) shown in FIG. 21 may correspond to code patterns CP_CELL disposed in two or more data cell areas D-CELL, correspond to code patterns CP_CELL disposed in one data cell area D-CELL, or correspond to code patterns CP_CELL disposed in a portion of one data cell area D-CELL.

In addition, some of photoactive patterns (LRPs including ULRPs and DLRPs) shown in FIG. 21 may correspond to code patterns (CP_CGL1, CP_CGL2) corresponding to first and second cell guide lines (CGL1, CGL2) around a data cell area D-CELL.

Figure 22:
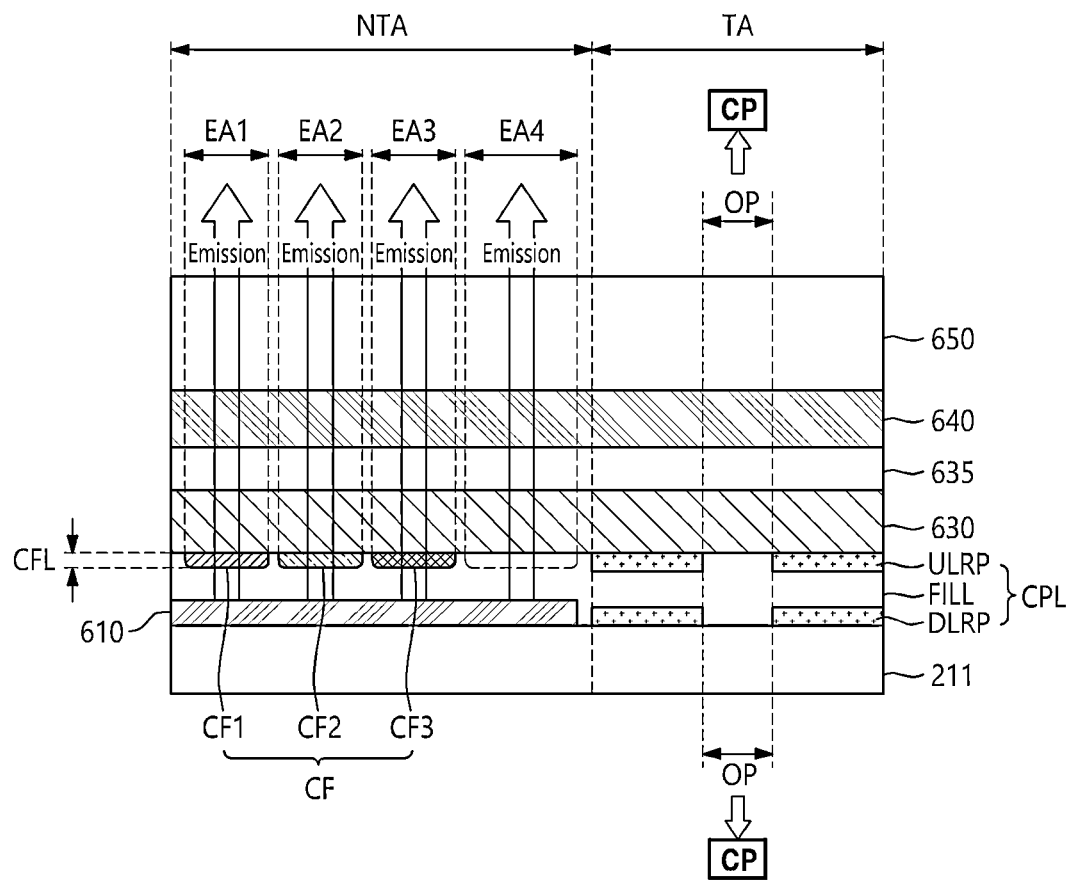
FIGS. 22, 23, and 24 are example cross-sectional views of the display panel according to embodiments of the present disclosure.

FIG. 22 is an example cross-sectional view of the display panel 210 according to embodiments of the present disclosure.

Referring to FIG. 22, a code pattern layer CPL may include at least one photoactive pattern LRP and a filler layer FILL. For example, the at least one photoactive pattern LRP may include a lower photoactive pattern DLRP located on a first substrate 211 and an upper photoactive pattern ULRP located over the lower photoactive pattern DLRP. The filler layer FILL may be configured to cover the lower photoactive pattern DLRP and may be located between the lower photoactive pattern DLRP and the upper photoactive pattern ULRP.

Referring to FIG. 22, the upper photoactive pattern ULRP and the lower photoactive pattern DLRP may be disposed in a transmissive area TA, and the filler layer FILL may be disposed in both the transmissive area TA and a non-transmissive area NTA.

Referring to FIG. 22, one upper photoactive pattern ULRP may be disposed in each transmissive area TA. Further, one lower photoactive pattern DLRP may be disposed in each transmissive area TA.

Referring to FIG. 22, the code pattern layer CPL may include the lower photoactive pattern DLRP located on a first substrate 211, the upper photoactive pattern ULRP located over the lower photoactive pattern DLRP, and the filler layer FILL located between the lower photoactive pattern DLRP and the upper photoactive pattern ULRP.

Referring to FIG. 22, the upper photoactive pattern ULRP and the lower photoactive pattern DLRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 22, for example, the upper photoactive pattern ULRP and the lower photoactive pattern DLRP may overlap with each other vertically. In another example, the upper photoactive pattern ULRP and the lower photoactive pattern DLRP may not overlap with each other vertically.

Referring to FIG. 22, each of the upper photoactive pattern ULRP and the lower photoactive pattern DLRP may include a corresponding opening OP. For example, the opening OP of the upper photoactive pattern ULRP and the opening OP of the lower photoactive pattern DLRP may overlap with each other vertically. In another example, the opening OP of the upper photoactive pattern ULRP and the opening OP of the lower photoactive pattern DLRP may not overlap with each other vertically. Accordingly, double-sided pen touch sensing by a pen (e.g., the pen 110 of FIG. 3A) can be performed more efficiently. Thought not shown in the figure, in the example where the opening OP of the upper photoactive pattern ULRP and the opening OP of the lower photoactive pattern DLRP do not overlap with each other, respective locations of the openings of the lower photoactive pattern DLRP and the upper photoactive pattern ULRP may be symmetrical about a central line of the transmissive area TA.

Referring to FIG. 22, a shade difference or a wavelength difference in redirected light distribution may occur due to the openings OP of the upper photoactive pattern ULRP and the lower photoactive pattern DLRP. Therefore, the openings OP of the upper photoactive pattern ULRP may be a code pattern CP for allowing pen touch sensing through the front surface of the display panel 210, and the openings OP of the lower photoactive pattern DLRP may be a code pattern CP for allowing pen touch sensing through the back surface of the display panel 210.

Referring to FIG. 22, in an example where a pen (e.g., the pen 110 of FIG. 3A) is located on or over the front surface of the display panel 210, light having the second wavelength output from the pen 110 may be incident on a cover window 650.

Referring to FIG. 22, in an example where the pen 110 is located on or under the back surface of the display panel 210, light having the second wavelength may be incident on the first substrate 211.

As shown in FIG. 22, in the example where the code pattern layer CPL includes the lower photoactive pattern DLRP, the upper photoactive pattern ULRP, and the filler layer FILL between the lower photoactive pattern DLRP and the upper photoactive pattern ULRP, a pen 110 located on or over the front surface of the display device 100 can recognize one or more corresponding code patterns CP, and the pen 110 or another pen 110 located on or under the back surface of the display device 100 can also recognize one or more corresponding code patterns.

Accordingly, a pen touch (i.e., an input by the pen touch) by one or more pen 110 can be enabled through both the front and back surfaces of the display device 100.

Figure 23:
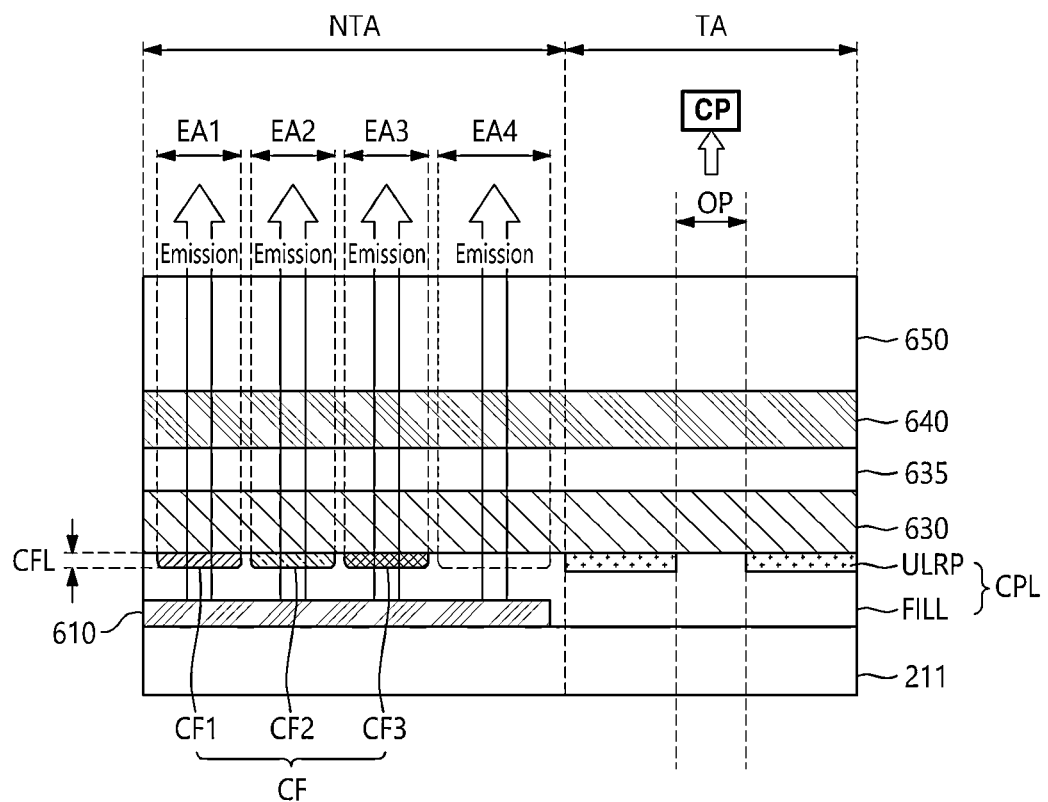

FIG. 23 is an example cross-sectional view of the display panel 210 according to embodiments of the present disclosure. The cross-sectional structure of FIG. 20 may be basically the same as the cross-sectional structure of FIG. 22. Taking account of such a similarity, discussions on the example of FIG. 23 are provided below by focusing on features different from the example of FIG. 22.

Referring to FIG. 23, a code pattern layer CPL may include a filler layer FILL located on a first substrate 211, and an upper photoactive pattern ULRP located on the filler layer FILL.

Referring to FIG. 23, the upper photoactive pattern ULRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 23, the upper photoactive pattern ULRP may have an opening OP. Referring to FIG. 23, a shade difference or a wavelength difference in the distribution of redirected light may occur due to the opening OP of the upper photoactive pattern ULRP. Accordingly, the opening OP of the upper photoactive pattern ULRP may be a code pattern CP for allowing pen touch sensing through the front surface of the display panel 210.

Referring to FIG. 23, in an example where a pen (e.g., the pen 110 of FIG. 3A) is located on or over the front surface of the display panel 210, light having the second wavelength output from the pen 110 may be incident on a cover window 650.

Referring to FIG. 23, in an example where the pen 110 is located on or under the back surface of the display panel 210, light having the second wavelength may be incident on the first substrate 211, but all or most of the light having the second wavelength incident on the first substrate 211 may be absorbed, reflected, or radiated by the filler layer FILL.

As shown in FIG. 23, in the example where the code pattern layer CPL includes the upper photoactive pattern ULRP and the filler layer FILL, the pen 110 located on or over the front surface of the display device 100 can recognize one or more corresponding code patterns CP, but the pen 110 located on or under the back surface of the display device 100 cannot recognize the one or more code patterns CP.

Accordingly, a pen touch (i.e., an input by the pen touch) by one or more pen 110 can be enabled through the front surface of the display device 100.

Figure 24:
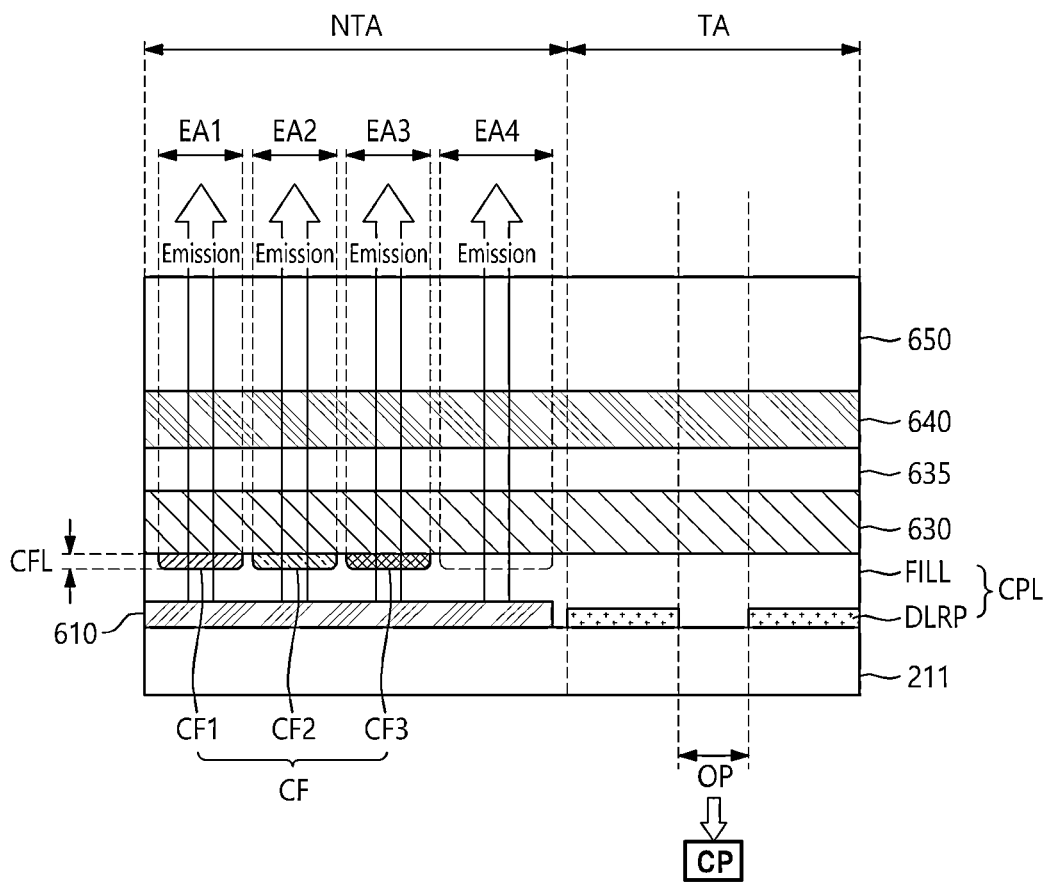

FIG. 24 is an example cross-sectional view of the display panel 210 according to embodiments of the present disclosure.

Referring to FIG. 24, a code pattern layer CPL may include a lower photoactive pattern DLRP located on a first substrate 211 and a filler layer FILL located on the lower photoactive pattern DLRP.

Referring to FIG. 24, the lower photoactive pattern DLRP may include a first photoactive material, and the filler layer FILL may include a second photoactive material performing a photoactivation different from the first photoactive material.

The first photoactive material may be any one of an absorption material capable of absorbing light having the second wavelength, a reflection material capable of reflecting light having the second wavelength, and a radiation material capable of converting light having the second wavelength into light having one or more other wavelengths different from the second wavelength and radiating the light having the one or more other wavelengths. The second photoactive material may be any one material different from the first photoactive material among the absorption material, the reflection material, and the radiation material.

For example, the first photoactive material may be the absorption material, and the second photoactive material may be the reflection material. For example, the first photoactive material may be the absorption material, and the second photoactive material may be the radiation material. For example, the first photoactive material may be the reflection material, and the second photoactive material may be the absorption material. For example, the first photoactive material may be the reflection material, and the second photoactive material may be the radiation material. For example, the first photoactive material may be the radiation material, and the second photoactive material may be the absorption material. For example, the first photoactive material may be the radiation material, and the second photoactive material may be the reflection material.

Referring to FIG. 24, the lower photoactive pattern DLRP may include a corresponding opening OP.

Referring to FIG. 24, a shade difference or a wavelength difference in redirected light distribution may occur due to the openings OP of the lower photoactive pattern DLRP. Therefore, the openings OP of the lower photoactive pattern DLRP may be a code pattern CP for allowing pen touch sensing through the back surface of the display panel 210.

Referring to FIG. 24, in an example where the pen 110 is located on or under the back surface of the display panel 210, light having the second wavelength output from the pen 110 may be incident on the first substrate 211.

As shown in FIG. 24, in the example where the code pattern layer CPL includes the lower photoactive pattern DLRP and the filler layer FILL on the lower photoactive pattern DLRP, a pen 110 located on or under the back surface of the display device 100 can also recognize one or more corresponding code patterns.

Accordingly, a pen touch (i.e., an input by the pen touch) by one or more pen 110 can be enabled through back surfaces of the display device 100.

Figure 25:
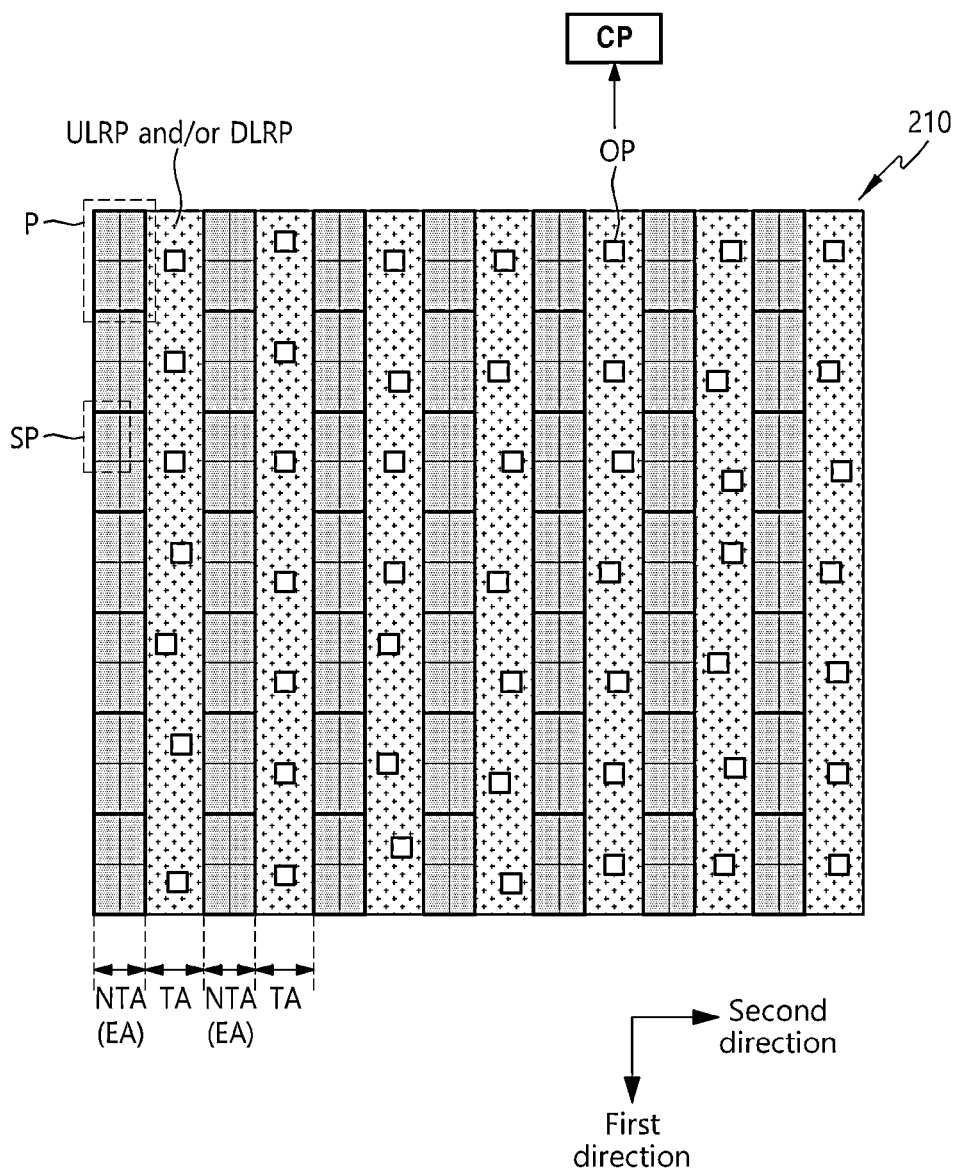
FIG. 25 is an example plan view of the display panel in which a plurality of code patterns are disposed in transmissive areas according to embodiments of the present disclosure.

FIG. 25 is an example plan view of the display panel 210 in which a plurality of code patterns CP are disposed in transmissive areas TA according to embodiments of the present disclosure.

Referring to FIG. 25, the display panel 210 includes a plurality of transmissive areas TA and a plurality of non-transmissive areas NTA. In one or more embodiments, pixels P may be disposed in the plurality of non-transmissive areas NTA, and upper photoactive patterns ULRP or lower photoactive patterns DLRP may be disposed in each of the plurality of transmissive areas TA.

Referring to FIG. 25, one upper photoactive pattern ULRP or one lower photoactive pattern DLRP disposed in each of the plurality of transmissive areas TA may include a plurality of openings OP serving as a plurality of code patterns CP.

Figure 26:
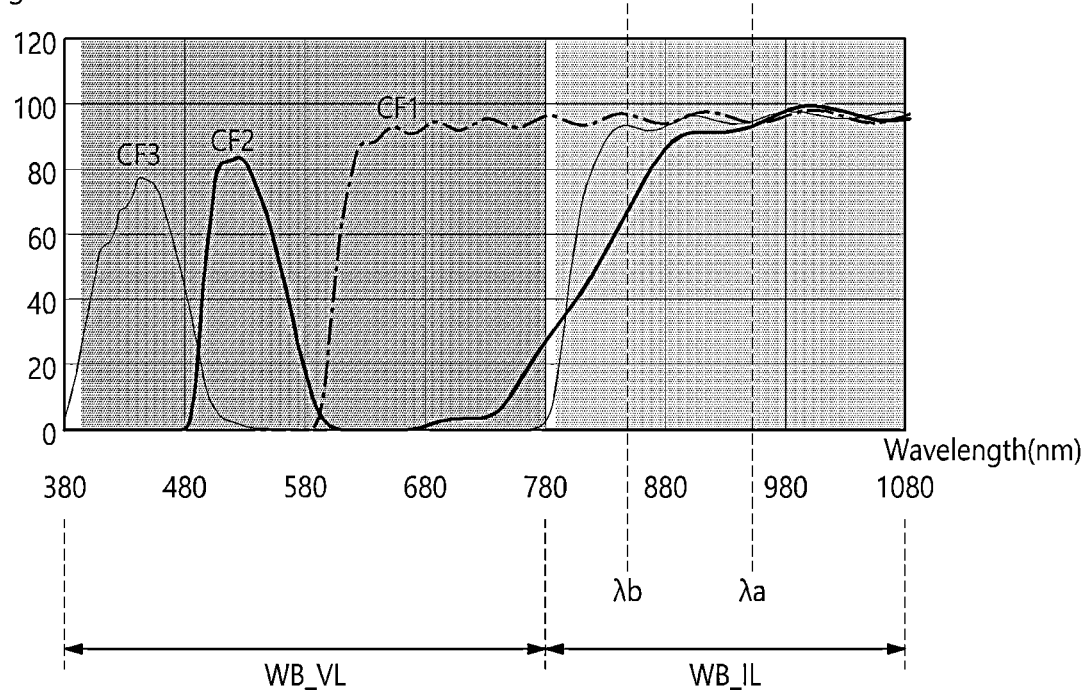
FIG. 26 illustrates example light transmission spectra of color filters disposed in the display panel according to embodiments of the present disclosure.

FIG. 26 illustrates example light transmission spectra of color filters (CF1, CF2, and CF3) disposed in the display panel 210 according to embodiments of the present disclosure.

Referring to FIG. 26, in one or more example embodiments, a color filter layer CFL of the display panel 210 may include a first color filter CF1 capable of transmitting first color light, a second color filter CF2 capable of transmitting second color light, and a third color filter CF3 capable of transmitting third color light.

The transmission spectrum of FIG. 26 shows respective light transmittance of the first color filter CF1, the second color filter CF2, and the third color filter CF3, in the visible light wavelength band WB_VL of approximately 380 nm to 780 nm and the infrared wavelength band WB_IL of approximately 780 nm to 1080 nm. Here, the visible light wavelength band may be the first wavelength band, and the infrared wavelength band may be the second wavelength band.

Referring to FIG. 26, the first color filter CF1 may transmit red light in the visible light wavelength band WB_VL, the second color filter CF2 may transmit green light in the visible light wavelength band WB_VL, and the third color filter CF3 may transmit blue light in the visible light wavelength band WB_VL.

Referring to FIG. 26, the first color filter CF1 can transmit, with a high transmittance, infrared light included in the infrared wavelength band WB_IL of approximately 780 nm to 1080 nm.

The second color filter CF2 may have a high transmittance for infrared light having wavelengths greater than or equal to a first specific wavelength $\lambda a$ in the infrared wavelength band WB_IL of approximately 780 nm to 1080 nm, and may have a low transmittance for infrared light having wavelengths in the wavelength band of 780 nm to the first specific wavelength $\lambda a$.

The third color filter CF3 may have a high transmittance for infrared light having wavelengths greater than or equal to a second specific wavelength $\lambda b$ in the infrared wavelength band WB_IL of approximately 780 nm to 1080 nm, and may have a low transmittance for infrared light having wavelengths in the wavelength band of 780 nm to the second specific wavelength $\lambda b$. Here, the second specific wavelength $\lambda b$ may be shorter than the first specific wavelength $\lambda a$.

The first to third color filters (CF1, CF2, and CF3) can fully transmit light having the second wavelength output from the pen 110. Therefore, the second wavelength of light output from the pen 110 may be set to a value equal to or greater than the first specific wavelength $\lambda a$ in which all of the first to third color filters (CF1, CF2, and CF3) have a high transmittance. For example, the second wavelength may be 940 nm or more.

Thus, this setting for the wavelength of light output from the pen 110 can enable pen touch sensing to be improved.

Figure 27:
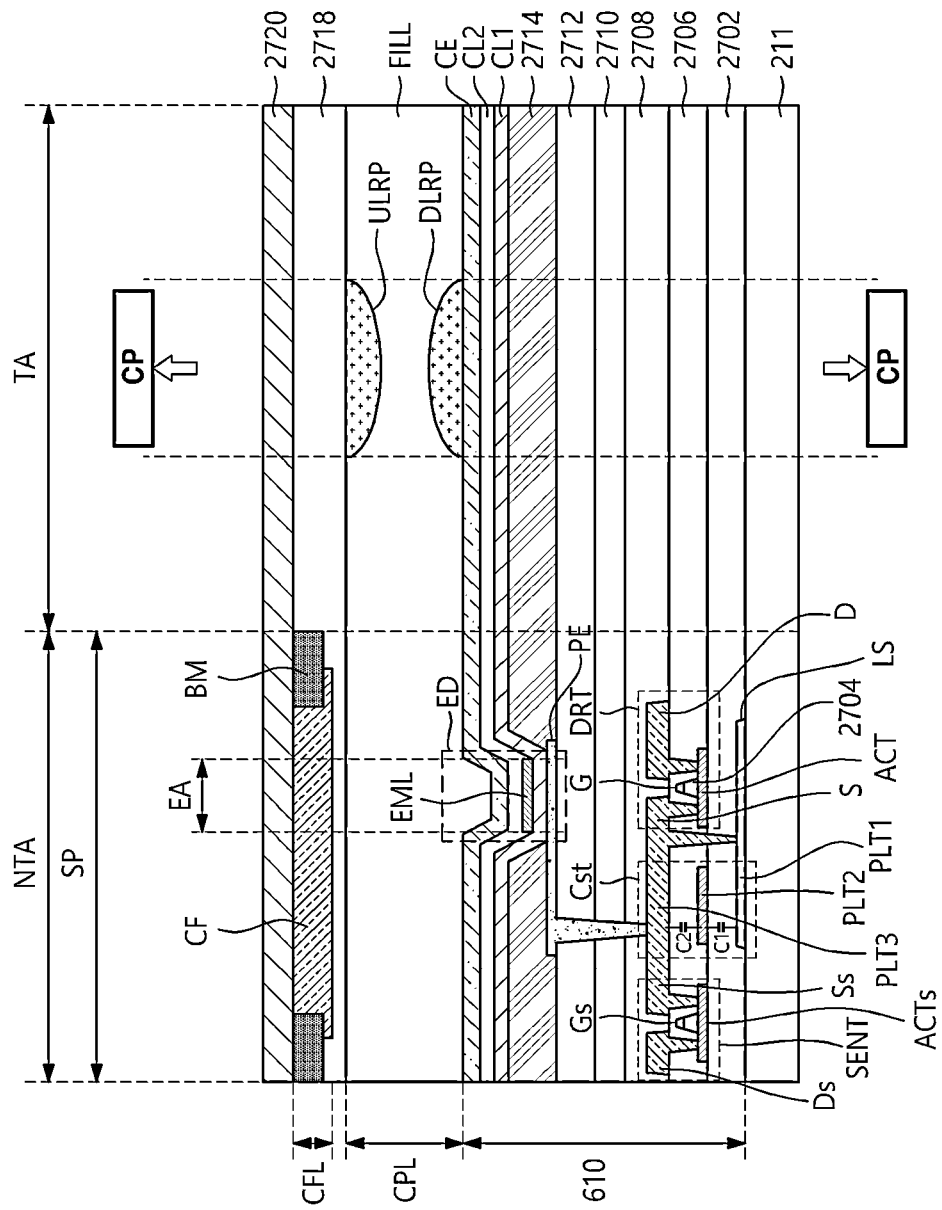
FIGS. 27, 28, 29, and 30 are more detailed example cross-sectional views for the configurations of the display panel shown in FIGS. 11, 14, 17, and 20 according to embodiments of the present disclosure.

FIG. 27 is an example detailed cross-sectional view of the display panel 210 of FIG. 11 according to one embodiment.

Referring to FIG. 27, a subpixel SP may be disposed in the non-transmissive area NTA, and the transmissive area TA may be disposed on a side of the non-transmissive area NTA.

Referring to FIG. 27, in one embodiment, the subpixel SP may have the structure of FIG. 4. According to this aspect, the subpixel SP may include a light emitting element ED, a driving transistor DRT, a sensing transistor SENT, a storage capacitor Cst, and a scan transistor SCT (not shown in FIG. 27).

Referring to FIG. 27, a light shield LS may be disposed on the first substrate 211. The light shield LS may be disposed under the driving transistor DRT and can prevent the channel of the driving transistor DRT from being exposed to light.

Referring to FIG. 27, a portion of the light shield LS may serve as a first capacitor electrode PLT1 of the storage capacitor Cst.

Referring to FIG. 27, a buffer layer 2702 may be disposed on the light shield LS. The active layer ACT of the driving transistor DRT and the active layer ACTs of the sensing transistor SENT may be disposed on the buffer layer 2702.

A second capacitor electrode PLT2 of the storage capacitor Cst may also be disposed on the buffer layer 2702. The second capacitor electrode PLT2 of the storage capacitor Cst may include the same semiconductor material as the active layers ACT1 and ACTs. For example, the semiconductor material may be an oxide semiconductor material or a silicon-based semiconductor material. For example, the second capacitor electrode PLT2 of the storage capacitor Cst may be an electrode including a conductivity-enabled semiconductor material. For example, the semiconductor material can be changed into a conductivity-enabled material through an ion implantation process (which may also referred to as a doping process).

Referring to FIG. 27, a gate insulating layer 2704 may be disposed on the active layer ACT of the driving transistor DRT and the active layer ACTs of the sensing transistor SENT.

Referring to FIG. 27, the gate electrode G of the driving transistor DRT and the gate electrode Gs of the sensing transistor SENT may be disposed on the gate insulating layer 2704.

Referring to FIG. 27, an interlayer insulating film 2706 may be disposed on the gate electrode G of the driving transistor DRT and the gate electrode Gs of the sensing transistor SENT.

Referring to FIG. 27, the source and drain electrodes (S and D) of the driving transistor DRT and the source and drain electrodes (Ss and Ds) of the sensing transistor SENT may be disposed on the interlayer insulating layer 2706.

The source electrode S and the drain electrode D of the driving transistor DRT may be connected to the active layer ACT of the driving transistor DRT through contact holes of the interlayer insulating layer 2706. The source electrode Ss and drain electrode Ds of the sensing transistor SENT may be connected to the active layer ACTs of the sensing transistor SENT through contact holes of the interlayer insulating layer 2706.

The source electrode S of the driving transistor DRT and the source electrode Ss of the sensing transistor SENT may be electrically connected to each other or integrally formed as one piece.

In one or more embodiments, the source electrode S of the driving transistor DRT and the source electrode Ss of the sensing transistor SENT may be electrically connected to a third capacitor electrode PLT3 of the storage capacitor Cst. In one or more aspects, the source electrode S of the driving transistor DRT, the source electrode Ss of the sensing transistor SENT, and the third capacitor electrode PLT3 of the storage capacitor Cst may be integrally formed as one piece.

The storage capacitor Cst may include the first capacitor electrode PLT1, the second capacitor electrode PLT2, and the third capacitor electrode PLT3.

In the storage capacitor Cst, the first capacitor electrode PLT1 and the third capacitor electrode PLT3 may be electrically connected to the source electrode S of the driving transistor DRT, and the second capacitor electrode PLT2 may be electrically connected to the gate electrode G of the driving transistor DRT.

Accordingly, the storage capacitor Cst formed between the source electrode S and the gate electrode G of the driving transistor DRT may have a structure in which a first capacitor C1 between the first capacitor electrode PLT1 and the second capacitor electrode PLT2 and a second capacitor C2 between the second capacitor electrode PLT2 and the third capacitor electrode PLT3 are connected in parallel to each other.

Referring to FIG. 27, a first protective layer 2708 may be disposed on the source and drain electrodes (S and D) of the driving transistor DRT and the source and drain electrodes (Ss and Ds) of the sensing transistor SENT, and a second protective layer 2710 may be disposed on the first protective layer 2708. A planarization layer 2712 may be disposed on the second protective layer 2710.

Referring to FIG. 27, a pixel electrode PE of the light emitting element ED may be disposed on the planarization layer 2712.

The pixel electrode PE of the light emitting element ED may be electrically connected to the source electrode S of the driving transistor DRT through contact holes of the planarization layer 2712, the second protective layer 2710, and the first protective layer 2708.

Referring to FIG. 27, a bank 2714 may be disposed on the pixel electrode PE of the light emitting element ED, and the bank 2714 may include an opening exposing a portion of the pixel electrode PE.

Referring to FIG. 27, the bank 2714 may be disposed not only in the non-transmissive area NTA but also in the transmissive area TA. An element intermediate layer EL and a common electrode CE may be disposed on the bank 2714.

The element intermediate layer EL may include a first common layer CL1, an emission layer EML, and a second common layer CL2.

The first common layer CL1 may be disposed on the bank 2714. In one aspect, a portion of the first common layer CL1 may be disposed on a portion of the pixel electrode PE in the opening of the bank 2714. For example, the first common layer CL1 may be disposed on the bank 2714, and may also be disposed on the portion of the pixel electrode PE exposed through the opening of the bank 2714.

The emission layer EML may be disposed on the first common layer CL1, and be disposed in an area where the light emitting element ED is configured. The emission layer EML may be disposed on the first common layer CL1, overlap with the opening of the bank 2714, and overlap with the pixel electrode PE.

The second common layer CL2 may be disposed on the emission layer EML. The second common layer CL2 may extend to an area where the emission layer EML is not present, and be disposed on the first common layer CL1.

The emission layer EML may be disposed only in an area where the light emitting element ED is configured in the corresponding subpixel SP. The first common layer CL1, the second common layer CL2, and the common electrode CE may be disposed not only in the non-transmissive area NTA but also in the transmissive area TA.

Referring to FIG. 27, the light emitting element ED may be formed by a stackup configuration where the pixel electrode PE, the first common layer CL1, the emission layer EML, the second common layer CL2, and the common electrode CE overlap with each other.

Referring to FIG. 27, a stackup configuration where transistors (DRT and SENT), at least one capacitor Cst1, and at least one light emitting element ED are stacked may correspond to a pixel array layer 610. Many metals serving as respective electrodes of the transistors (DRT and SENT), the at least one capacitor Cst1, and the at least one light emitting element ED may be disposed in the pixel array layer 610.

Referring to FIG. 27, a filler layer FILL may be disposed on the common electrode CE, and an overcoat layer 2718 may be disposed on the filler layer FILL.

A color filter layer CFL may be disposed on the overcoat layer 2718.

The color filter layer CFL may include at least one color filter CF. The color filter layer CFL may further include a black matrix BM disposed on at least one side of the at least one color filter CF.

The color filter CF may overlap with the light emitting element ED. The color filter CF may overlap with a light emitting area EA formed by the light emitting element ED.

Referring to FIG. 27, a second substrate 2720 may be disposed on the color filter layer CFL. In one aspect, the second substrate 2720 may be an encapsulation layer 630, and may also be referred to as an encapsulation substrate.

Referring to FIG. 27, a code pattern layer CPL may be configured between the common electrode CE and the overcoat layer 2718.

Referring to FIG. 27, the code pattern layer CPL may include at least one photoactive pattern LRP and a filler layer FILL. The photoactive pattern LRP may include a lower photoactive pattern DLRP and an upper photoactive pattern ULRP.

The lower photoactive pattern DLRP may be located on the common electrode CE.

The filler layer FILL may be configured to cover the lower photoactive pattern DLRP and may be located between the lower photoactive pattern DLRP and the upper photoactive pattern ULRP.

The upper photoactive pattern ULRP may be located on the filler layer FILL.

Referring to FIG. 27, the upper photoactive pattern ULRP and the lower photoactive pattern DLRP may be disposed in a transmissive area TA, and the filler layer FILL may be disposed in both the transmissive area TA and a non-transmissive area NTA.

Referring to FIG. 27, at least a portion of the upper photoactive pattern ULRP may overlap with at least a portion of the lower photoactive pattern DLRP.

The photoactive pattern LRP including the lower photoactive pattern DLRP and the upper photoactive pattern ULRP may not overlap with the light emitting area EA. The photoactive pattern LRP including the lower photoactive pattern DLRP and the upper photoactive pattern ULRP may not overlap with the color filter CF. Referring to FIG. 27, in the example where the display panel 210 has the top emission structure, among a first electrode (e.g., the pixel electrode PE) and a second electrode (e.g., the common electrode CE) included in the light emitting element ED, the first electrode (the pixel electrode PE1) close to the first substrate 211 may be a reflective electrode, and the second electrode (the common electrode CE) farther away from the first substrate 211 may be a transparent electrode.

Referring to FIG. 27, in the display panel 210 having the top emission structure, the photoactive pattern LRP configured to form a code pattern may be disposed in the transmissive area TA. The photoactive pattern LRP may include a photoactive material having properties of responding to light having the second wavelength and also transmitting visible light (light having the first wavelength). Accordingly, optical pen touch sensing can be enabled through the transmissive area TA while not reducing the transmittance of the transmissive area TA.

As shown in FIG. 27, in the example where the photoactive pattern LRP includes both the lower photoactive pattern DLRP and the upper photoactive pattern ULRP, a pen touch input can be enabled through both the front and back surfaces of the display device 100.

Figure 28:
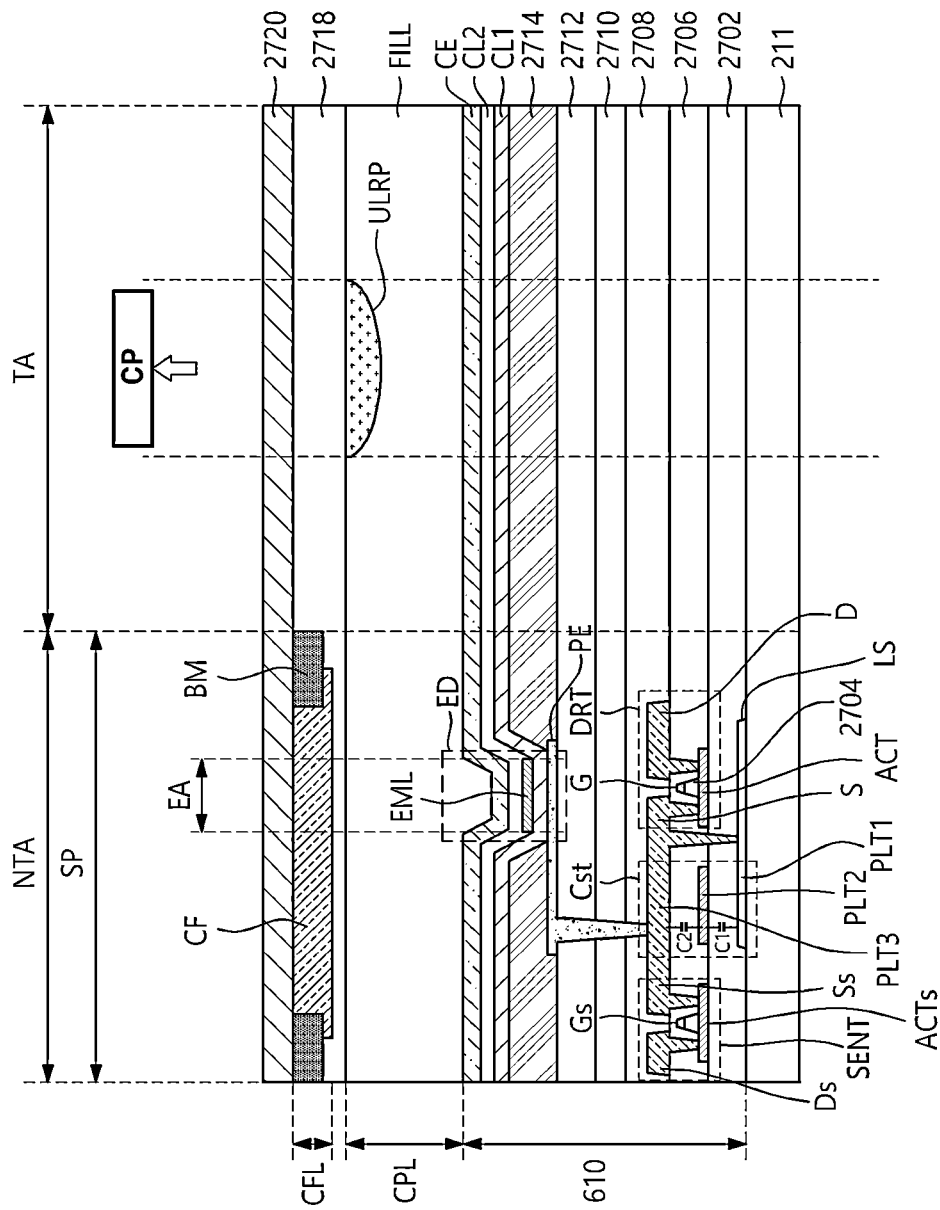

FIG. 28 is an example detailed cross-sectional view of the display panel 210 of FIG. 14 according to one embodiment. It should be noted that a vertical structure in the cross-sectional view of FIG. 28 is basically the same as the vertical structure in the cross-sectional view of FIG. 27. Taking account of such a similarity, discussions on the example of FIG. 28 are provided below by focusing on features different from the example of FIG. 27.

Referring to FIG. 28, a code pattern layer CPL may be configured between a common electrode CE and an overcoat layer 2718.

Referring to FIG. 28, the code pattern layer CPL may include at least one photoactive pattern LRP and a filler layer FILL. The photoactive pattern LRP may include an upper photoactive pattern ULRP.

The filler layer FILL may be located on the common electrode CE.

The upper photoactive pattern ULRP may be located on the filler layer FILL.

Referring to FIG. 28, the upper photoactive pattern ULRP may be disposed in a transmissive area TA. The filler layer FILL may be disposed in both the transmissive area TA and a non-transmissive area NTA.

As shown in FIG. 28, in the example where the photoactive pattern LRP includes the upper photoactive pattern ULRP, a pen touch input can be enabled through the front surface of the display device 100.

Figure 29:
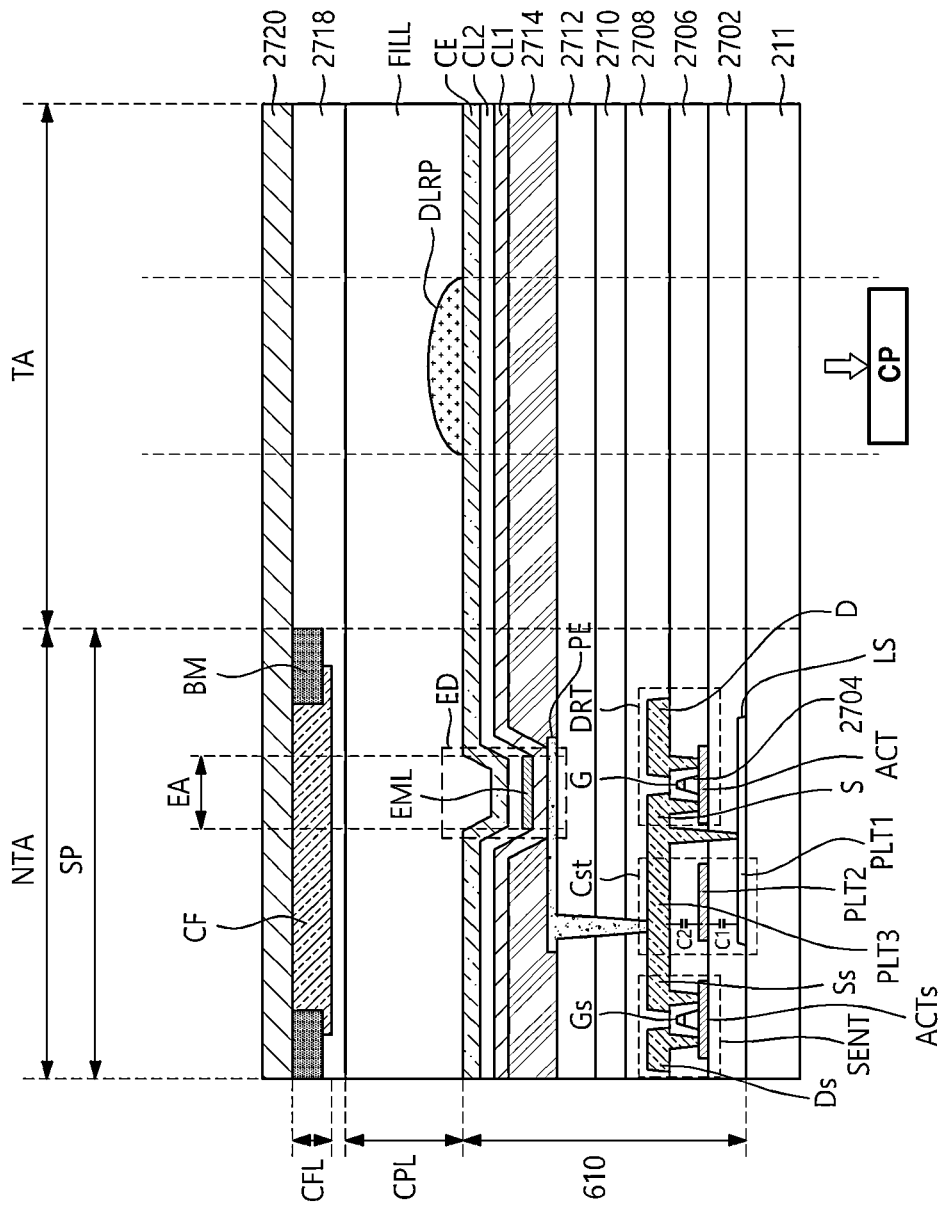

FIG. 29 is an example detailed cross-sectional view of the display panel 210 of FIG. 17 according to one embodiment. It should be noted that a vertical structure in the cross-sectional view of FIG. 29 is basically the same as the vertical structure in the cross-sectional view of FIG. 27. Taking account of such a similarity, discussions on the example of FIG. 29 are provided below by focusing on features different from the example of FIG. 27.

Referring to FIG. 29, a code pattern layer CPL may be configured between a common electrode CE and an overcoat layer 2718.

Referring to FIG. 29, the code pattern layer CPL may include at least one photoactive pattern LRP and a filler layer FILL. The photoactive pattern LRP may include a lower photoactive pattern DLRP.

The lower photoactive pattern DLRP may be located on the common electrode CE.

The filler layer FILL may be located between the common electrode CE and the overcoat layer 2718, and may be configured to cover the lower photoactive pattern DLRP.

Referring to FIG. 29, the lower photoactive pattern DLRP may be disposed in a transmissive area TA. The filler layer FILL may be disposed in the both transmissive area TA and a non-transmissive area NTA.

As shown in FIG. 29, in the example where the photoactive pattern LRP includes the lower photoactive pattern DLRP, a pen touch input can be enabled through the back surface of the display device 100.

Figure 30:
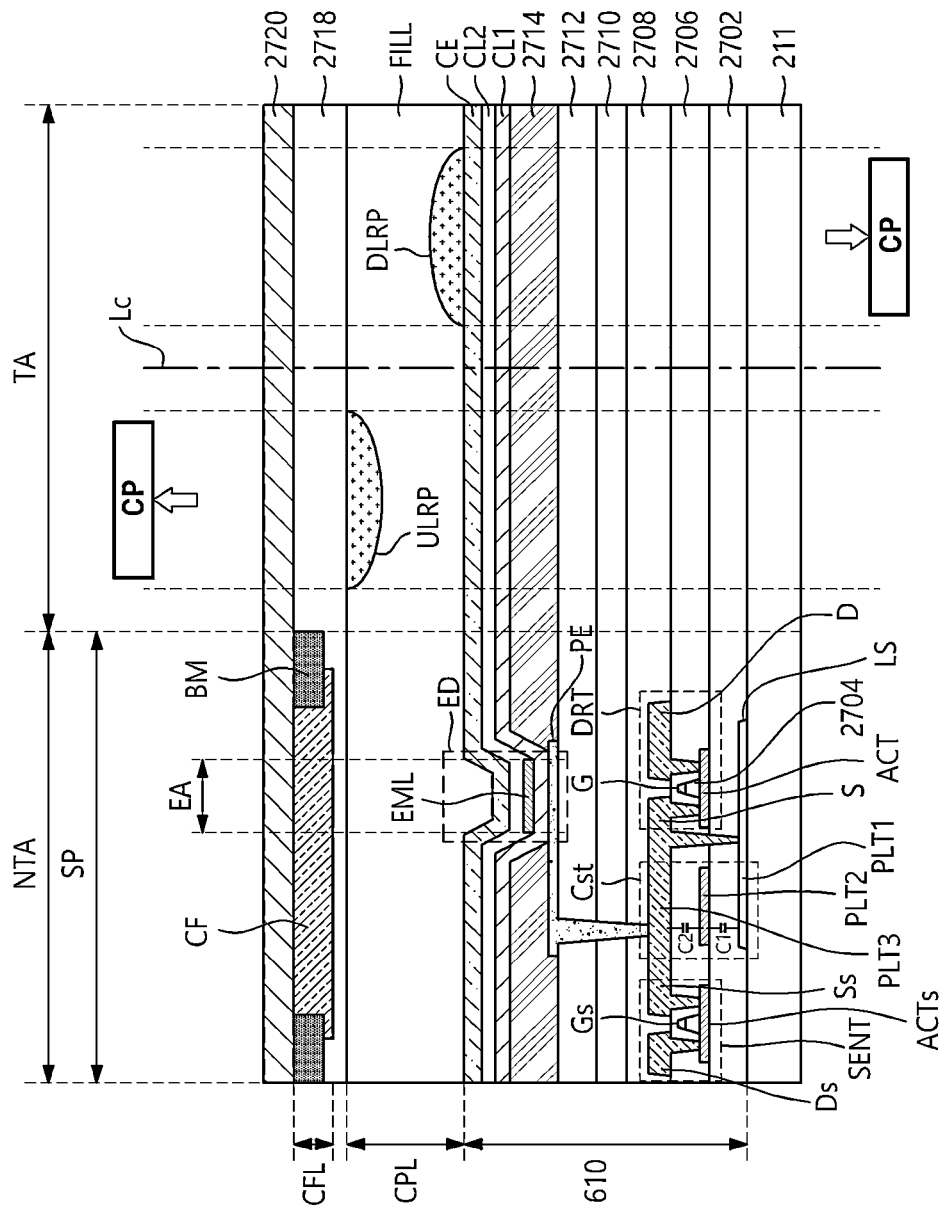

FIG. 30 is an example detailed cross-sectional view of the display panel 210 of FIG. 20 according to one embodiment. It should be noted that a vertical structure in the cross-sectional view of FIG. 30 is basically the same as the vertical structure in the cross-sectional view of FIG. 27. Taking account of such a similarity, discussions on the example of FIG. 30 are provided below by focusing on features different from the example of FIG. 27.

Referring to FIG. 30, a code pattern layer CPL may be configured between a common electrode CE and an overcoat layer 2718.

Referring to FIG. 30, the code pattern layer CPL may include at least one photoactive pattern LRP and a filler layer FILL. The photoactive pattern LRP may include an upper photoactive pattern ULRP and a lower photoactive pattern DLRP.

The lower photoactive pattern DLRP may be located on the common electrode CE.

The filler layer FILL may be configured to cover the lower photoactive pattern DLRP and may be located between the lower photoactive pattern DLRP and the upper photoactive pattern ULRP.

The upper photoactive pattern ULRP may be located on the filler layer FILL.

Referring to FIG. 30, the upper photoactive pattern ULRP and the lower photoactive pattern DLRP may be disposed in a transmissive area TA, and the filler layer FILL may be disposed in both the transmissive area TA and a non-transmissive area NTA.

Referring to FIG. 30, the upper photoactive pattern DLRP and the lower photoactive pattern ULRP may not overlap with each other. For example, the location of the upper photoactive pattern ULRP and the location of the lower photoactive pattern DLRP may be symmetrical about a central line Lc of the transmissive area TA.

As described above, in one or more aspects, in order for a pen (e.g., the pen 110 of FIG. 3A) to recognize one or more code patterns CP for pen touch sensing, the display panel 210 may include a light control structure including two or more of a reflection structure configured to reflect light having the second wavelength emitted from the pen 110, an absorption structure configured to absorb the light having the second wavelength, and a radiation structure configured to convert into light having one or more other wavelengths different from the second wavelength, and thereafter, to radiate the light having the one or more other wavelengths.

In one or more aspects, the display panel 210 may include two of the reflection structure, the absorption structure, and the radiation structure as a first light control structure and a second light control structure for forming one or more code patterns.

For example, the first light control structure may be a photoactive pattern LRP containing a first photoactive material, and the second light control structure may be a filler layer FILL containing the first photoactive material.

In the display panel 210 according to the example embodiments of the present disclosure described above, in one aspect, both the first light control structure and the second light control structure may be disposed in a code pattern layer CPL.

In another aspect, one of the first light control structure and the second light control structure may be disposed inside of a code pattern layer CPL, and the other may be disposed outside of the code pattern layer CPL.

Hereinafter, discussions are provided on an example where one of the first light control structure and the second light control structure is disposed inside of a code pattern layer CPL and the other is disposed outside of the code pattern layer CPL.

Figure 31:
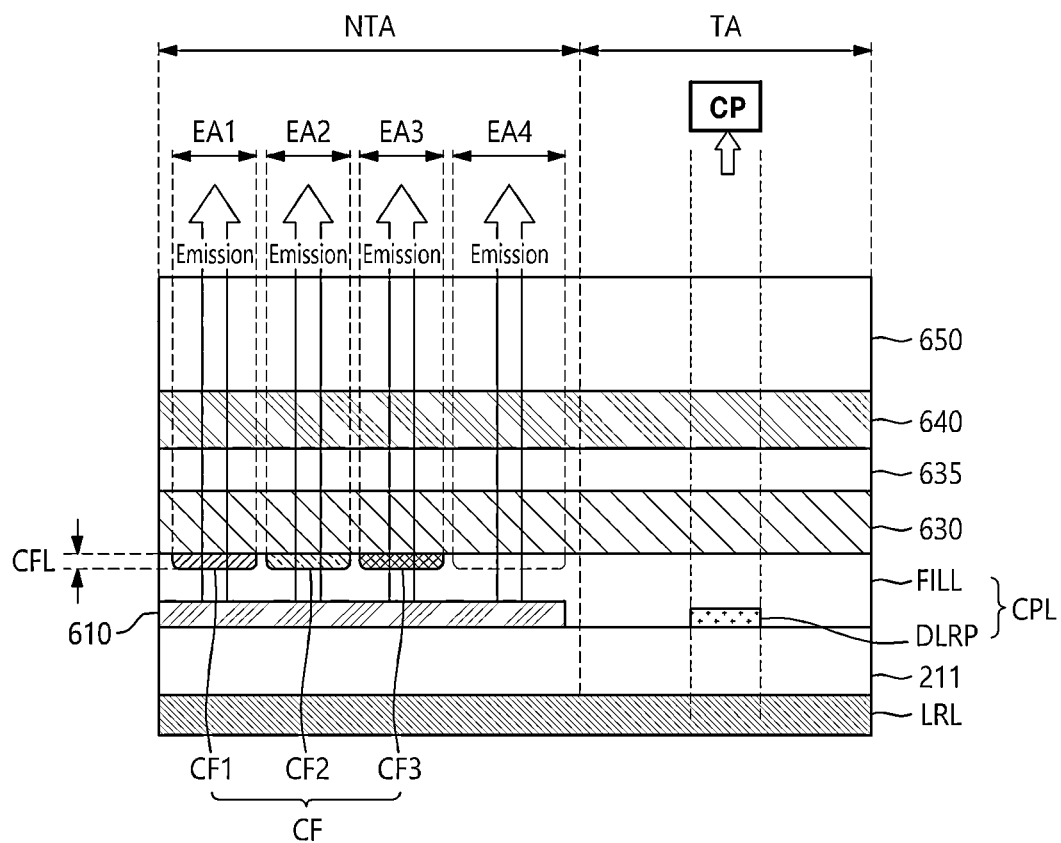
FIGS. 31 and 32 are example cross-sectional views of the display panel according to embodiments of the present disclosure.

FIG. 31 is an example cross-sectional view of the display panel 210 according to embodiments of the present disclosure.

Referring to FIG. 31, a code pattern layer CPL may include a lower photoactive pattern DLRP on a first substrate 211 as a first light control structure. The lower photoactive pattern DLRP may include a photoactive material (e.g., a first photoactive material).

The photoactive material (e.g., the first photoactive material) included in the lower photoactive pattern DLRP may include one of an absorption material capable of absorbing light having the second wavelength, a reflection material capable of reflecting the light having the second wavelength, and a radiation material capable of converting the light having the second wavelength into light having one or more other wavelengths different from the second wavelength, and thereafter, radiating the light having the one or more other wavelengths. For example, the photoactive material (e.g., first photoactive material) included in the lower photoactive pattern DLRP may include the absorption material or the radiation material.

The filler layer FILL may be located on the lower photoactive pattern DLRP and may not include a photoactive material.

Referring to FIG. 31, the display panel 211 may further include a photoactive layer LRL located outside of the code pattern layer CPL as a second light control structure.

The photoactive layer LRL may be located under the first substrate 211, include a photoactive material (e.g., a second photoactive material), and respond to light having the second wavelength. For example, the photoactive layer LRL may include the reflection material reflecting light having the second wavelength.

Referring to FIG. 31, the photoactive layer LRL may be disposed in a plurality of transmissive areas TA and a plurality of non-transmissive areas NTA. As the photoactive layer LRL for pen touch sensing extends to the plurality of non-transmissive areas NTA, light having the first wavelength emitted from one or more light emitting elements ED can be prevented from exiting the back surface of the display panel 210. Accordingly, the performance of the display panel 210 for redirecting light emitted from one or more light emitting elements ED to move toward the front of the display panel 210 can be improved.

Referring to FIG. 31, a shade difference or a wavelength difference in the distribution of infrared light, which is redirected light received by a pen (e.g., the pen 110 of FIG. 3A) located on or over the front surface of the display device 100, may occur due to the lower photoactive pattern DLRP. Accordingly, the pen 110 located on or over the front surface of the display device 100 can recognize one or more corresponding code patterns CP by detecting the shade difference in the distribution of the infrared light, which is the redirected light.

Figure 32:
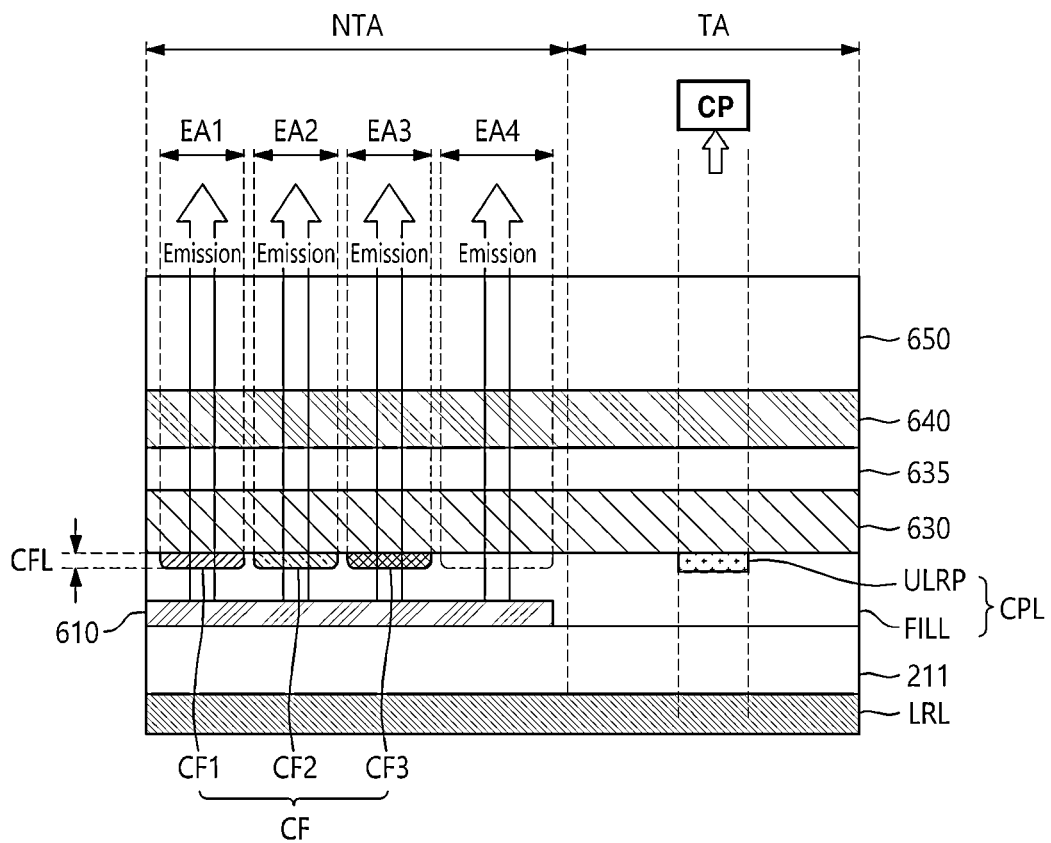

FIG. 32 is an example cross-sectional view of the display panel 210 according to embodiments of the present disclosure.

Referring to FIG. 32, a code pattern layer CPL may include an upper photoactive pattern ULRP on a filler layer FILL. The upper photoactive pattern ULRP may include a photoactive material.

The photoactive material included in the upper photoactive pattern ULRP may include one of an absorption material capable of absorbing light having the second wavelength, a reflection material capable of reflecting the light having the second wavelength, and a radiation material capable of converting the light having the second wavelength into light having one or more other wavelengths different from the second wavelength, and thereafter, radiating the light having the one or more other wavelengths. For example, the photoactive material included in the upper photoactive pattern ULRP may include the absorption material or the radiation material.

The filler layer FILL may not include a photoactive material.

Referring to FIG. 32, the display panel 211 may further include a photoactive layer LRL located under a first substrate 211 and responding to light having the second wavelength. The photoactive layer LRL may include a photoactive material. For example, the photoactive layer LRL may include the reflection material reflecting light having the second wavelength.

Referring to FIG. 32, the photoactive layer LRL may be disposed in a plurality of transmissive areas TA and a plurality of non-transmissive areas NTA. As the photoactive layer LRL for pen touch sensing extends to the plurality of non-transmissive areas NTA, light having the first wavelength emitted from one or more light emitting elements ED can be prevented from exiting the back surface of the display panel 210. Accordingly, the performance of the display panel 210 for redirecting light emitted from one or more light emitting elements ED to move toward the front of the display panel 210 can be improved.

Referring to FIG. 32, a shade difference in the distribution of infrared light, which is redirected light received by a pen (e.g., the pen 110 of FIG. 3A) located on or over the front surface of the display device 100, may occur due to the upper photoactive pattern ULRP. Accordingly, the pen 110 located on or over the front surface of the display device 100 can recognize one or more corresponding code patterns CP by detecting the shade difference in the distribution of the infrared light, which is the redirected light.

Figure 33:
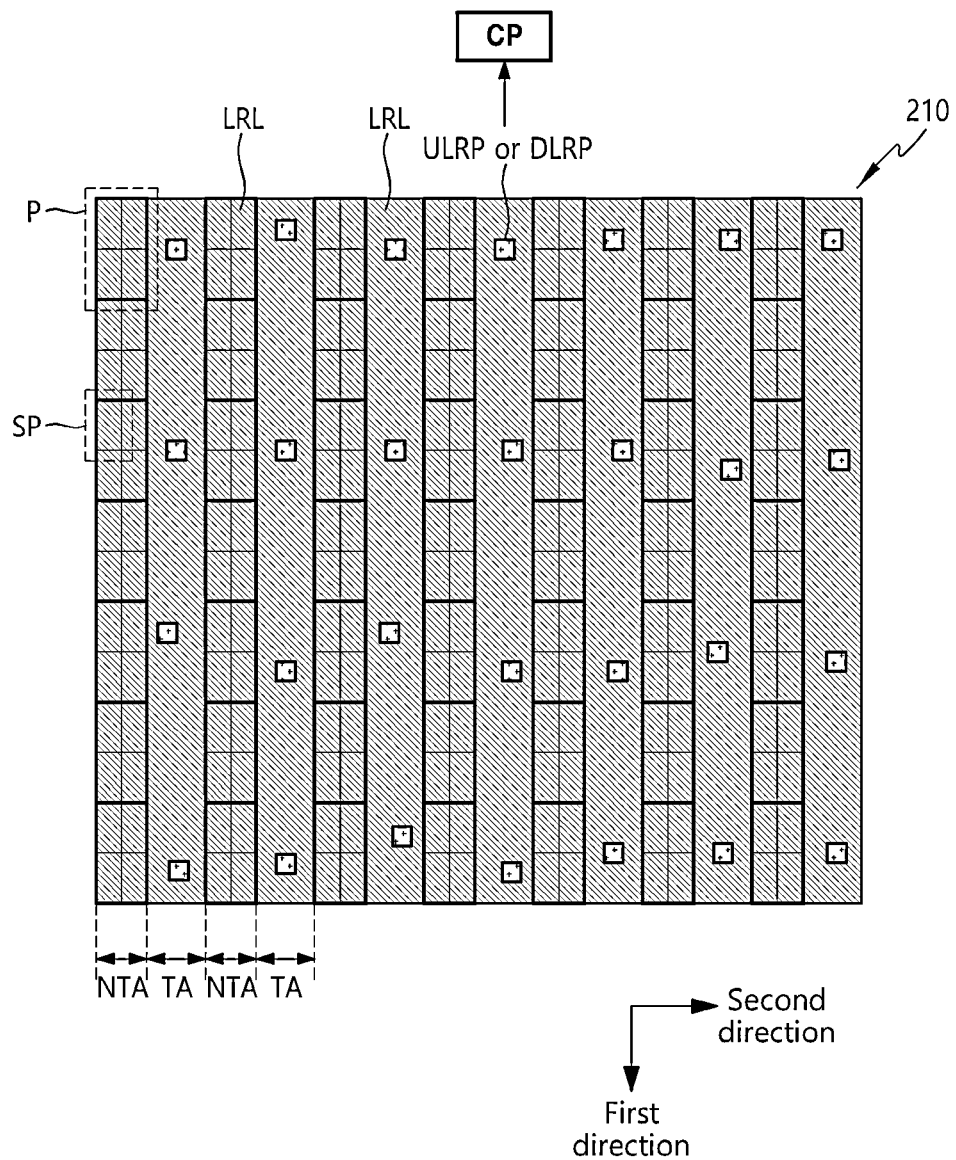
FIG. 33 is an example plan view of the display panel in which a plurality of code patterns are disposed in transmissive areas according to embodiments of the present disclosure.

FIG. 33 is an example plan view of the display panel 210 in which a plurality of code patterns CP are disposed in transmissive areas TA according to embodiments of the present disclosure.

FIG. 33 illustrates a plan view of the display panel 210 configured to have the vertical structure as shown in FIG. 31 or FIG. 32.

Referring to FIG. 33, a photoactive layer LRL may be located under a first substrate 211, and may be disposed in both a plurality of transmissive areas TA and a plurality of non-transmissive areas NTA.

A plurality of upper photoactive patterns ULRP and/or a plurality of lower photoactive patterns DLRP may be disposed in each of the plurality of transmissive areas TA.

The plurality of upper photoactive patterns ULRP and/or the plurality of lower photoactive patterns DLRP may be recognized by a pen (e.g., the pen 110 of FIG. 3A) as a plurality of code patterns CP.

Referring to FIG. 33 and FIG. 7, at least some of photoactive patterns (ULRPs or DLRPs) shown in FIG. 33 may correspond to code patterns CP_CELL disposed in two or more data cell areas D-CELL, correspond to code patterns CP_CELL disposed in one data cell area D-CELL, or correspond to code patterns CP_CELL disposed in a portion of one data cell area D-CELL.

In addition, some of photoactive patterns (ULRPs or DLRPs) shown in FIG. 33 may correspond to code patterns (CP_CGL1, CP_CGL2) corresponding to first and second cell guide lines (CGL1, CGL2) around a data cell area D-CELL.

Figure 34:
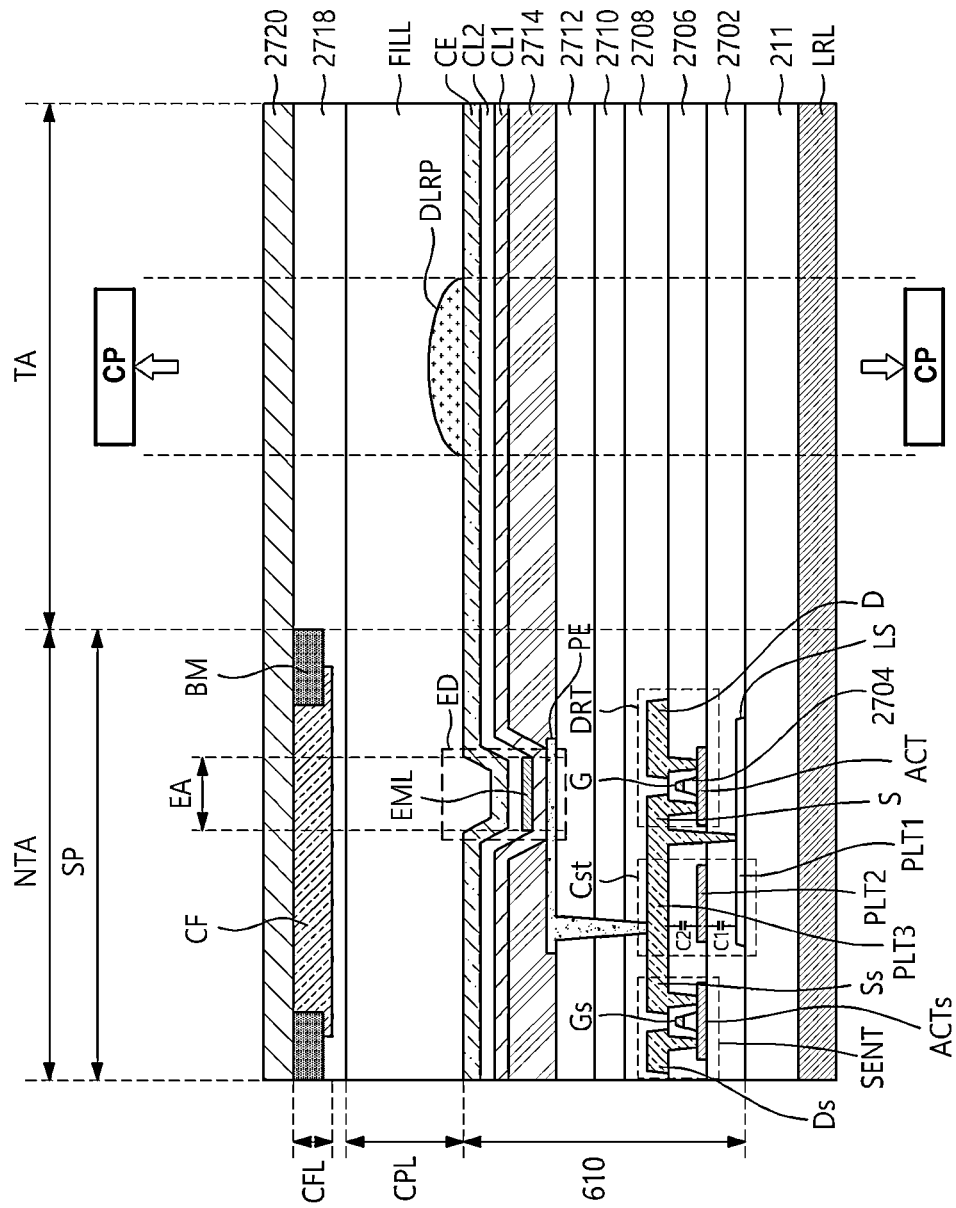
FIGS. 34 and 35 are more detailed example cross-sectional views for the configurations of the display panel shown in FIGS. 31 and 32 according to embodiments of the present disclosure.

FIG. 34 is an example detailed cross-sectional view of the display panel 210 of FIG. 31 according to one embodiment of the present disclosure. Discussions on the cross-sectional view of FIG. 34 are provided below by focusing on features different from the cross-sectional view of FIG. 27.

Referring to FIG. 34, a code pattern layer CPL may include a lower photoactive pattern DLRP as a first light control structure.

The lower photoactive pattern DLRP may be located on a common electrode CE.

A filler layer FILL may be disposed on the lower photoactive pattern DLRP.

The lower photoactive pattern DLRP may be disposed only in a transmissive area TA.

The filler layer FILL may be disposed in both the transmissive area TA and a non-transmissive area NTA.

The filler layer FILL may not include a photoactive material.

The lower photoactive pattern DLRP may include a photoactive material (e.g., a first photoactive material) responding to light having the second wavelength. As the lower photoactive pattern DLRP is used, a pen (e.g., the pen 110 of FIG. 3A) can recognize a corresponding one or more code patterns CP.

Referring to FIG. 34, the display panel 210 may include a photoactive layer LRL as a second light control structure.

The photoactive layer LRL may be located under a first substrate 211.

The photoactive layer LRL may include a photoactive material (e.g., a second photoactive material) responding to light having the second wavelength.

The first photoactive material included in the lower photoactive pattern DLRP and the second photoactive material included in the photoactive layer LRL may be different materials.

The first photoactive material included in the lower photoactive pattern DLRP and the second photoactive material included in the photoactive layer LRL may be materials performing different photoactivations.

For example, the first photoactive material included in the lower photoactive pattern DLRP may be an absorption material capable of absorbing light having the second wavelength, and the second photoactive material included in the photoactive layer LRL may be a reflection material capable of reflecting light having the second wavelength. Accordingly, a pen (e.g., the pen 110 of FIG. 3A) located on or over the front surface of the display device 211 can recognize one or more corresponding code patterns CP by detecting a shade difference in the distribution of redirected light.

Figure 35:
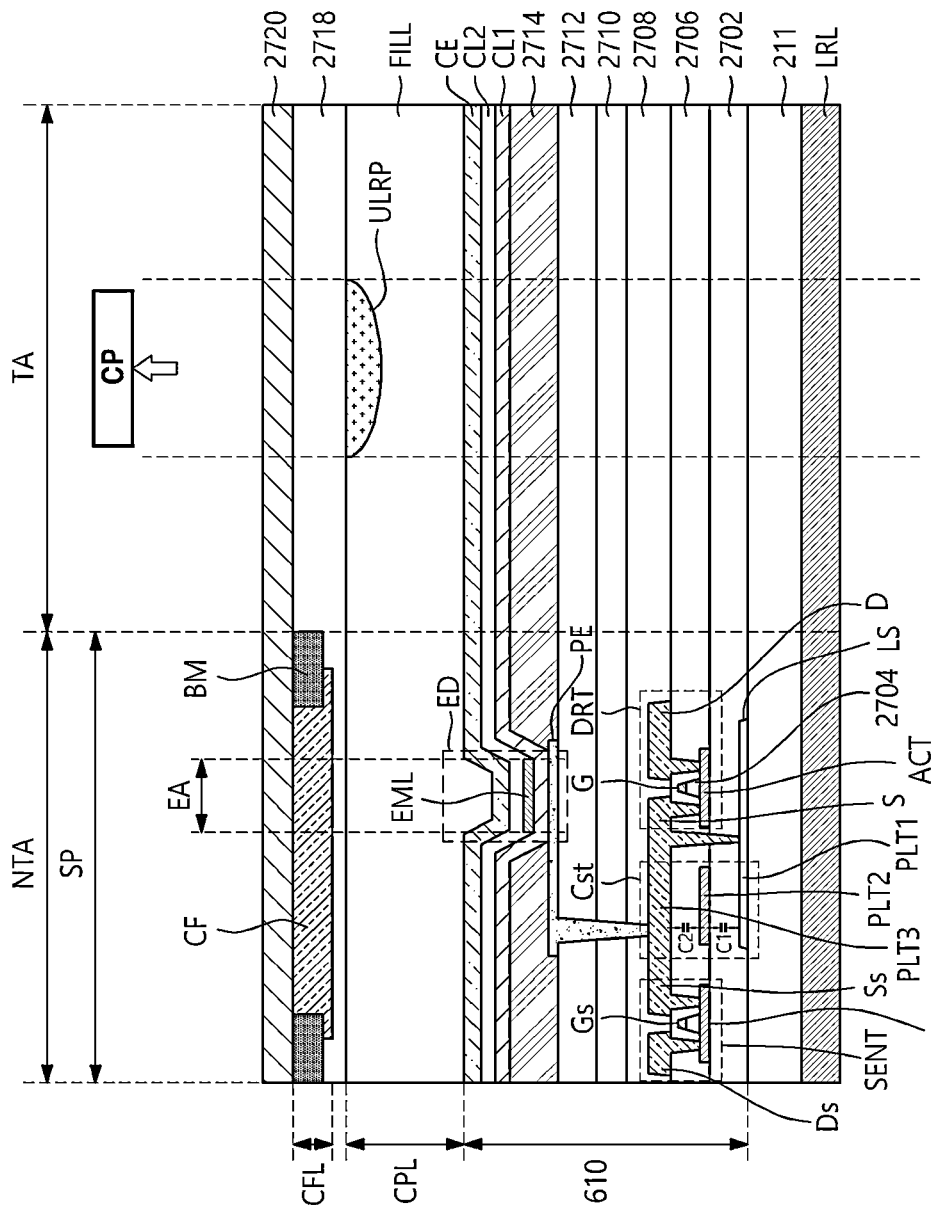

FIG. 35 is an example detailed cross-sectional view of the display panel 210 of FIG. 32 according to one embodiment.

Referring to FIG. 35, a code pattern layer CPL may include an upper photoactive pattern ULRP as a first light control structure.

The upper photoactive pattern ULRP may be located under a second substrate 2720, which may be an encapsulation layer. For example, the upper photoactive pattern ULRP may be located under an overcoat layer 2718 under the second substrate 2720.

A filler layer FILL may be located on a common electrode CE.

The upper photoactive pattern ULRP may be located on the filler layer FILL.

The upper photoactive pattern ULRP may be disposed only in a transmissive area TA.

The filler layer FILL may be disposed in both the transmissive area TA and a non-transmissive area NTA.

The filler layer FILL may not include a photoactive material.

The upper photoactive pattern ULRP may include a photoactive material (e.g., a first photoactive material) responding to light having the second wavelength. As the upper photoactive pattern ULRP is used, a pen (e.g., the pen 110 of FIG. 3A) can recognize one or more corresponding code patterns CP.

Referring to FIG. 35, the display panel 210 may include a photoactive layer LRL as a second light control structure.

The photoactive layer LRL may be located under a first substrate 211.

The photoactive layer LRL may include a photoactive material (e.g., a second photoactive material) responding to light having the second wavelength.

The first photoactive material included in the upper photoactive pattern ULRP and the second photoactive material included in the photoactive layer LRL may be different materials.

The first photoactive material included in the upper photoactive pattern ULRP and the second photoactive material included in the photoactive layer LRL may be materials performing different photoactivations.

For example, the first photoactive material included in the upper photoactive pattern ULRP may be an absorption material capable of absorbing light having the second wavelength, and the second photoactive material included in the photoactive layer LRL may be a reflection material capable of reflecting light having the second wavelength. Accordingly, a pen (e.g., the pen 110 of FIG. 3A) located on or over the front surface of the display device 211 can recognize one or more corresponding code patterns CP by detecting a shade difference in the distribution of redirected light.

Figure 36:
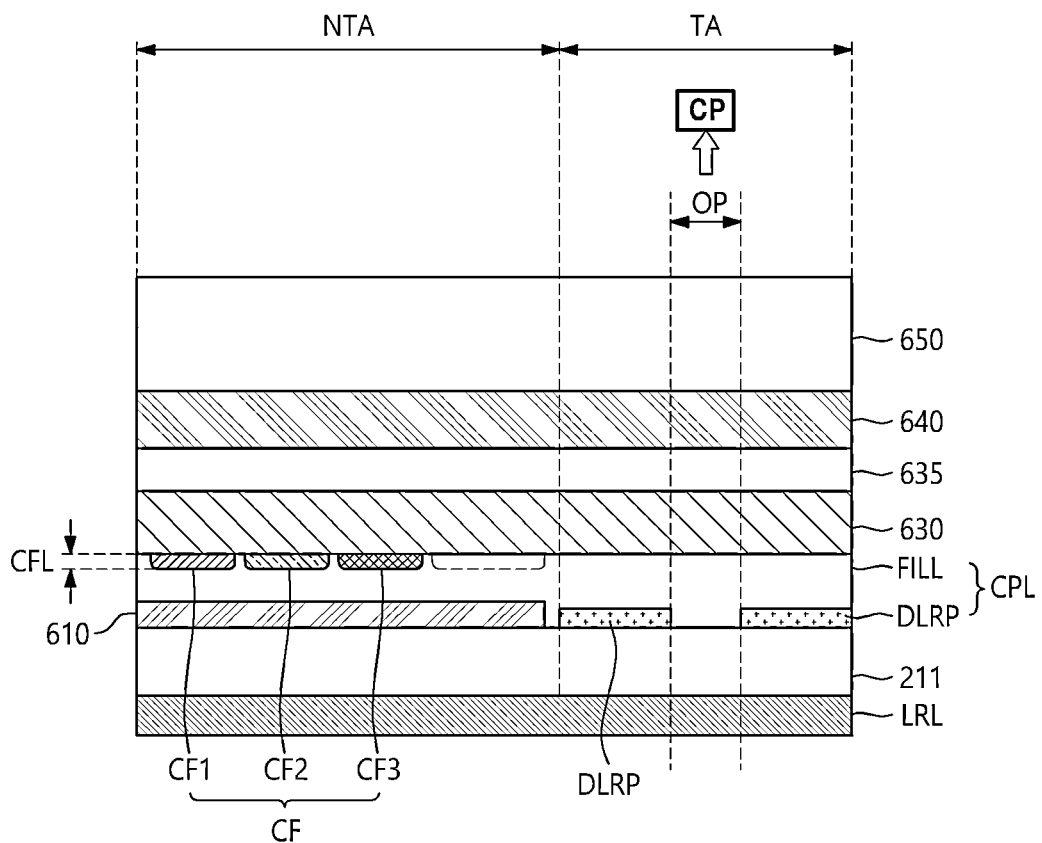
FIG. 36 is an example cross-sectional view of the display panel according to embodiments of the present disclosure.
Figure 37:
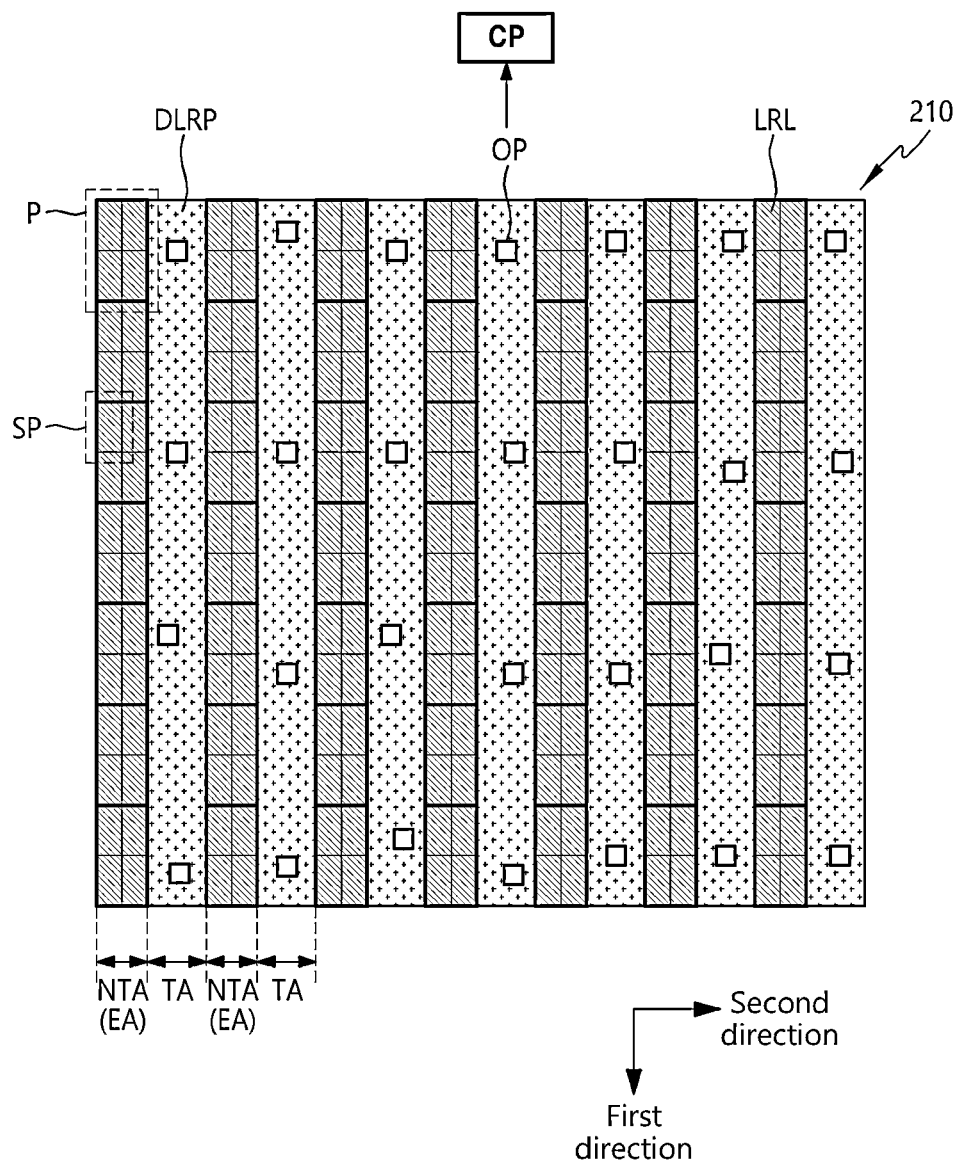
FIG. 37 is an example plan view of the display panel in which a plurality of code patterns are disposed in transmissive areas according to embodiments of the present disclosure.

FIG. 36 is an example cross-sectional view of the display panel 210 according to embodiments of the present disclosure. FIG. 37 is an example plan view of the display panel 210 in which a plurality of code patterns CP are disposed in transmissive areas TA according to embodiments of the present disclosure.

Referring to FIGS. 36 and 37, a code pattern layer CPL may include a lower photoactive pattern DLRP on a first substrate 211 as a first light control structure. The lower photoactive pattern DLRP may include a photoactive material (e.g., a first photoactive material).

The photoactive material (e.g., the first photoactive material) included in the lower photoactive pattern DLRP may include one of an absorption material capable of absorbing light having the second wavelength, a reflection material capable of reflecting the light having the second wavelength, and a radiation material capable of converting the light having the second wavelength into light having one or more other wavelengths different from the second wavelength, and thereafter, radiating the light having the one or more other wavelengths. For example, the photoactive material (e.g., first photoactive material) included in the lower photoactive pattern DLRP may include the absorption material or the radiation material.

A filler layer FILL may be located on the lower photoactive pattern DLRP and may not include a photoactive material.

Referring to FIGS. 36 and 37, one lower photoactive pattern DLRP may be disposed in each of a plurality of transmissive areas TA.

Referring to FIGS. 36 and 37, a plurality of openings OP may be formed in one lower photoactive pattern DLRP disposed in each of a plurality of transmissive areas TA.

The plurality of openings OP may serve as a plurality of code patterns CP. As the above configurations are applied, a shade difference or a wavelength difference in the distribution of redirected light occurs due to the plurality of openings OP, and thereby, a pen (e.g., the pen 110 of FIG. 3A) can recognize a plurality of code patterns CP.

Referring to FIGS. 36 and 37, the display panel 211 may further include a photoactive layer LRL located outside of the code pattern layer CPL as a second light control structure.

The photoactive layer LRL may be located under the first substrate 211, include a photoactive material (e.g., a second photoactive material), and respond to light having the second wavelength. For example, the photoactive layer LRL may include the reflection material reflecting light having the second wavelength.

The photoactive layer LRL may be disposed in a plurality of transmissive areas TA and a plurality of non-transmissive areas NTA. Thus, as the photoactive layer LRL for pen touch sensing is extended to the plurality of non-transmissive areas NTA, light having the first wavelength emitted from light emitting elements ED can be prevented from exiting the back of the display panel 210. Accordingly, the performance of the display panel 210 for redirecting light emitted from light emitting elements ED to move toward the front of the display panel 210 can be improved.

Referring to FIGS. 36 and 37, a shade difference or a wavelength difference in the distribution of infrared light, which is redirected light received by a pen (e.g., the pen 110 of FIG. 3A) located on or over the front surface of the display device 100, may occur due to openings OP of lower photoactive patterns DLRP. Accordingly, the pen 110 located on or over the front surface of the display device 100 can recognize one or more corresponding code patterns CP by detecting the shade difference in the distribution of the infrared light, which is the redirected light.

Referring to FIG. 37 and FIG. 7, at least some of openings OP formed in lower photoactive patterns DLRP shown in FIG. 37 may correspond to code patterns CP_CELL disposed in two or more data cell areas D-CELL, correspond to code patterns CP_CELL disposed in one data cell area D-CELL, or correspond to code patterns CP_CELL disposed in a portion of one data cell area D-CELL.

In addition, some of openings OP formed in lower photoactive patterns DLRP shown in FIG. 37 may correspond to code patterns (CP_CGL1, CP_CGL2) corresponding to first and second cell guide lines (CGL1, CGL2) around a data cell area D-CELL.

Figure 38:
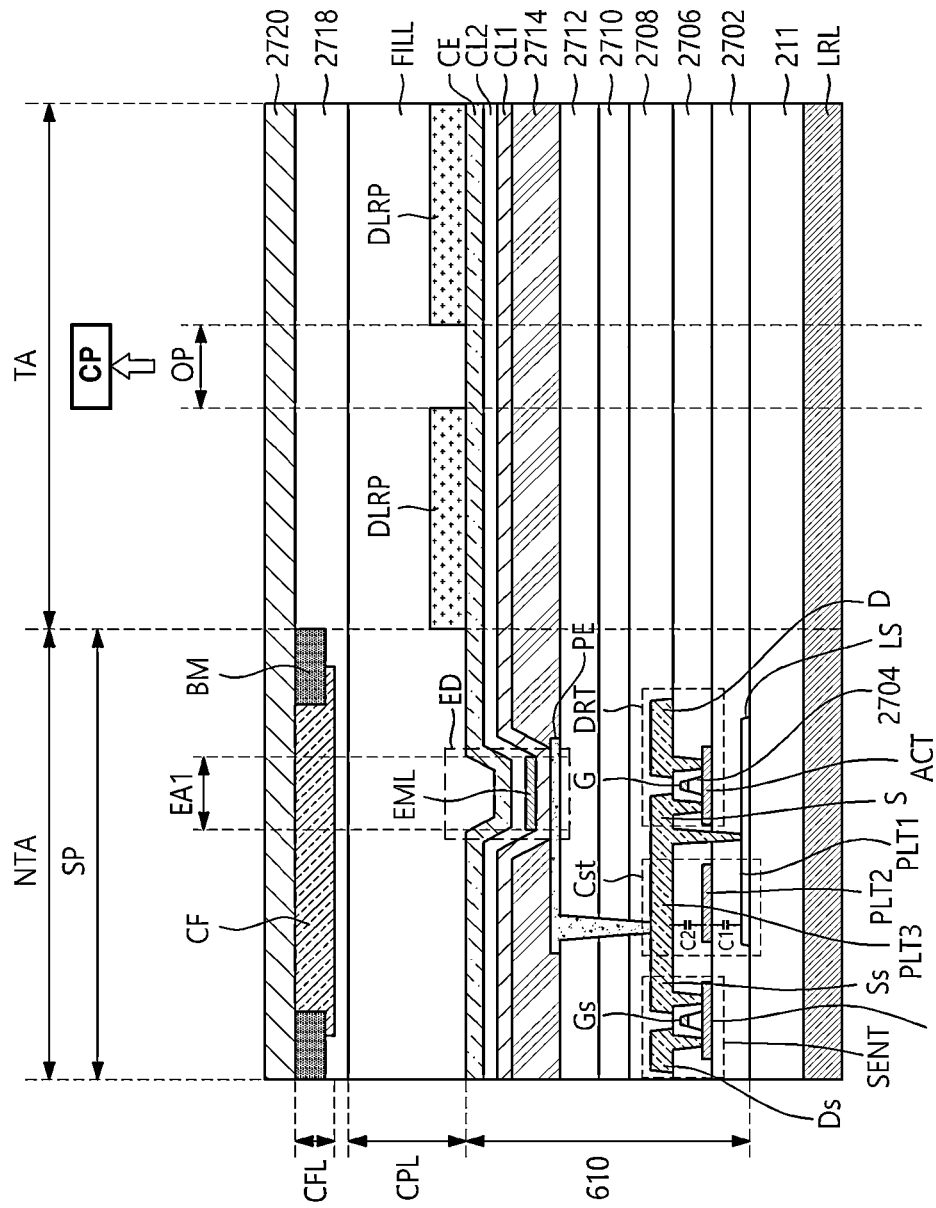
FIG. 38 is a more detailed cross-sectional view for the configuration of the display panel in FIG. 36 according to embodiments of the present disclosure.

FIG. 38 is an example detailed cross-sectional view of the display panel 210 of FIG. 36 according to one embodiment. Discussions on the cross-sectional view of FIG. 38 are provided below by focusing on features different from the cross-sectional view of FIG. 27.

Referring to FIG. 38, a code pattern layer CPL may include a lower photoactive pattern DLRP as a first light control structure.

The lower photoactive pattern DLRP may be located on a common electrode CE.

A filler layer FILL may be disposed on the lower photoactive pattern DLRP.

The lower photoactive pattern DLRP may be disposed only in a transmissive area TA.

The filler layer FILL may be disposed in the transmissive area TA and a non-transmissive area NTA.

The filler layer FILL may not include a photoactive material.

The lower photoactive pattern DLRP may include a photoactive material (e.g., a first photoactive material) responding to light having the second wavelength.

One lower photoactive pattern DLRP may be disposed in each of a plurality of transmissive areas TA.

One lower photoactive pattern DLRP disposed in each of the plurality of transmissive areas TA may include a plurality of openings OP. A pen (e.g., the pen 110 of FIG. 3A) can recognize one or more corresponding code patterns CP through a plurality of openings OP.

Referring to FIG. 38, the display panel 210 may include a photoactive layer LRL as a second light control structure.

The photoactive layer LRL may be located under a first substrate 211.

The photoactive layer LRL may include a photoactive material (e.g., a second photoactive material) responding to light having the second wavelength.

The first photoactive material included in the lower photoactive pattern DLRP and the second photoactive material included in the photoactive layer LRL may be different materials.

The first photoactive material included in the lower photoactive pattern DLRP and the second photoactive material included in the photoactive layer LRL may be materials performing different photoactivations.

For example, the first photoactive material included in the lower photoactive pattern DLRP may be an absorption material capable of absorbing light having the second wavelength, and the second photoactive material included in the photoactive layer LRL may be a reflection material capable of reflecting light having the second wavelength. Accordingly, a pen (e.g., the pen 110 of FIG. 3A) located on or over the front surface of the display device 211 can recognize one or more corresponding code patterns CP by detecting a shade difference in the distribution of redirected light.

The example embodiments described herein can be briefly discussed as follows.

According to the example embodiments of the present disclosure, a display device can be provided that includes a display panel configured to display an image.

In one or more aspects, the display panel may include a first substrate including a plurality of transmissive areas allowing light having a first wavelength to be transmitted and a plurality of non-transmissive areas different from the plurality of transmissive areas, a plurality of pixels disposed in the plurality of non-transmissive areas, a code pattern layer in which at least one photoactive pattern including a photoactive material responsive to light having a second wavelength different from the first wavelength is disposed, and a cover window located on the plurality of pixels and the code pattern layer.

In one or more aspects, the at least one photoactive pattern may be disposed in at least one of the plurality of transmissive areas.

In one or more aspects, the photoactive material may include one or more of an absorption material capable of absorbing the light having the second wavelength, a reflection material capable of reflecting the light having the second wavelength, and a radiation material capable of converting the light having the second wavelength into light having one or more other wavelengths different from the second wavelength and radiating the light having the one or more other wavelengths.

For example, the at least one photoactive pattern may include a lower photoactive pattern located on the first substrate, and an upper photoactive pattern located over the lower photoactive pattern, and the code pattern layer may further include a filler layer located between the lower photoactive pattern DLRP and the upper photoactive pattern. In one or more aspects, the upper photoactive pattern and the lower photoactive pattern may include a first photoactive material, and the filler layer may include a second photoactive material performing a photoactivation different from the first photoactive material.

In one or more aspects, the light having the second wavelength may be incident on the cover window, or be incident on the first substrate.

In one or more aspects, at least a portion of the upper photoactive pattern may overlap with at least a portion of the lower photoactive pattern.

In one or more aspects, the upper photoactive pattern may not overlap with the lower upper photoactive pattern. For example, a location of the upper photoactive pattern and a location of the lower photoactive pattern may be symmetrical about a central line of a corresponding transmissive area among the plurality of transmissive areas.

In one or more aspects, each of the upper photoactive pattern and the lower photoactive pattern may comprise at least one opening.

In one or more aspects, the opening of the upper photoactive pattern and the opening of the lower photoactive pattern may overlap with each other vertically.

In one or more aspects, the opening of the upper photoactive pattern and the opening of the lower photoactive pattern may not overlap with each other vertically.

In another example, the code pattern layer may further include a filler layer located on the first substrate, and the at least one photoactive pattern may include an upper photoactive pattern located on the filler layer. In one or more aspects, the upper photoactive pattern may include a first photoactive material, and the filler layer may include a second photoactive material performing a photoactivation different from the first photoactive material.

In one or more aspects, the light having the second wavelength may be incident on the cover window.

In one or more aspects, the upper photoactive pattern may comprise at least one opening.

In another example, the at least one photoactive pattern may include a lower photoactive pattern located on the first substrate. In one or more aspects, the code pattern layer may further include a filler layer located on the lower photoactive pattern. In one or more aspects, the lower photoactive pattern may include a first photoactive material. In one or more aspects, the filler layer may include a second photoactive material performing a photoactivation different from the first photoactive material.

In one or more aspects, the light having the second wavelength may be incident on the first substrate.

In one or more aspects, the lower photoactive pattern may comprise at least one opening.

In one or more aspects, the plurality of pixels may further include a plurality of light emitting elements, and the display panel may further include an encapsulation layer on the plurality of light emitting elements.

In one or more aspects, the cover window may be located on the encapsulation layer.

In one or more aspects, the code pattern layer may be located between the first substrate and the encapsulation layer.

In one or more aspects, the display panel may further include a plurality of color filters disposed in each of the plurality of non-transmissive areas, and located on or over the encapsulation layer or underneath or under the encapsulation layer.

In one or more aspects, each of the plurality of color filters may be configured to transmit light having one or more wavelengths included in a first wavelength band including the first wavelength and corresponding to a corresponding color.

In one or more aspects, each of the plurality of color filters may include a material capable of transmitting the light having the second wavelength.

In one or more aspects, in the plurality of transmissive areas, a transmittance for the light having the second wavelength may be lower than a transmittance for the light having the first wavelength.

In one or more aspects, the display panel may further include a photoactive layer located under the first substrate and responsive to the light having the second wavelength.

In one or more aspects, the at least one photoactive pattern may be located on the substrate, and the photoactive layer may include a reflection material reflecting the light having the second wavelength.

In one or more aspects, the at least one photoactive pattern may include an absorption material capable of absorbing the light having the second wavelength, or an radiation material capable of converting the light of the second wavelength into light having one or more other wavelengths and radiating the light having the one or more other wavelengths.

In one or more aspects, the photoactive layer may be disposed in the plurality of transmissive areas and the plurality of non-transmissive areas.

In one or more aspects, the at least one photoactive pattern may include at least one among a plurality of openings.

According to the example embodiments of the present disclosure, a pen touch system can be provided that includes a display device, and a pen.

In one or more aspects, the display device may include a first substrate including a plurality of transmissive areas allowing light having a first wavelength to be transmitted and a plurality of non-transmissive areas different from the plurality of transmissive areas, a plurality of pixels disposed in the plurality of non-transmissive areas, a code pattern layer in which at least one photoactive pattern including a photoactive material responsive to light having a second wavelength different from the first wavelength is disposed, the at least one photoactive pattern being disposed in at least one of the plurality of transmissive areas, and a cover window located on the plurality of pixels and the code pattern layer.

In one or more aspects, the pen may be configured to output the light having the second wavelength to at least one of the plurality of transmissive areas, receive redirected light coming from the display device, and output sensing data based on the redirected light to the display device.

In one or more aspects, the plurality of pixels may further include a plurality of light emitting elements, and the display device may further include an encapsulation layer on the plurality of light emitting elements.

In one or more aspects, the cover window may be located on the encapsulation layer.

In one or more aspects, the code pattern layer may be located between the first substrate and the encapsulation layer.

In one or more aspects, the plurality of light emitting elements can emit light toward one of the first substrate and the cover window, and the display device can allow an input by the pen through both the front and back surfaces of the display device based on sensing data received from the pen.

In one or more aspects, the plurality of light emitting elements can emit light toward one of the first substrate and the cover window, and the display device can allow an input by the pen through any one of the front and back surfaces of the display device based on sensing data received from the pen.

According to the one or more aspects described herein, a display device and a pen touch system may be provided that are capable of more accurately sensing a pen touch based on an optical technique.

According to the one or more aspects described herein, a transparent display device and a pen touch system may be provided that are capable of sensing a pen touch based on an optical technique.

According to the one or more aspects described herein, a transparent display device and a pen touch system may be provided that are capable of providing optical pen touch sensing without affecting a pixel structure for image display.

According to the one or more aspects described herein, a transparent display device and a pen touch system may be provided that are capable of sensing a pen touch based on an optical technique without deteriorating transparency.

According to the one or more aspects described herein, a display device and a pen touch system may be provided that include a display panel in which a light control structure capable of allowing a pen to sense a touch is integrated.

According to the one or more aspects described herein, a display device and a pen touch system may be provided that include a display panel in which a light control structure configured not to affect light emitting performance for image display is integrated.

According to the one or more aspects described herein, a display device and a pen touch system may be provided that include a display panel in which as a light control structure configured to enable pen touch sensing, a reflection structure and an absorption structure (or a radiation structure) are integrated.

According to the one or more aspects described herein, a display device and a pen touch system may be provided that are capable of allowing a pen touch input from any one of the front surface and back surface of the display device.

According to the one or more aspects described herein, a display device and a pen touch system may be provided that are capable of allowing a pen touch input from both the front surface and back surface of the display device.

According to the one or more aspects described herein, a display device and a pen touch system may be provided that include a display panel in which a light control structure configured to allow a pen to sense a touch is integrated, and thereby, provide advantages of reducing the thickness of the display device and helping to simplify the assembly process of the display device. Thus, the one or more aspects described herein can help to reduce the weight and optimize the process of the display device.

According to the one or more aspects described herein, a display device and a pen touch system may be provided that include a display panel including a pixel array layer and having a reflection structure for pen touch sensing using the pixel array layer, and thereby, provide advantages of further helping to reduce the weight of the display device.

The example embodiments of the present disclosure described above have been described for illustrative purposes; those skilled in the art will appreciate that various modifications, additions and substitutions are possible, without departing from the scope and spirit of the invention as disclosed in the accompanying claims. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified.

What is claimed is:

1. A display device comprising:
   a display panel configured to display an image, display panel comprising:
   a first substrate comprising a plurality of transmissive areas allowing light having a first wavelength to be transmitted and a plurality of non-transmissive areas different from the plurality of transmissive areas;
   a plurality of pixels in the plurality of non-transmissive areas;
   a code pattern layer in which a plurality of photoactive patterns comprising a photoactive material that are responsive to light having a second wavelength different from the first wavelength is disposed, the plurality of photoactive patterns in the plurality of transmissive areas; and
   a cover window on the plurality of pixels and the code pattern layer.

2. The display device of claim 1, wherein the photoactive material comprises one or more of an absorption material that absorbs the light having the second wavelength, a reflection material that reflects the light having the second wavelength, and a radiation material that converts the light having the second wavelength into light having one or more other wavelengths and radiating the light having the one or more other wavelengths.

3. The display device of claim 1, wherein the plurality of photoactive patterns comprise a lower photoactive pattern on the first substrate, and an upper photoactive pattern located over the lower photoactive pattern, wherein the code pattern layer further comprises a filler layer between the lower photoactive pattern and the upper photoactive pattern, and wherein the upper photoactive pattern and the lower photoactive pattern comprise a first photoactive material, and the filler layer comprises a second photoactive material performing a photoactivation different from the first photoactive material.

4. The display device of claim 3, wherein at least a portion of the upper photoactive pattern overlaps with at least a portion of the lower photoactive pattern.

5. The display device of claim 3, wherein the upper photoactive pattern is non-overlapping with the lower photoactive pattern, and a location of the upper photoactive pattern and a location of the lower photoactive pattern are symmetrical about a central line of a corresponding transmissive area among the plurality of transmissive areas.

6. The display device of claim 3, wherein the light having the second wavelength is incident on the cover window or is incident on the first substrate.

7. The display device of claim 1, wherein the code pattern layer further comprises a filler layer located on the first substrate, wherein the plurality of photoactive patterns comprise an upper photoactive pattern located on the filler layer, and wherein the upper photoactive pattern comprises a first photoactive material, and the filler layer comprises a second photoactive material performing a photoactivation different from the first photoactive material.

8. The display device of claim 7, wherein the light having the second wavelength is incident on the cover window.

9. The display device of claim 1, wherein the plurality of photoactive patterns comprises a lower photoactive pattern located on the first substrate, wherein the code pattern layer further comprises a filler layer located on the lower photoactive pattern, and wherein the lower photoactive pattern comprises a first photoactive material, and the filler layer comprises a second photoactive material performing a photoactivation different from the first photoactive material.

10. The display device of claim 9, wherein the light having the second wavelength is incident on the first substrate.

11. The display device of claim 1, wherein the display panel further comprises:

a plurality of light emitting elements disposed in the plurality of non-transmissive areas; and an encapsulation layer on the plurality of light emitting elements, and wherein the cover window is on the encapsulation layer, and the code pattern layer is located between the first substrate and the encapsulation layer.

12. The display device of claim 11, wherein the display panel further comprises a plurality of color filters in each of the plurality of non-transmissive areas, and located on or over the encapsulation layer or underneath or under the encapsulation layer, wherein each of the plurality of color filters transmits light having one or more wavelengths included in a first wavelength band including the first wavelength and corresponding to a corresponding color, and wherein each of the plurality of color filters comprises a material that transmits the light having the second wavelength.

13. The display device of claim 1, wherein in the plurality of transmissive areas, a transmittance for the light having the second wavelength is lower than a transmittance for the light having the first wavelength.

14. The display device of claim 1, wherein the display panel further comprises a photoactive layer located under the first substrate and is responsive to the light having the second wavelength, wherein the plurality of photoactive patterns are on the first substrate, and wherein the photoactive layer comprises a reflection material that reflects the light having the second wavelength, and the plurality of photoactive patterns comprise an absorption material that absorbs the light having the second wavelength, or a radiation material that converts the light of the second wavelength into light having one or more other wavelengths and radiating the light having the one or more other wavelengths.

15. The display device of claim 14, wherein the photoactive layer is in the plurality of transmissive areas and the plurality of non-transmissive areas.

16. The display device of claim 14, wherein the plurality of photoactive patterns comprise a plurality of openings.

17. A pen touch system comprising:

a display device comprising a first substrate including a plurality of transmissive areas allowing light having a first wavelength to be transmitted and a plurality of non-transmissive areas different from the plurality of transmissive areas, a plurality of pixels in the plurality of non-transmissive areas, a code pattern layer in which a plurality of photoactive patterns including a photoactive material that is responsive to light having a second wavelength that is different from the first wavelength is disposed, the plurality of photoactive patterns in the plurality of transmissive areas, and a cover window located on the plurality of pixels and the code pattern layer; and a pen configured to output the light having the second wavelength to at least one of the plurality of transmissive areas, receive redirected light coming from the display device, and output sensing data based on the redirected light to the display device.

18. The pen touch system of claim 17, wherein the display device further comprises a plurality of light emitting elements in the plurality of non-transmissive areas, and an encapsulation layer on the plurality of light emitting elements, and wherein the cover window is on the encapsulation layer, and the code pattern layer is located the first substrate and the encapsulation layer.

19. The pen touch system of claim 18, wherein the plurality of light emitting elements emit light toward one of the first substrate and the cover window, and the display device allows an input by the pen through front and back surfaces of the display device based on sensing data received from the pen.

20. The pen touch system of claim 18, wherein the plurality of light emitting elements emit light toward one of the first substrate and the cover window, and the display device allows an input by the pen through any one of front and back surfaces of the display device based on sensing data received from the pen.

* * * * *